US006680161B2

(12) United States Patent
Oohashi

(10) Patent No.: US 6,680,161 B2
(45) Date of Patent: Jan. 20, 2004

(54) LITHOGRAPHIC PRINTING PLATE PRECURSOR

(75) Inventor: Hidekazu Oohashi, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 185 days.

(21) Appl. No.: 09/812,053

(22) Filed: Mar. 20, 2001

(65) Prior Publication Data

US 2003/0190553 A1 Oct. 9, 2003

(30) Foreign Application Priority Data

Mar. 21, 2000 (JP) .................................... P. 2000-078597
Nov. 6, 2000 (JP) .................................... P. 2000-337792

(51) Int. Cl.[7] ............................ B41C 1/10; G03F 7/11; G03F 7/30; G03F 7/36

(52) U.S. Cl. .................... 430/273.1; 430/138; 430/296; 430/967; 430/271.1; 430/302; 430/964; 101/457; 101/450.1; 101/451; 101/453; 101/467

(58) Field of Search .............................. 430/271.1, 138, 430/273.1, 964, 302, 296, 967; 101/457, 450.1, 451, 453, 467

(56) References Cited

U.S. PATENT DOCUMENTS 5,227,275 A 7/1993 Miyazu et al.
5,281,509 A 1/1994 Murakata et al.
2001/0036592 A1 * 11/2001 Hoshi et al. ............. 430/271.1

FOREIGN PATENT DOCUMENTS

EP 0713140 A1 5/1996
EP 0881094 A1 12/1998
GB 2 325 055 B * 11/1998 ............ B41M/5/36
JP 08-262725 * 10/1996 ............. G03F/7/07

OTHER PUBLICATIONS

English machine translation of JP 08–2622725.*
"la–tex", THe American Heritage Dictionary, Second College Edition, Houghton Mifflin Company, Boston, MA, 1982, p. 716.*
"latex", Grant & Hachk's Chemical Dictionary [American, International European and Britich Usage], Fifth Edition, Mc Graw–Hil Book Company, New York, N.Y. p. 331.*
"la.tex", Merriam–Webster's Collegiate Dictionary from online, "www.yourdictionary.com", one page printed Sep. 25, 200.*

* cited by examiner

*Primary Examiner*—Cynthia Hamilton
(74) *Attorney, Agent, or Firm*—Burns, Doane, Swecker & Mathis, LLP

(57) ABSTRACT

A lithographic printing plate precursor which comprises a support having a hydrophilic surface having provided thereon in order of a layer containing a latex (layer A) and an ink-receptive layer (layer B) whose solubility at least either in water or in an aqueous solution is converted by heat, wherein at least one layer of either layer A or layer B contains a light/heat converting agent.

9 Claims, No Drawings

LITHOGRAPHIC PRINTING PLATE PRECURSOR

FIELD OF THE INVENTION

The present invention relates to a lithographic printing plate precursor, more specifically a lithographic printing plate precursor capable of plate-making by scanning exposure based on digital signals and developable with water, or loadable on a printing machine without development and printable.

BACKGROUND OF THE INVENTION

A lithographic printing plate generally comprises a lipophilic image area which receives an ink in a printing process and a hydrophilic non-image area which receives fountain solution. As such a lithographic printing plate precursor, a PS plate comprising a hydrophilic support having provided thereon a lipophilic photosensitive resin layer (an image-recording layer) has so far been widely used. A plate-making method of a lithographic printing plate precursor generally comprises the steps of performing mask exposure through a lith film and then dissolving and removing a non-image area with a developing solution to thereby obtain a desired printing plate.

Digitized techniques of electronically processing, accumulating and outputting image data using a computer have prevailed in recent years, and various image output systems corresponding to these digitized techniques have been put to practical use. With such a tendency, a computer-to-plate technique of directly making a printing plate without using a lith film by scanning exposing digitized image data with highly directional active radiant rays such as laser beams is earnestly desired, and it has become an important technical problem to obtain a printing plate precursor adaptable to this purpose.

On the other hand, the plate-making process of a PS plate hitherto in use is accompanied by the processes of dissolution and removal of a non-image area after exposure, and another problem of the conventional technique which has been desired to be improved is the point that such an additional wet process is indispensable in the plate-making process of a PS plate. In particular in recent years, global environmental protection has been a matter of concern in the industry at large. There are hence increased demands for simplification of processing, switching over to a dry process, and no processing from the environmental aspect and rationalization of the process with digitization.

As one plate-making method which meets the above demands, there is a development on machine system of using a photosensitive layer capable of removing the non-image area of a printing plate precursor in usual printing process, and effecting development after exposure on a printing machine to thereby obtain a final printing plate. However, when a PS plate so far been used is applied to the development on machine system, a printing plate precursor must be stored under a completely light-shielded state and/or under a constant temperature condition after exposure, e.g., during the period of time until the printing plate is loaded on a printing machine, because the photosensitive layer is not fixed.

With respect to the above problems, various types of development which are different from photo-reactions utilized in conventional photosensitive materials for low to middle power density exposure, specifically developments utilizing a chemical change, or a structural change such as a change of phase or form, can be performed in high power density exposure systems using high output solid state lasers, e.g., a semiconductor laser and a YAG laser. A recording system making use of such high power density exposure is called heat mode recording.

Further, conventionally used heat mode positive type printing plate precursors are accompanied by a big drawback such as residual films. That is, the improvement has been required in the point that the change in solubility by exposure is smaller in the vicinity of the support in an ink-receptive layer than in the vicinity of the surface of an ink-receptive layer. Since in a heat mode positive type printing plate precursor, the heat generation by heat mode exposure is based on the light absorption of a light absorbing agent in an ink-receptive layer, the generated quantity of heat is large on the surface of an ink-receptive layer and small in the vicinity of a support. Therefore, the degree of hydrophilization becomes relatively small in the vicinity of a support. As a result, a hydrophobic film is often not removed completely and remains as it is on an exposed area which is substantially to provide a hydrophilic surface. Such a residual film on a non-image area causes smearing on prints. In particular, when a metal support having high heat conductivity such as aluminum which has a preferred printing aptitude is used, since the temperature increase in the vicinity of a support is further inhibited due to heat diffusion, the problem of a residual film is conspicuous. For sufficiently hydrophilizing the vicinity of a support, an extremely large quantity of exposure energy is required or post treatment such as heating after exposure is necessary.

As a method for improving the maleficent influence by heat diffusion to a support at exposure in the foregoing heat mode printing plate, a method to reduce heat diffusion by providing an aluminum oxide layer having a certain thickness or more on the surface of a support is disclosed, e.g., in JP-A-52-37104 and JP-A-52-118417 (the term "JP-A" as used herein means an "unexamined published Japanese patent application"). This method is certainly effective but insufficient, and residual films on a heat mode positive printing plate cannot be got rid of up to the present.

SUMMARY OF THE INVENTION

Accordingly, one object of the present invention is to solve the above-described conventional problems, and to provide a lithographic printing plate precursor developable with water or an aqueous solution, loadable on a printing machine without development after imaging and printable, which is improved in sensitivity and press life, and capable of providing clear printed matters having no residual colors and stains.

Another object of the present invention is to provide a lithographic printing plate precursor capable of plate-making directly from digital data by recording with a solid state laser or a semiconductor laser which radiates infrared rays.

As a result of eager investigation of the present inventors for achieving the above objects, the problems can be solved by the following lithographic printing plate precursor, thus the present invention has been completed.

That is, the present invention is as follows.

(1) A lithographic printing plate precursor which comprises a support having a hydrophilic surface having provided thereon in order of a layer containing a latex (layer A) and an ink-receptive layer (layer B) whose solubility at least either in water or in an aqueous solution is converted by heat, wherein at least one layer of either layer A or layer B contains a light/heat converting agent.

(2) The lithographic printing plate precursor as described in the above item (1), wherein the latex is crosslinked organic resin particles.

(2) The lithographic printing plate precursor as described in the above item (1), wherein the coating amount of the layer containing a latex (layer A) is from 0.05 to 2.0 g/$m^2$ and the absorbance of layer A at the wavelength of laser beams for imaging is from 0.3 to 2.

"Water or an aqueous solution" in the above lithographic printing plate precursor according to the present invention will be described. When an ink-receptive layer in the lithographic printing plate precursor of the present invention contains the later-described polarity converting high molecular weight compound (irrespective of a positive type or a negative type), "water" may be pure water or water containing other components so long as it can dissolve a non-image area, or may be a fountain solution charged with ink at printing.

When the foregoing ink-receptive layer contains a resin soluble in an alkali aqueous solution (no matter whether it is positive type or negative type), "an aqueous solution" includes conventionally well-known alkali developing solutions besides the above-described fountain solution. As described above, a fountain solution falls under both "water" and "an aqueous solution".

According to the lithographic printing plate precursor of the present invention, layer B at exposed area is imagewise solubilized (becomes positive) or insolubilized (becomes negative) in water or an aqueous solution by the heat generated by light/heat conversion by exposure. At that time, if a light/heat converting agent is contained in layer A, the solubility conversion of layer B in water or an aqueous solution progresses from the interface of layer A and layer B. When the solubility conversion of layer B is a positive type, the adhesion of layer A to layer B becomes worse, because the dissolution progresses from the interface. Accordingly, layer B can be completely removed even if layer B is not solubilized entirely.

On the other hand, when the solubility conversion of layer B is a negative type, the adhesion of layer A to layer B is improved, because the insolubilization progresses from the interface. Accordingly, layer B cannot be completely removed even if layer B is not insolubilized entirely. That is, when layer A contains a light/heat converting agent, it is not necessary to convert the solubility of layer B entirely and the lithographic printing plate precursor becomes highly sensitive.

Further, when a light/heat converting agent is contained in layer B, the solubility conversion of layer B in water or an aqueous solution progresses from the surface of layer B. In this case, if layer A is present, the heat diffusion to the support is inhibited and the vicinity of the support of layer B is sufficiently heated to the temperature necessary for solubility conversion. Accordingly, if the solubility conversion of layer B is a positive type, a residual film does not occur, and if the conversion is a negative type in contrast with this, the adhesion of layer B to the support is improved. Accordingly, the solubility conversion of layer B can progress completely due to the presence of layer A.

Further, when a light/heat converting agent is contained in both layer A and layer B, the above-described two effects can be exhibited at the same time by controlling the contents of a light/heat converting agent arbitrarily. Taking into consideration the sensitivity, adhesion, printing aptitude and cost, it is more preferred to add a light/heat converting agent to layer A or both layer A and layer B.

When the lithographic printing plate precursor is subjected to development with water or an aqueous solution or development on machine, layer B is imagewise removed. On the other hand, since a latex is insoluble in pure water, an alkali aqueous solution, solvents such as methanol, acetone, MEK, MFG, isopropanol and acetonitrile, layer A cannot be removed by development. Consequently, the surface of layer A is exposed. However, layer A containing a latex has the structure comprising particles gathering and piling up differing from a layer containing an ordinary linear high molecular weight compound, therefore, the particles of the exposed area are disjointed and removed from the support by external forces such as rubbing with a plate cylinder during printing process. The surface of the hydrophilic support is thereby exposed and a good non-image area free from stains is formed.

On the other hand, since layer B is positioned on layer A, layer A does not directly receive external force at printing, hence the latex in the image area of layer A is not disjointed during printing. In addition, the sensitivity of the lithographic printing plate precursor becomes high and the solubility conversion of layer B can be effected.

Although water-soluble polymers which are dissolved in water or an aqueous solution may be used in layer A of the lithographic printing plate precursor in place of latices, layer A is removed by development when such polymers are used. The development speed of the image area of layer A is slower than that of the non-image area due to the presence of the upper layer B, but the image area is also dissolved from the side. Consequently, the part in contact with the support becomes small (thin), as a result the strength of the image area, i.e., the press life, becomes weak. In particular, when water-soluble polymers are used, layer A is gradually dissolved due to a fountain solution during printing, thus the press life becomes worse.

In contrast with this, layer A of the lithographic printing plate precursor according to the present invention containing a latex insoluble in various kinds of solvents is not dissolved in a developing solution such as water and an alkali aqueous solution and a fountain solution during printing.

From the above reasons, when the lithographic printing plate precursor having layer A containing a latex according to the present invention is used, excellent image area strength, i.e., press life, can be obtained.

The lithographic printing plate precursor having the above-described layer A and layer B is capable of plate-making directly from digital data, e.g., from a computer, by recording with a solid state laser or a semiconductor laser radiating infrared rays, and a printing plate having high sensitivity, excellent press life free from stains can be obtained.

Where organic resin particles having no crosslinking are used as the latex contained in layer A, developability on machine system deteriorates due to slight fusion occurred at drying in film formation. For this reason, in order to secure good developability, it is necessary to use particles having an average particle size of 40 nm or more. Contrary to this, where crosslinked organic resin particles are used, particle shape is tightly maintained by the crosslinking, so that fusion does not occur at drying in film formation even if an average particle size is small. Therefore, good developability can be secured even if the average particle size id about 20 nm. If the average particle size becomes small, area contacting a substrate and layer A increases. As a result, adhesiveness between the substrate and layer A becomes good, and press file is improved.

For the above reasons, if crosslinked organic resin particles are particularly used as the latex contained in layer A, better strength in image portion, i.e., press file, is obtained.

DETAILED DESCRIPTION OF THE INVENTION

The present invention will be described in detail below.

The lithographic printing plate precursor according to the present invention is a lithographic printing plate precursor which comprises a support having a hydrophilic surface having provided thereon in order of a layer containing a latex (layer A) and an ink-receptive layer (layer B) whose solubility at least either in water or in an aqueous solution is converted by heat, wherein at least one layer of either layer A or layer B contains a light/heat converting agent. In the first place, a layer containing a latex (layer A) which is the characteristic of the lithographic printing plate precursor of the present invention is explained.

Layer Containing Latex (Layer A)

"A layer containing a latex (hereinafter referred to as layer A)" for use in the present invention means a layer containing at least a latex described below.

Latex

Latices for use in the present invention are not especially limited so long as they can efficiently utilize the heat generated in layer A and/or layer B by varying the distribution of heat conductivity, but granulated organic particles are particularly preferably used. When a solvent is used for dispersing resin particles, it is necessary to take care to select resin particles which are not dissolved in the solvent or a solvent which does not dissolve the resin particles. Moreover, when resin particles are dispersed by a thermoplastic polymer and heat, resin particles which do not melt, are not deformed or are not decomposed by the heat for dispersion should be selected.

Taking the above-described points into consideration, crosslinked resin particles are preferably used. Organic particles have an average particle size of from 0.01 to 10 μm, preferably from 0.05 to 10 μm, and more preferably from 0.05 to 5 μm. When the average particle size is less than 0.01 μm, the removing property of layer A and the conversion of the distribution of heat conductivity are improved only to bring poor results. While when it is more than 10 μm, the definition of printed matters becomes worse, and the adhesion of layer A to the support becomes extremely worse, as a result the strength of the image area lowers.

The content of a latex in layer A is not restricted but is preferably 2 wt % or more, more preferably 5 wt % or more. If the content of a latex is less than 2 wt %, the improvements of the removing property of layer A and the conversion of the distribution of heat conductivity result in poor effects.

As the organic particles, polystyrene particles (having a particle size of from 0.01 to 10 μm) and silicone resin particles (having a particle size of from 0.01 to 4 μm) can be exemplified. As the crosslinked resin particles, e.g., microgels comprising two or more ethylenically unsaturated monomers (having a particle size of from 0.01 to 1 μm) crosslinked resin particles comprising styrene and divinylbenzene (having a particle size of from 0.01 to 10 μm), crosslinked resin particles comprising methyl methacrylate and diethylene glycol dimethacrylate (having a particle size of from 0.01 to 10 μm), etc., i.e., microgels of acrylate resin, crosslinked polystyrene and crosslinked methyl methacrylate, etc., can be exemplified. These organic particles can be produced by general methods, such as emulsion polymerization, soap free emulsion polymerization, seed emulsion polymerization, dispersion polymerization, suspension polymerization, etc.

Other Components

The following components can be added to layer A of the present invention besides a latex, if necessary.

Organic High Molecular Weight Compound

An organic high molecular weight compound can be added to layer A of the lithographic printing plate precursor of the present invention for the purpose of increasing film property. Examples of organic high molecular weight compounds which can be used include an acrylate resin, a methacrylate resin, a styryl resin, a polyester resin, a polyurethane resin, a polycarbonate resin, a polyamide resin, and a polyacetal resin. Of these, an acrylate resin, a methacrylate resin, a styryl resin, a polyester resin, and a polyurethane resin are preferably used, and an acrylate resin, a methacrylate resin, and a polyurethane resin are particularly preferably used.

The organic high molecular weight compounds which are added to layer A of the lithographic printing plate precursor of the present invention preferably have a weight average molecular weight measured by GPC of preferably 2,000 or more, more preferably from 5,000 to 300,000, and a number average molecular weight of preferably 800 or more, more preferably from 1,000 to 250,000. The degree of polydispersion (a weight average molecular weight/a number average molecular weight) of the organic high molecular weight compounds is preferably 1 or more, more preferably from 1.1 to 10.

These organic high molecular weight compounds may be any of a random polymer, a block polymer and a graft polymer but a random polymer is preferred.

When these organic high molecular weight compounds are added to a layer containing a latex, the proportion of their content is preferably 50 wt % or less, more preferably 40 wt % or less. When the content is more than 50 wt %, the removing property of layer A becomes worse and the resistance to staining of a non-image area lowers.

Light/Heat Converting Agent

The light/heat converting agents which can be contained in a layer containing a latex of the lithographic printing plate precursor according to the present invention and absorb laser beams and convert the absorbed laser beams into light are described below.

The light/heat converting agents preferably used in the present invention are dyes and pigments which effectively absorb light of wavelength of from 760 to 1,200 nm, more preferably dyes and pigments having absorption maximum at wavelength of from 760 to 1,200 nm.

As dyes for this purpose, those commercially available and well-known dyes described, for example, in *Senryo Binran* (*Dye Handbook*), compiled by Yuki Gosei Kagaku Kyokai (1970) can be utilized. Specific examples of these dyes include an azo dye, a metal complex azo dye, a pyrazolone azo dye, an anthraquinone dye, a phthalocyanine dye, a carbonium dye, a quinoneimine dye, a methine dye, a cyanine dye and a metal thiolate complex.

A cyanine dye, a methine dye, a naphthoquinone dye and a squarylium dye can be exemplified as preferred dyes, for example.

Further, a near infrared-absorbing sensitizer, a substituted arylbenzo(thio)pyrylium salt, a trimethine thiapyrylium salt, a pyrylium-based compound, a cyanine dye, a pentamethine thiopyrylium salt, and a pyrylium compound are also preferably used in the present invention.

As other examples of preferred dyes, near infrared-absorbing dyes disclosed in U.S. Pat. No. 4,756,993 as the compounds represented by formulae (I) and (II) can be exemplified.

Of the above-described dyes, especially preferred dyes are a cyanine dye, a squarylium dye, a pyrylium salt, and a nickel thiolate complex.

As the pigments for use in the present invention, those commercially available and pigments described in *Color Index* (*C.I.*) *Binran* (*Color Index Handbook*), *Saishin Ganryo Binran* (*The Latest Pigment Handbook*), compiled by Nihon Ganryo Gijutsu Kyokai (1977), *Saishin Ganryo Oyo Gijutsu* (*The Latest Pigment Applied Technique*), published by CMC Publishing Co. (1986), *Insatsu Ink Gijutsu* (*Printing Ink Technique*), CMC Publishing Co. (1984) can be used.

Various kinds of pigments can be used, e.g., black pigments, yellow pigments, orange pigments, brown pigments, red pigments, purple pigments, blue pigments, green pigments, fluorescent pigments, metal powder pigments, and polymer-attaching pigments can be exemplified. Specifically, an insoluble azo pigment, an azo lake pigment, a condensation azo pigment, a chelate azo pigment, a phthalocyanine pigment, an anthraquinone pigment, a perylene pigment, a perinone pigment, a thioindigo pigment, a quinacridone pigment, a dioxazine pigment, an isoindolinone pigment, a quinophthalone pigment, an in-mold lake pigment, an azine pigment, a nitroso pigment, a nitro pigment, a natural pigment, a fluorescent pigment, an inorganic pigment, and a carbon black can be used. Of these, a preferred is a carbon black.

These pigments can be used without surface treatment or may be surface-treated. As methods of surface treatments, a method of surface-coating with a resin and a wax, a method of adhering a surfactant, and a method of attaching a reactive substance (e.g., a silane coupling agent, an epoxy compound and polyisocyanate) on the surface of a pigment can be exemplified. These surface treatment methods are described in *Kinzoku Sekken no Seishitsu to Oyo* (*Natures and Applications of Metal Soaps*), Saiwai Shobo Co., *Insatsu Ink Gijutsu* (*Printing Ink Technique*), CMC Publishing Co. (1984), and *Saishin Ganryo Oyo Gijutsu* (*The Latest Pigment Applied Technique*), CMC Publishing Co. (1986).

These pigments preferably have a particle size of preferably from 0.01 to 10 μm, more preferably from 0.05 to 1 μm, and particularly preferably from 0.1 to 1 μm. If the particle size of these pigments is less than 0.1 μm, it is not preferred from the viewpoint of the stability of the dispersion in the coating solutions of a high molecular weight complex-containing layer and an ink-receptive layer, while when it exceeds 10 μm, it is not preferred in view of the uniformity of a latex-containing layer and an ink-receptive layer after coating.

Well-know methods used in the manufacture of inks and toners can be used as the dispersing methods of pigments. Examples of dispersing apparatus include a sand mill, an attritor, a pearl mill, a super-mill, a ball mill, an impeller, a disperser, a KD mill, a colloidmill, a dynatron, a three-roll mill, a pressure kneader, etc., and details are described in *Saishin Ganryo Oyo Gijutsu* (*The Latest Pigment Applied Technique*), CMC Publishing Co. (1986).

These dyes or pigments can be used in an amount of from 0.01 to 50 wt %, preferably from 0.1 to 10 wt %, based on the entire solid contents in layer A and an ink-receptive layer of the lithographic printing plate precursor of the present invention, and in the case of dyes, particularly preferably the amount of from 0.5 to 10 wt % and in the case of pigments, particularly preferably the amount of from 1.0 to 10 wt %, can be used. If the addition amount of pigments or dyes is less than 0.01 wt %, the sensitivity lowers, and when it exceeds 50 wt %, a non-image area is liable to be stained at printing.

Solid Particles

Besides the light/heat converting agents, inorganic particles and metallic particles may be added to layer A of the lithographic printing plate precursor of the present invention. As such inorganic particles, particles which can not only accelerate the removal of layer A but efficiently utilize the heat generated in layer A and/or layer B by varying the distribution of heat conductivity are preferably used.

As such inorganic particles, e.g., metallic oxides, such as zinc oxide, titanium dioxide, iron oxide, and zirconia; silicon-containing oxides which themselves do not have absorption in the visible region and called white carbon, such as silicic anhydride, hydrated calcium silicate, and hydrated aluminum silicate; and clay mineral particles, such as clay, talc, kaolin and zeolite can be used. Further, as metallic particles, e.g., aluminum, copper, nickel, silver and iron can be used. The inorganic particles and the metallic particles have an average particle size of 10 μm or less, preferably from 0.01 to 10 μm, and more preferably from 0.1 to 5 μm. When the average particle size of the inorganic particles and the metallic particles is less than 0.01 μm, the removing property of layer A and the conversion of the distribution of heat conductivity are improved only to bring poor results. While when it is more than 10 μm, the definition of printed matters becomes worse, and the adhesion of layer A to the support becomes extremely worse, as a result the strength of the image area lowers.

The contents of the inorganic particles and the metallic particles are not limited so long as the latex is contained in an appropriate amount, but the content is preferably 90 wt % or less, more preferably 80 wt % or less. When the contents of these particles are more than 90 wt %, the definition of printed matters becomes worse, and the adhesion of layer A to the support becomes extremely worse, as a result the strength of the image area lowers.

Surfactants can be added to layer A of the lithographic printing plate precursor of the present invention for widening the stability to printing conditions, e.g., nonionic surfactants as disclosed in JP-A-62-251740 and JP-A-3-208514, and ampholytic surfactants as disclosed in JP-A-59-121044 and JP-A-4-13149 can be added.

Specific examples of nonionic surfactants include sorbitan tristearate, sorbitan monopalmitate, sorbitan trioleate, stearic acid monoglyceride, polyoxyethylenenonylphenyl ether, etc.

Specific examples of ampholytic surfactants include alkyldi(aminoethyl)glycine, alkylpolyaminoethylglycine hydrochloride, 2-alkyl-N-carboxyethyl-N-hydroxyethyl-imidazolinium betaine, N-tetradecyl-N,N-betaine type (e.g., Amorgen K, trade name, Daiichi Kogyo Seiyaku Co., Ltd.).

The proportion of the above-described nonionic and ampholytic surfactants in the total solid contents in layer A is preferably from 0. 05 to 15 wt %, more preferably from 0.1 to 5 wt %.

Others

Plasticizers are added to layer A of the lithographic printing plate precursor according to the present invention for improving the flexibility of the film, if necessary, e.g., polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid, etc., can be used.

Layer A of the lithographic printing plate precursor according to the present invention can be generally manufactured by dispersing and dissolving the above-described each component in a solvent and coating the coating solution on an appropriate support. Examples of the solvents used include tetrahydrofuran, ethylene dichloride, cyclohexanone, methyl ethyl ketone, acetone, methanol, ethanol, propanol, ethylene glycol monomethyl ether, ethylene glycol monoethyl ether, 2-methoxyethyl acetate, diethylene glycol di-methyl ether, 1-methoxy-2-propanol, 1-methoxy-2-propyl acetate, dimethoxy-ethane, N,N-dimethylformamide, N,N-dimethylacetamide, toluene, ethyl acetate, ethyl lactate, methyl lactate, dimethyl sulfoxide, water, sulfolane, γ-butyrolactone, etc., but solvents are not limited thereto.

These solvents are used alone or as mixture. When a coating solution is prepared, the concentration of the above constitutional components of layer A (total solid contents inclusive of the additives) in a solvent is preferably from 1 to 50 wt %.

Various coating methods can be used, e.g., bar coating, rotary coating, spray coating, curtain coating, dip coating, air knife coating, blade coating, and roll coating can be used.

Surfactants, e.g., fluorine surfactants disclosed in JP-A-62-170950, can be added to layer A of the lithographic printing plate precursor according to the present invention for improving the coating property. Addition amount is preferably from 0.01 to 1 wt %, more preferably from 0.05 to 0.5 wt %, of the total solid contents of layer A.

The coating amount of layer A obtained after coating and drying (solid contents) varies according to purposes, but the coating amount of a general lithographic printing plate precursor is preferably from 0.05 to 2.0 $g/m^2$, more preferably from 0.1 to 1.5 $g/m^2$.

When the coating amount of layer A is less than 0.05 $g/m^2$, the heat insulating property is insufficient, the polarity conversion (conversion to soluble or insoluble in water or an aqueous solution) of the upper layer (layer B) is insufficient, which brings about residual film (when layer B is solubilized) or the reduction of image area strength (when insolubilized). While when the coating amount is more than 2.0 $g/m^2$, the durability of the intermediate layer (layer A) to the force at printing lowers and the strength of the image area is reduced.

When the absorbance of layer A at the wavelength of laser beams for imaging is less than 0.3, the conversion of layer B becomes insufficient because the heating effect from the lower side is not sufficient. When the absorbance is more than 2, the amount of the light/heat converting agent added to layer A, e.g., a dye, is too much, as a result the strength of layer A becomes insufficient and the strength of image area disadvantageously lowers.

Ink-Receptive Layer

An ink-receptive layer is described below.

Any layer can be used as an ink-receptive layer (layer B) for use in the lithographic printing plate precursor according to the present invention so long as the layer can be imagewise solubilized (becomes positive) or insolubilized (becomes negative) in water or an aqueous solution by the heat generated by light/heat conversion by exposure. The preferred layers as layer B which undergoes positive conversion are a layer containing a hydrophobic high molecular weight compound which is converted into hydrophilic by heat (hereinafter sometimes referred to as "a positive type polarity converting high molecular weight compound"), and a layer containing a resin soluble in an alkali aqueous solution. The preferred layers as layer B which undergoes negative conversion are a layer containing a hydrophilic high molecular weight compound which is converted into hydrophobic by heat (hereinafter sometimes referred to as "a negative type polarity converting high molecular weight compound"), and a layer containing a compound which crosslinks with a resin soluble in an alkali aqueous solution.

Layer Containing Positive Type Polarity Converting High Molecular Weight Compound "A layer containing a positive type polarity converting high molecular weight compound" for use in the lithographic printing plate precursor according to the present invention means a layer which contains at least a positive type polarity converting high molecular weight compound as described below.

Positive Type Polarity Converting High Molecular Weight Compound

A positive type polarity converting high molecular weight compound for use in the present invention is a hydrophobic high molecular weight compound which is converted into hydrophilic by heat as described above. As such a high molecular weight compound, a hydrophobic high molecular weight compound having a hydrophobic functional group which is converted into hydrophilic by heat at the side chain can be exemplified. This conversion is required to be conversion of the degree that a compound which does not show the affinity such as dissolving or swelling in water at normal temperature comes to show the affinity such as dissolving or swelling in water due to the conversion of a part of or the entire of the polarity converting functional group of the side chain when heat is applied to the compound by light/heat conversion after laser exposure.

The process that the hydrophobic functional group of a hydrophobic high molecular weight compound is converted into hydrophilic by heat is regarded to be classified into a process that an originally hydrophobic functional group of the side chain is converted into hydrophilic by the reaction by heat, and a process that an originally hydrophobic functional group of the side chain is decomposed by heat and the compound is converted into hydrophilic by losing the hydrophobic functional group.

As the former process of an originally hydrophobic functional group of the side chain converted into hydrophilic by the reaction by heat, there are a process that the hydrophobic functional group reacts with other functional group in the same polymer by heat and is converted into hydrophilic, and a process that the hydrophobic functional group reacts by heat with other compound on the outside of the polymer and is converted into hydrophilic, and functional groups may undergo the conversion into hydrophilic by these two kinds of processes in combination.

Of the above processes, a process that an originally hydrophobic functional group of the side chain is decomposed by heat and the compound is converted into hydrophilic by losing the hydrophobic functional group is preferred from the viewpoint of reactivity.

Further, it is more preferred in the present invention for the polarity converting functional group of the side chain of a polarity converting hydrophobic high molecular weight compound to be entirely converted into hydrophilic, but if the conversion occurs to a degree that a polarity converting high molecular weight compound comes to show the affinity such as dissolving or swelling in water, the polarity converting functional group need not be entirely converted into hydrophilic.

Specific examples of the hydrophobic functional groups for use in the present invention are shown below.

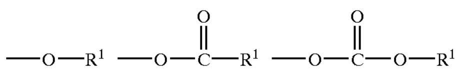

-continued

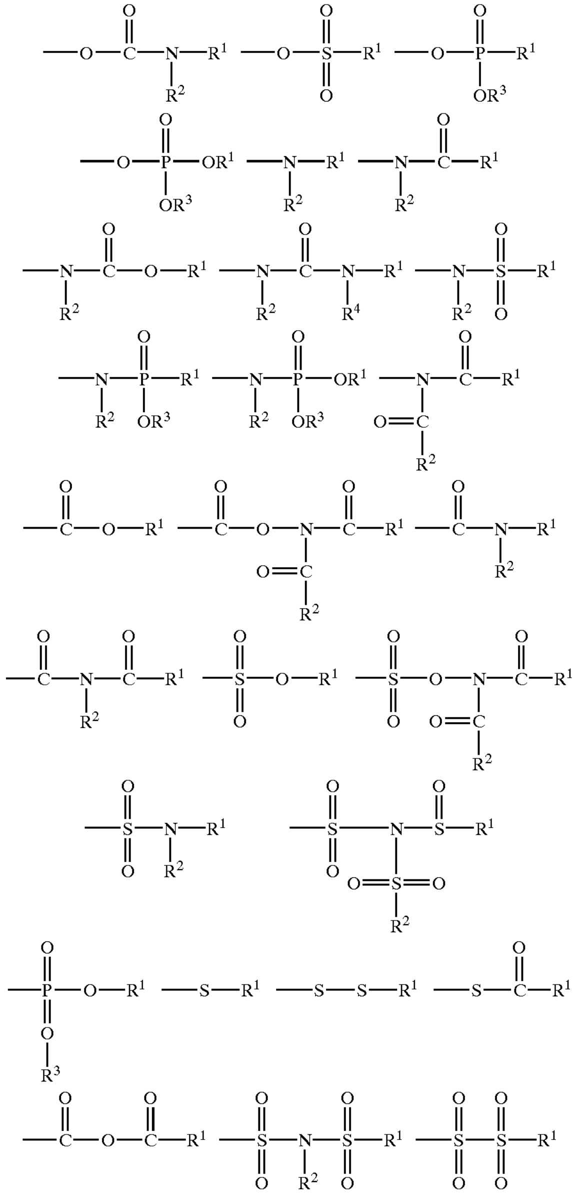

wherein $R^1$ and $R^3$ each represents an alkyl group, an aryl group, an alkenyl group or an alkynyl group; $R^2$ and $R^4$ each represents a hydrogen atom, an alkyl group, an aryl group, an alkenyl group or an alkynyl group; $R^1$ and $R^2$, $R^1$ and $R^3$, and $R^1$ and $R^4$ may be linked to each other to form a ring.

Specific examples of the hydrophilic functional groups for use in the present invention are shown below.

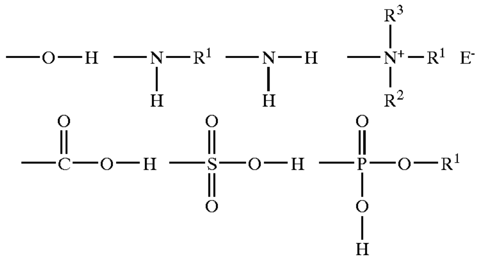

-continued

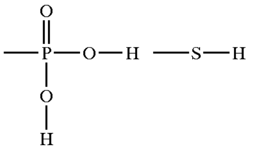

wherein $R^1$, $R^2$ and $R^3$ each represents a hydrogen atom, an alkyl group, an aryl group, an alkenyl group or an alkynyl group, and arbitrary two of $R^1$, $R^2$ and $R^3$ may be linked to form a ring; and $E_-$ represents a counter anion.

When $R^1$, $R^2$, $R^3$ and $R^4$ each represents an alkyl group, the alkyl group is a straight chain, branched or cyclic alkyl group having from 1 to 20 carbon atoms. Specific examples of the alkyl groups include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Of these groups, a straight chain alkyl group having from 1 to 12 carbon atoms, a branched alkyl group having from 3 to 12 carbon atoms, and a cyclic alkyl group having from 5 to 10 carbon atoms are more preferred.

When $R^1$, $R^2$, $R^3$ and $R^4$each represents a substituted alkyl group, monovalent nonmetallic atomic groups exclusive of a hydrogen atom are used as the substituents. Preferred examples of the substituents of the substituted alkyl group include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group ($—PO_3H_2$) and a conjugate base group thereof (hereinafter referred to as a phosphonato group), a dialkylphosphono group ($—PO_3(alkyl)_2$), a diarylphosphono group ($—PO_3(aryl)_2$), an alkylarylphosphono group ($—PO_3(alkyl)(aryl)$), a monoalkylphosphono group ($—PO_3H(alkyl)$) and a conjugate base group thereof (hereinafter referred to as an alkylphosphonato group), a monoarylphosphono group ($—PO_3H(aryl)$) and a conjugate base group thereof (hereinafter referred to as an arylphosphonato group), a phosphonoxy group ($—OPO_3H_2$) and a conjugate base group thereof (hereinafter referred to as a phosphonatoxy group), a dialkylphosphonoxy group ($—OPO_3$ $(alkyl)_2$), a diarylphosphonoxy group ($—OPO_3$ $(aryl)_2$), an alkylarylphosphonoxy group ($—OPO_3(alkyl)$ $(aryl)$), a monoalkylphosphonoxy group ($—OPO_3H(alkyl)$) and a conjugate base group thereof (hereinafter referred to as an alkylphosphonatoxy group), a monoarylphosphonoxy group ($—OPO_3H(aryl)$) and a conjugate base group thereof (hereinafter referred to as an arylphosphonatoxy group), a cyano group, a nitro group, an aryl group, an alkenyl group, and an alkynyl group.

As the specific examples of the alkyl groups in the substituents of the substituted alkyl groups, the above-described alkyl groups can be exemplified. As the specific examples of the aryl groups in the substituents of the substituted alkyl groups, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group can be exemplified. As the examples of the alkenyl groups in the substituents of the substituted alkyl groups, a vinyl group, a 1-propenyl group, a 1-butenyl group, a cinnamyl group, and a 2-chloro-1-ethenyl group can be exemplified, and as the examples of the alkynyl groups, an ethynyl group, a 1-propynyl group, a 1-butynyl group and a trimethylsilylethynyl group can be exemplified. As $R^5$ in the acyl group ($R^5CO—$), a hydrogen atom and the above-described alkyl groups and aryl groups can be exemplified.

Of these substituents, more preferred groups include a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group, and an alkenyl group.

On the other hand, as the alkylene group in the substituted alkyl groups, divalent organic residues obtained by removing any one hydrogen atom on the above-described alkyl groups having from 1 to 20 carbon atoms can be exemplified, preferably a straight chain alkylene group having from 1 to 12 carbon atoms, a branched alkylene group having from 3 to 12 carbon atoms, and a cyclic alkylene group having from 5 to 10 carbon atoms. Specific examples of the preferred substituted alkyl groups obtained by combining the above substituents and alkylene groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

When $R^1$, $R^2$, $R^3$ and $R^4$ each represents an aryl group, the aryl groups include a condensed ring formed by 1 to 3 benzene rings and a condensed ring formed by a benzene ring and a 5-membered unsaturated ring, and specific examples include a phenyl group, a naphthyl group, an anthryl group, a phenanthryl group, an indenyl group, an acenaphthenyl group, and a fluorenyl group. Of these groups, a phenyl group and a naphthyl group are more preferred. Heterocyclic aryl groups are included in the aryl group besides the above carbocyclic aryl groups. As the heterocyclic aryl groups, those containing from 3 to 20 carbon atoms and from 1 to 5 hetero atoms, e.g., a pyridyl group, a furyl group, a quinolyl group condensed with a benzene ring, a benzofuryl group, a thioxanthone group, and a carbazole group are used.

When $R^1$, $R^2$, $R^3$ and $R^4$ each represents a substituted aryl group, the substituted aryl groups are those having monovalent nonmetallic atomic groups exclusive of a hydrogen atom on the ring-forming carbon atoms of the above-described aryl groups as the substituents. As preferred examples of the substituents, the above-described alkyl groups, substituted alkyl groups, and the groups described above as the examples of the substituents in the substituted alkyl groups can be exemplified.

Preferred specific examples of these substituted aryl groups include a biphenyl group, a tolyl group, a xylyl group, a mesityl group, a cumenyl group, a chlorophenyl group, a bromophenyl group, a fluorophenyl group, a chloro-methylphenyl group, a trifluoromethylphenyl group, a hydroxy-phenyl group, a methoxyphenyl group, a methoxyethoxyphenyl group, an allyloxyphenyl group, a phenoxyphenyl group, a methylthiophenyl group, a tolylthiophenyl group, an ethyl-aminophenyl group, a diethylaminophenyl group, a morpholino-phenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoyl-phenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphono-phenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group, and a 3-butynylphenyl group.

When $R^1$, $R^2$, $R^3$ and $R^4$ each represents an alkenyl group, a substituted alkenyl group [—$C(R^6)$=$C(R^7)(R^8)$], an alkynyl group, or a substituted alkynyl group [—C≡$C(R^9)$], monovalent nonmetallic atomic groups can be used as $R^6$, $R^7$, $R^8$ and $R^9$.

Preferred examples of $R^6$, $R^7$, $R^8$ and $R^9$ include a hydrogen atom, a halogen atom, an alkyl group, a substituted alkyl group, an aryl group and a substituted aryl group. As the specific examples of these groups, those described above as examples can be exemplified. $R^6$, $R^7$, $R^8$ and $R^9$ each more preferably represents a hydrogen atom, a halogen atom, a straight chain, branched or cyclic alkyl group having from 1 to 10 carbon atoms.

Specific examples of the alkenyl groups, substituted alkenyl groups, alkynyl groups, and substituted alkynyl groups include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, 2-phenyl-1-ethenyl group, 2-chloro-1-ethenyl group, an ethynyl group, a propynyl group, and a phenylethyl group.

Of the above groups, $R^1$ and $R^3$ each preferably represents an alkyl group, a substituted alkyl group, an aryl group, or a substituted aryl group, and $R^2$ and $R^4$ each preferably represents a hydrogen atom, an alkyl group, a substituted alkyl group, an aryl group, or a substituted aryl group.

The counter anions represented by $E^-$ are anions having negative electric charge and form an ion pair with the positive electric charge in an ammonium group (—$N^+R^1R^2R^3$) which is a hydrophilic functional group. Therefore, the counter anions represented by $E^-$ are present in mol number equivalent to the positive electric charge present in the ammonium group.

More specific examples of counter anions include $F^-$, $Cl^-$, $Br^-$, $I^-$, $HO^-$, $CN^-$, $SO_4^{2-}$, $HSO_4^-$, $SO_3^{2-}$, $HSO_3^-$, $NO_3^-$, $CO_3^{2-}$, $HCO_3^-$, $PF_6^-$, $BF_4^-$, $ClO_4^-$, $ClO_3^-$, $ClO_2^-$, $ClO^-$, $BrO_4^-$, $BrO_3^-$, $BrO_2^-$, $BrO^-$, $IO_4^-$, $IO_3^-$, $IO_2^-$, $IO^-$, a sulfonate anion, a carboxylate anion, a phosphonate anion, a phosphate anion, etc.

As specific examples of the sulfonate anions, the following compounds can be exemplified, but it should not be construed as the present invention is limited thereto.

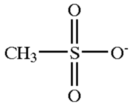 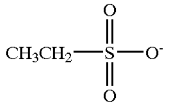 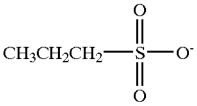

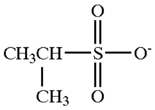 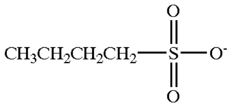

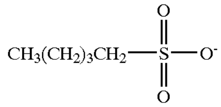 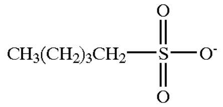

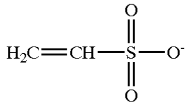 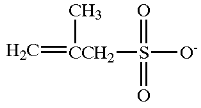 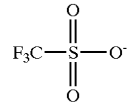

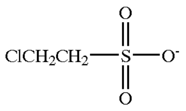 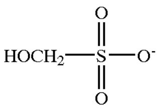 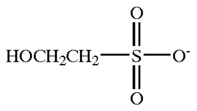

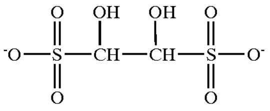 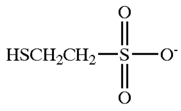

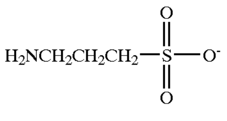 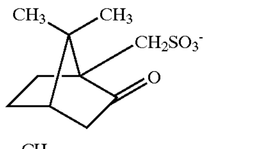

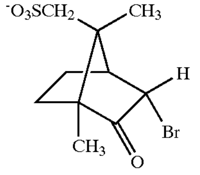

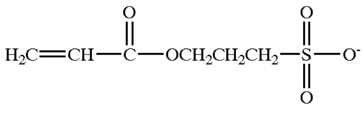 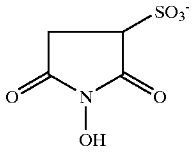

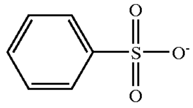 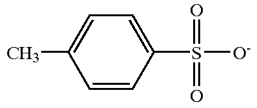

-continued
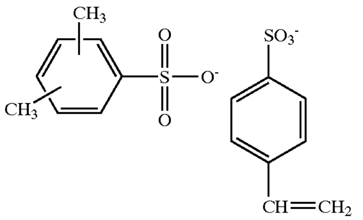
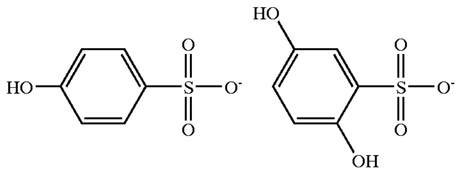
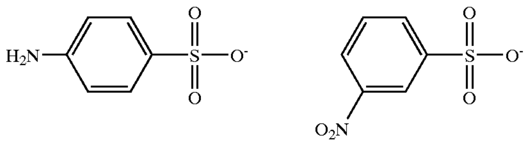
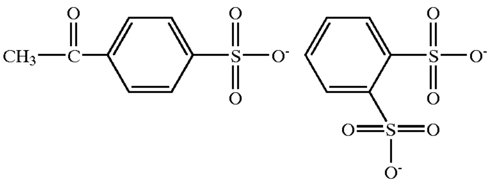
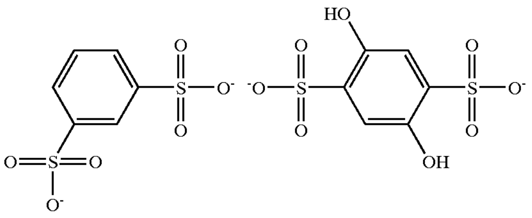
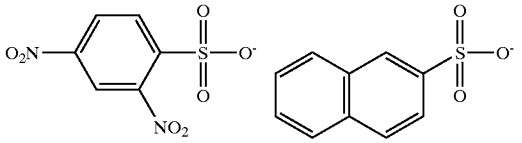
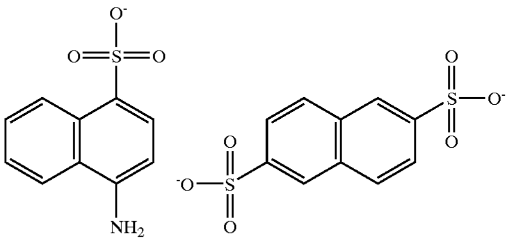
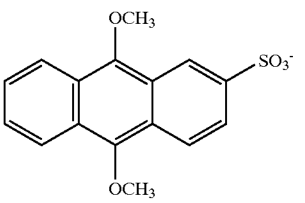
As specific examples of the carboxylate anions, the following compounds can be exemplified, but it should not be construed as the present invention is limited thereto.
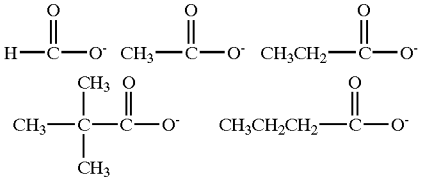
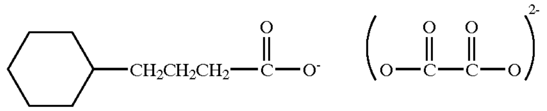
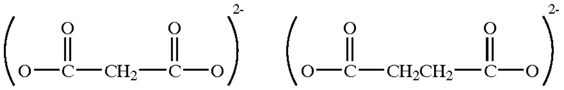
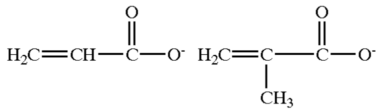
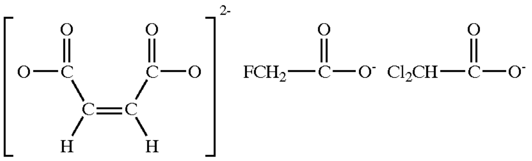
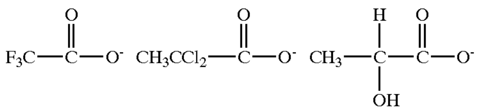
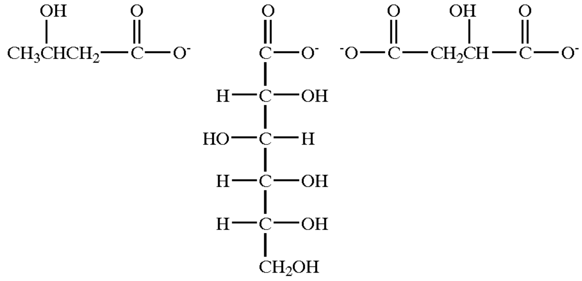
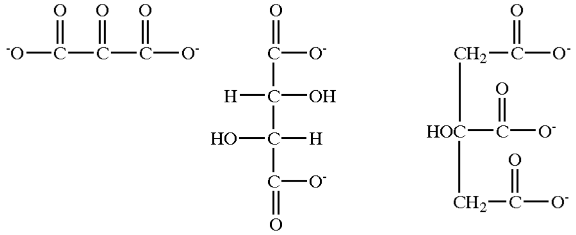
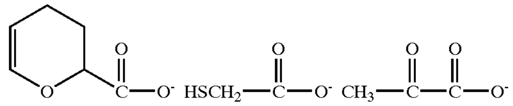
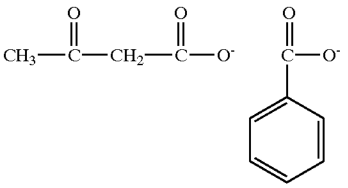
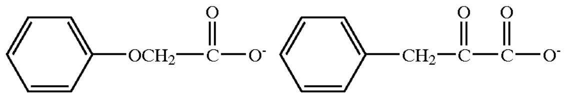

-continued

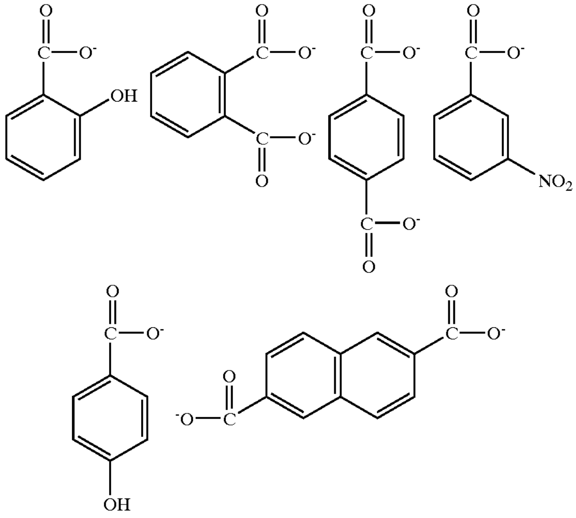

As specific examples of the phosphonate anions, the following compounds can be exemplified, but it should not be construed as the present invention is limited thereto.

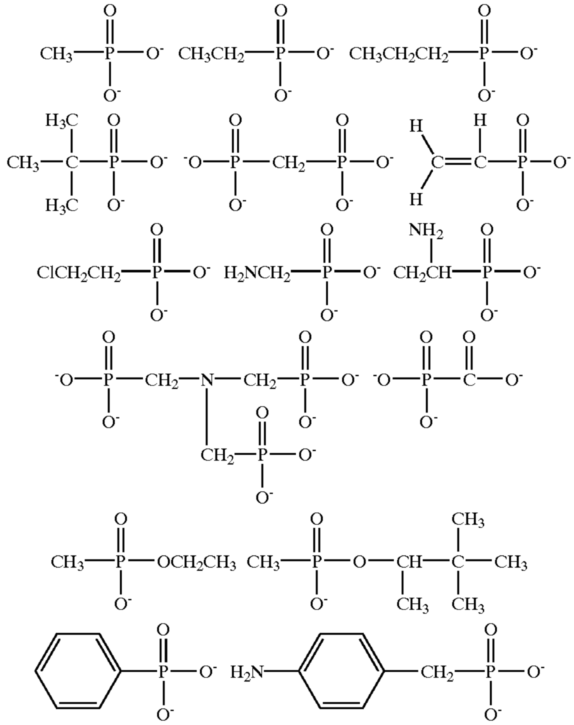

As specific examples of the phosphate anions, the following compounds can be exemplified, but it should not be construed as the present invention is limited thereto.

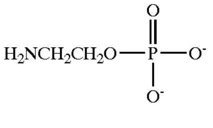

-continued

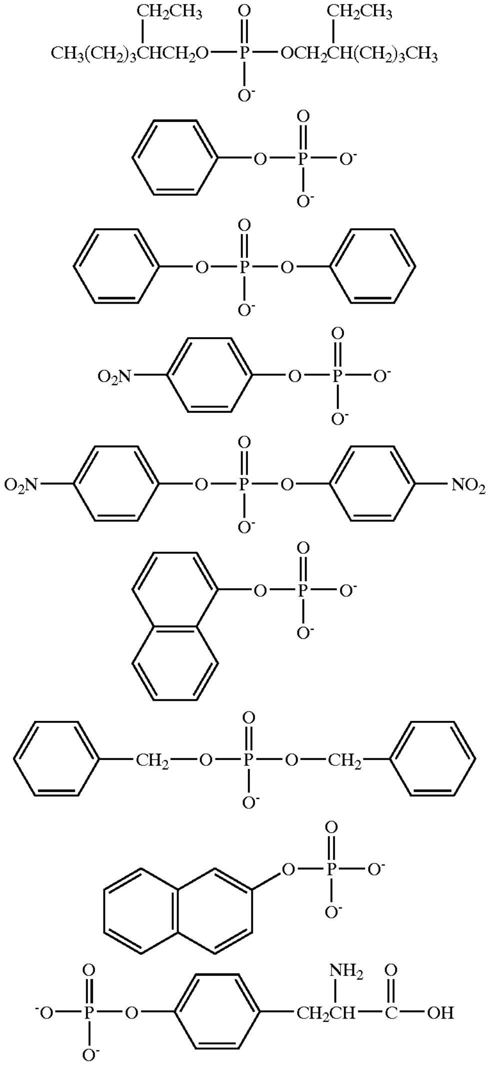

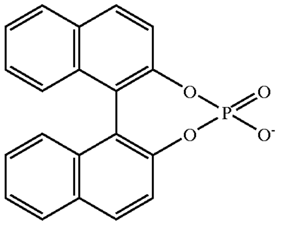

$PO_4^{3-}$, $HPO_4^{2-}$, $H_2PO_4^{-}$,

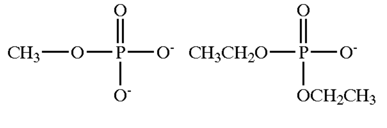

Of these anions, $Cl^-$, $Br^-$, $I^-$, $CN^-$, $SO_4^{2-}$, $PF_6^-$, $BF_4^{31}$, $ClO_4^-$, a sulfonate anion, a carboxylate anion, a phosphonate anion, and a phosphate anion are preferably used in the present invention.

Of these hydrophobic functional groups which are converted into hydrophilic by heat, the functional groups represented by the following formulae (1) to (5) are particularly preferred from the viewpoint of reactivity, storage stability and hydrophilic/hydrophobic discriminability.

(1)

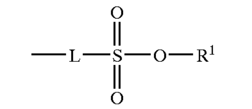

(2)

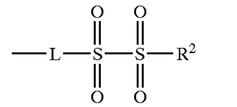

(3)

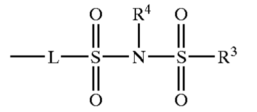

(4)

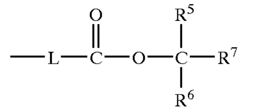

(5)

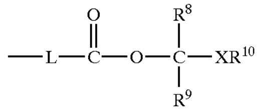

wherein L represents a polyvalent linking group comprising nonmetallic atoms; $R^1$ represents an alkyl group, an aryl group, an alkenyl group, an alkynyl group, or a cyclic imido group; $R^2$ and $R^3$ each represents an alkyl group, an aryl group, an alkenyl group, or an alkynyl group; $R^4$ represents an alkyl group, an aryl group, an alkenyl group, an alkynyl group, or $—SO_2—R^{11}$; $R^5$, $R^6$ and $R^7$ each represents an alkyl group, an aryl group, an alkenyl group, or an alkynyl group; either $R^8$ or $R^9$ represents a hydrogen atom, and the other represents a hydrogen atom, an alkyl group, an aryl group, an alkenyl group, or an alkynyl group; $R^{10}$ represents an alkyl group, an alkenyl group, or an alkynyl group; $R^{11}$ represents an alkyl group, an aryl group, an alkenyl group, or an alkynyl group; arbitrary two or three of $R^5$, $R^6$ and $R^7$ may be linked to form a ring, and $R^8$ and $R^{10}$, or $R^9$ and $R^{10}$ may be linked to form a ring; and X represents O or S.

When $R^1$ to $R^{11}$ each represents an alkyl group, the above-described functional groups can be exemplified as the alkyl group.

When $R^1$ to $R^{11}$ each represents a substituted alkyl group, the above-described functional groups can be exemplified as the substituents.

When $R^1$ to $R^9$ and $R^{11}$ each represents an aryl group, the above-described functional groups can be exemplified as the aryl group.

When $R^1$ to $R^9$ and $R^{11}$ each represents a substituted aryl group, the above-described functional groups can be exemplified as the substituted aryl group.

When $R^1$ to $R^{11}$ each represents an alkenyl group, a substituted alkenyl group $[—C(R^{13})═C(R^{14})(R^{15})]$, an alkynyl group, or a substituted alkynyl group $[—C≡C(R^{16})]$, monovalent nonmetallic atomic groups can be used as $R^{13}$, $R^{14}$, $R^{15}$ and $R^{16}$.

$R^{13}$, $R^{14}$, $R^{15}$ and $R^{16}$ each preferably represents a hydrogen atom, a halogen atom, an alkyl group, a substituted alkyl group, an aryl group or a substituted aryl group. As the specific examples of these groups, those described above as examples can be exemplified.

When $R^1$ represents a cyclic imido group, succinic acid imide, phthalic acid imide, cyclohexanedicarboxylic acid imide, and norbornenedicarboxylic acid imide each having from 4 to 20 carbon atoms can be used as the cyclic imido groups.

$R^1$ particularly preferably represents an alkyl group, a substituted alkyl group, or a cyclic imido group.

$R^2$, $R^3$, $R^4$and $R^{11}$ each particularly preferably represents an alkyl group substituted with an electron attractive group such as halogen, cyano, or nitro, an aryl group substituted with an electron attractive group such as halogen, cyano, or nitro, or a secondary or tertiary branched alkyl group.

$R^5$, $R^6$, $R^7$, $R^8$ and $R^9$ each preferably represents an alkyl group, a substituted alkyl group, an aryl group or a substituted aryl group, $R^{10}$ preferably represents an alkyl group or a substituted alkyl group, preferably arbitrary two or three of $R^5$, $R^6$ and $R^7$ are linked to form a ring, and $R^8$ and $R^{10}$, or $R^9$ and $R^{10}$ are preferably linked to form a ring.

The polyvalent linking group comprising nonmetallic atoms represented by L is a polyvalent linking group comprising from 1 to 60 carbon atoms, from 0 to 10 nitrogen atoms, from 0 to 50 oxygen atoms, from 1 to 100 hydrogen atoms, and from 0 to 20 sulfur atoms. As more specific examples of the linking groups, those comprising the following structural units in combination can be exemplified.

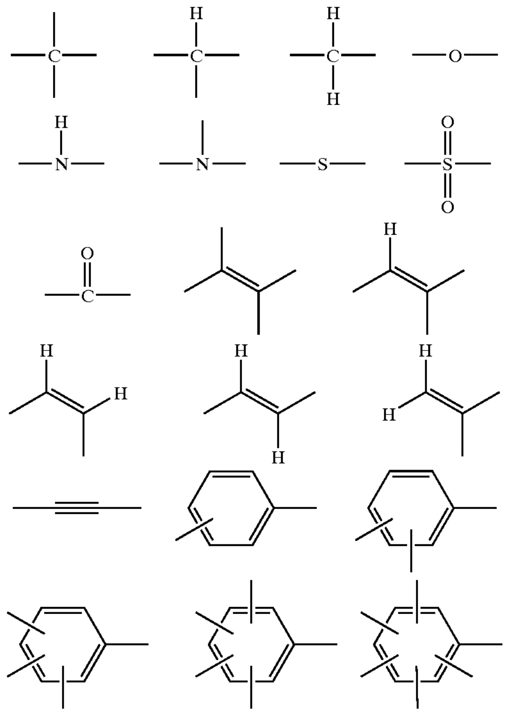

When the polyvalent linking group has a substituent, an alkyl group having from 1 to 20 carbon atoms, e.g., methyl and ethyl, an aryl group having from 6 to 16 carbon atoms, e.g., phenyl and naphthyl, a hydroxyl group, a carboxyl group, a sulfonamido group, an N-sulfonylamido group, an acyloxy group having from 1 to 6 carbon atoms, e.g., acetoxy, an alkoxyl group having from 1 to 6 carbon atoms, e.g., methoxy and ethoxy, a halogen atom, e.g., chlorine and bromine, an alkoxycarbonyl group having from 2 to 7 carbon atoms, e.g., methoxycarbonyl, ethoxycarbonyl, and cyclohexyloxycarbonyl, a cyano group, and carbonic acid ester, e.g., t-butylcarbonate can be used as the substituent.

Specific examples of the radical polymerizable monomers having a hydrophobic functional group converted into hydrophilic by heat which are preferably used for synthesiz□ing a positive type polarity converting high molecular weight compound of the present invention are shown below, but the present invention should not be construed as being limited thereto.
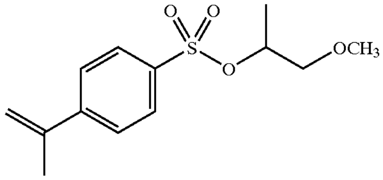
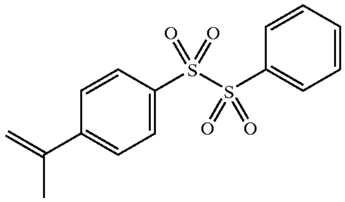
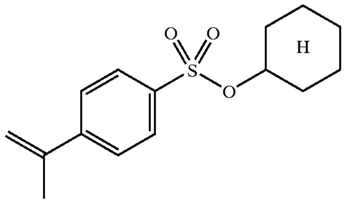
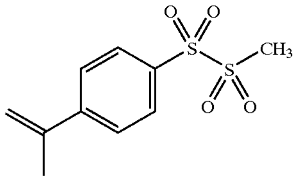
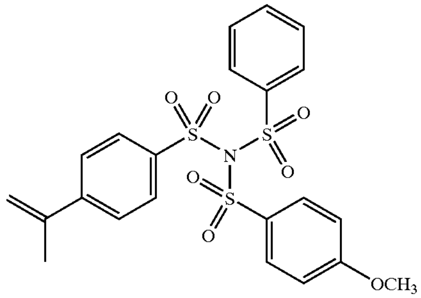
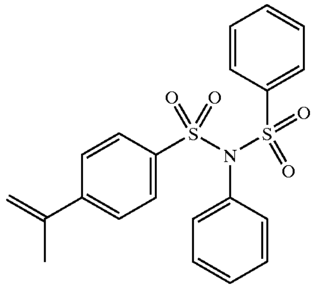
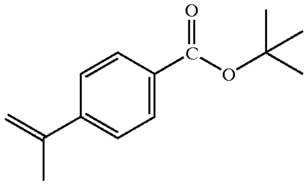
-continued
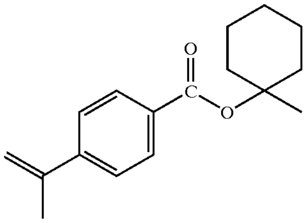
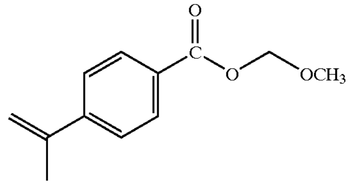
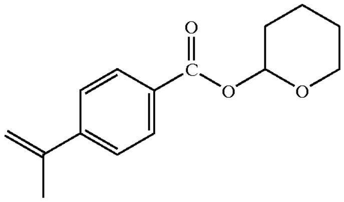
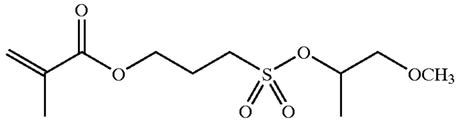
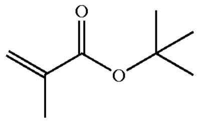
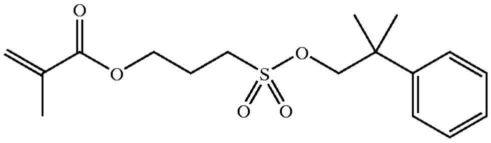
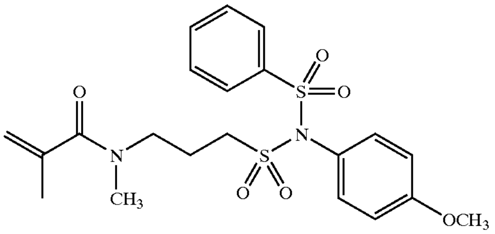
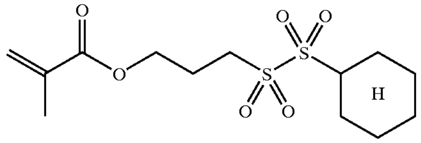
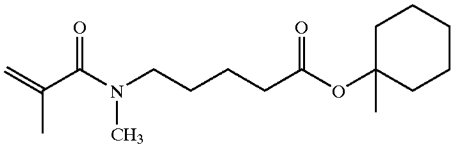
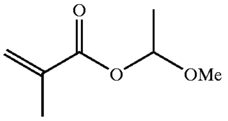
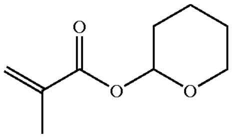

-continued
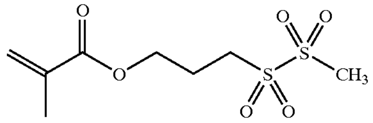
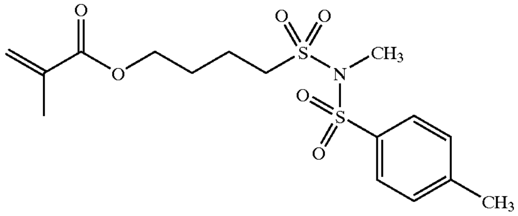
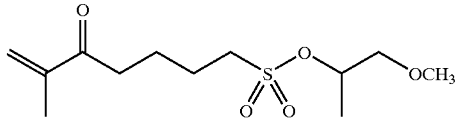
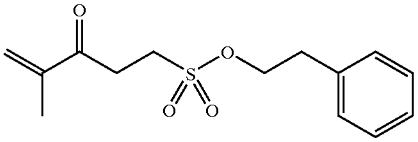
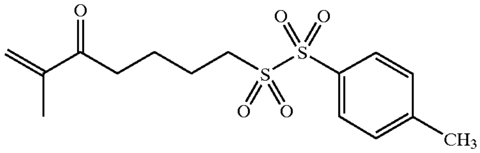
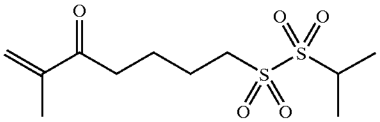
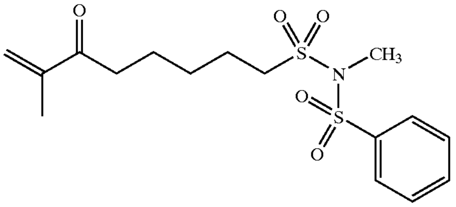
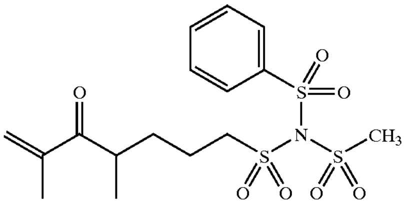
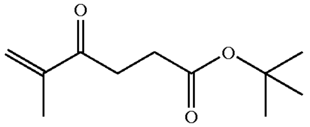
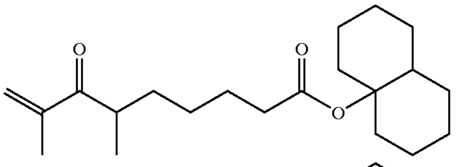
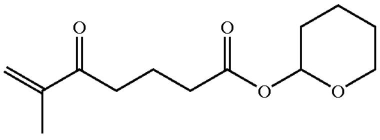
-continued
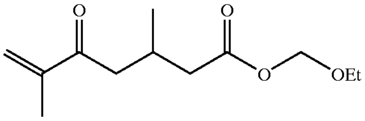
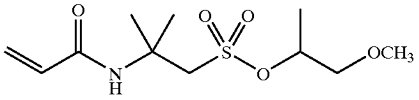
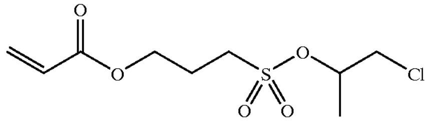
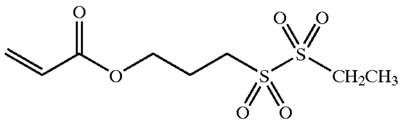
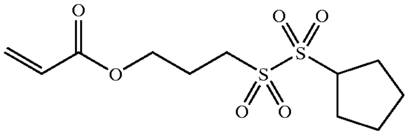
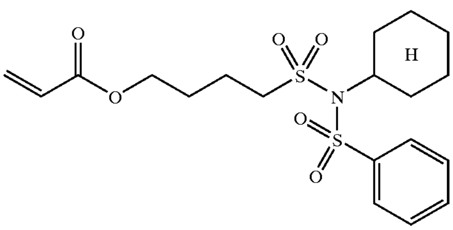
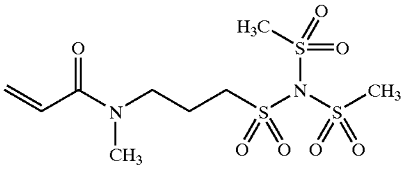
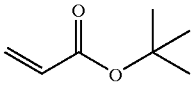
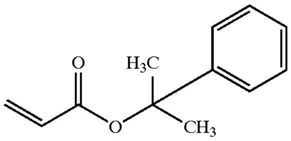
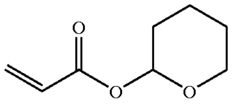
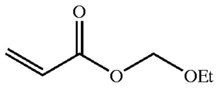
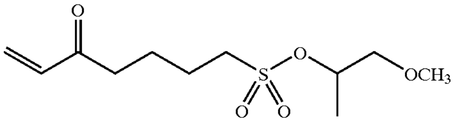
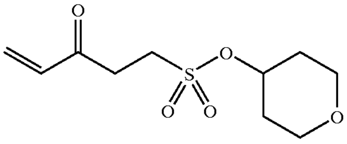
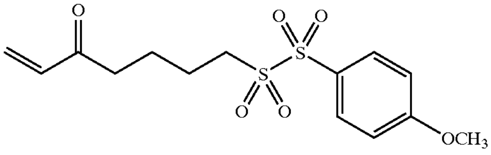

-continued
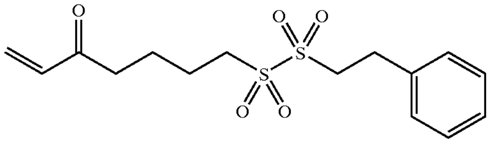
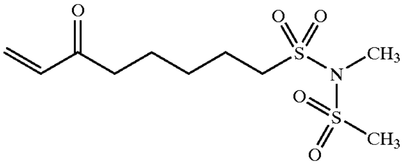
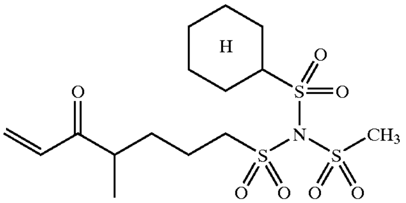
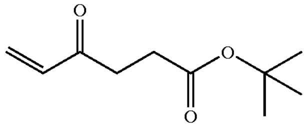
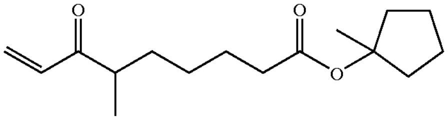
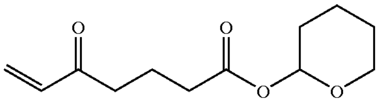
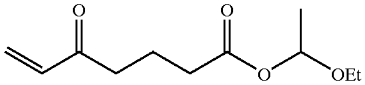
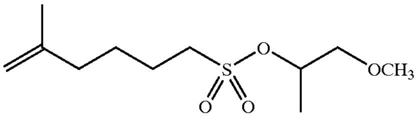
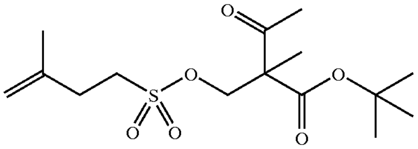
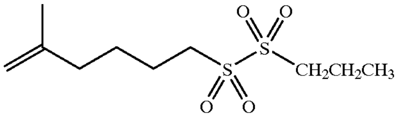
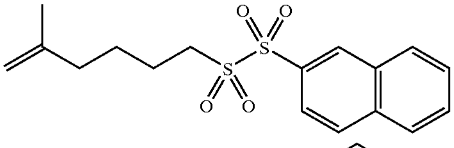
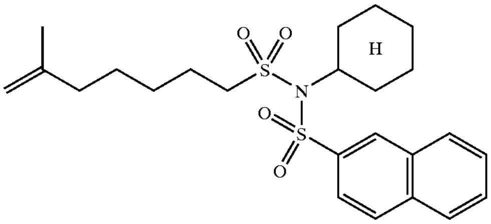
-continued
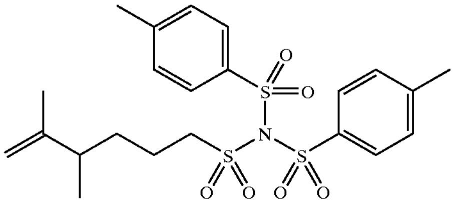
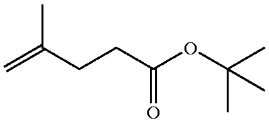
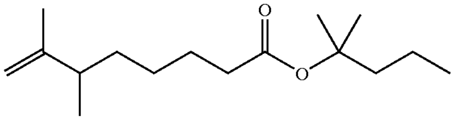
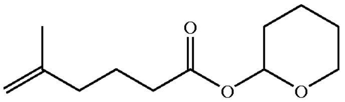
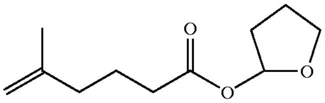
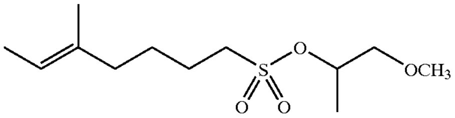
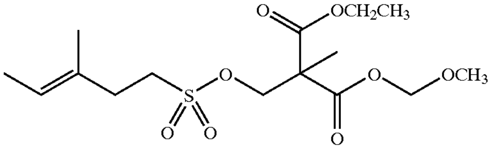
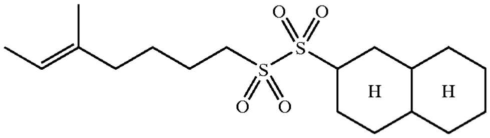
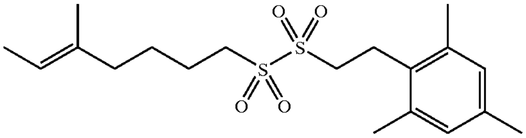
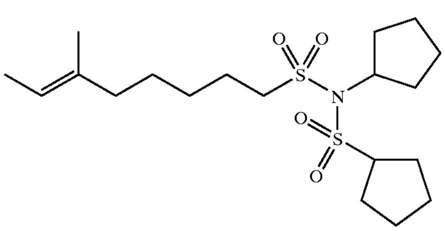
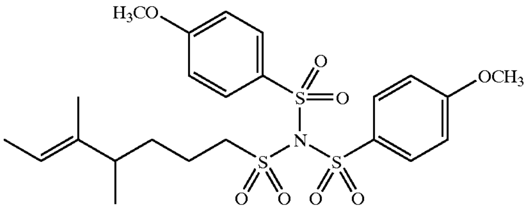

-continued
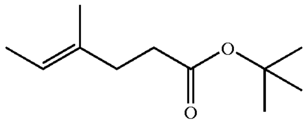
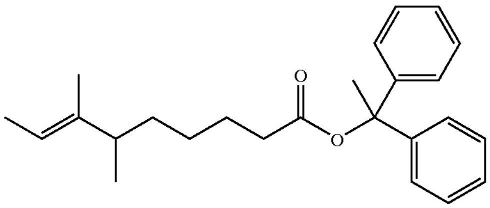
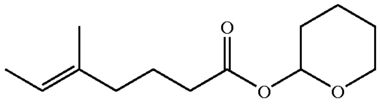
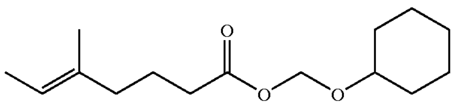
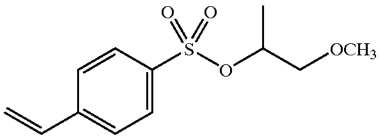
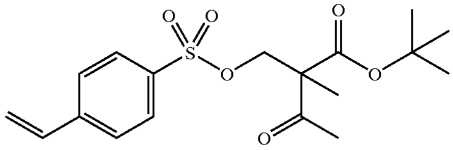
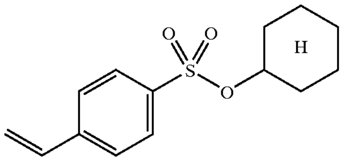
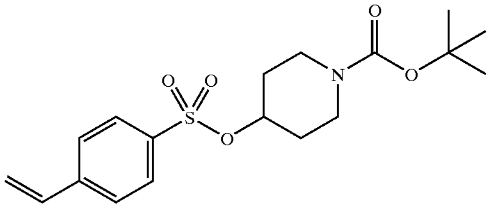
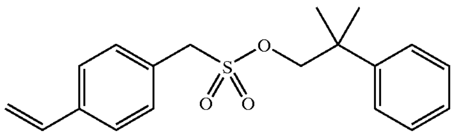
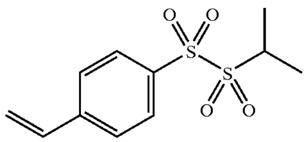
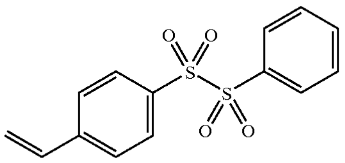
-continued
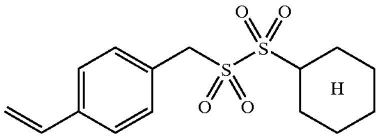
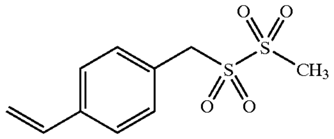
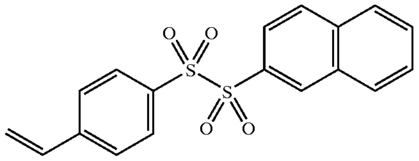
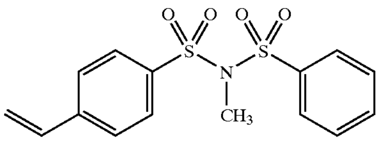
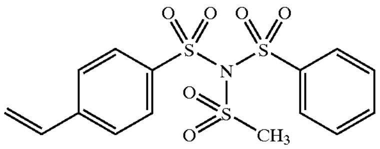
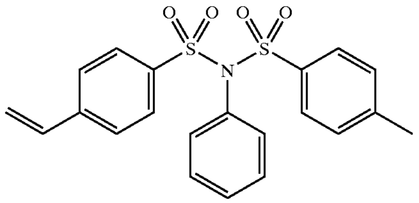
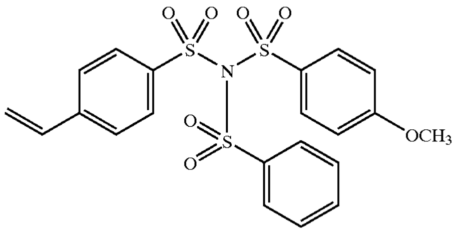
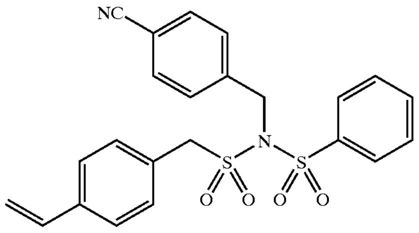
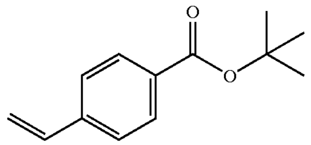
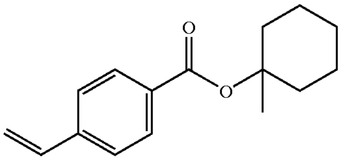

-continued

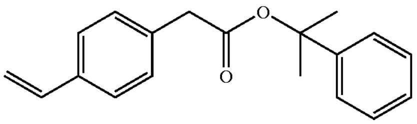

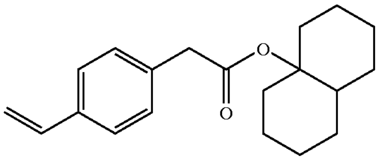

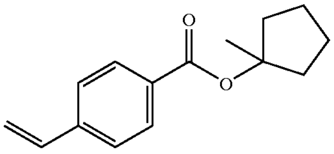

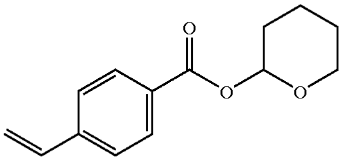

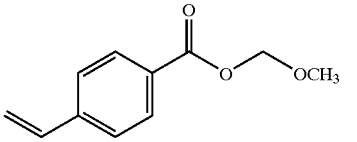

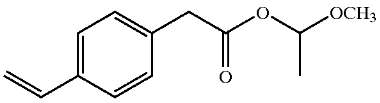

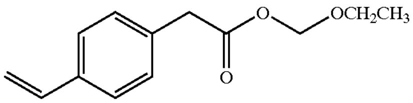

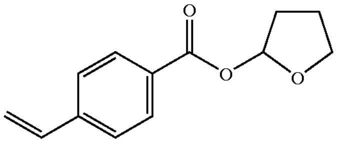

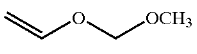

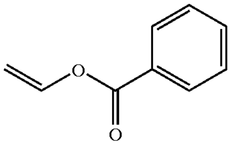

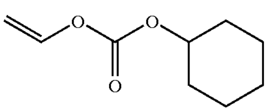

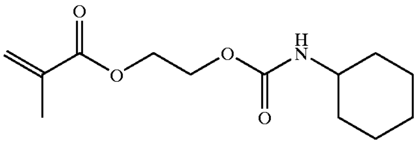

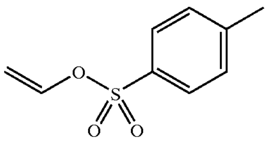

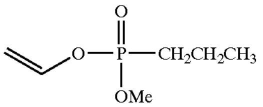

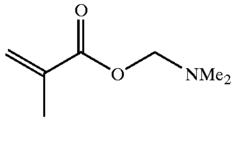

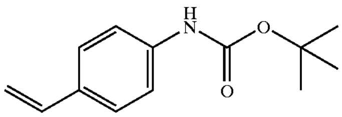

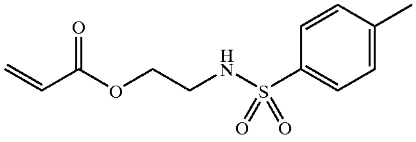

-continued

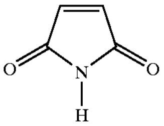

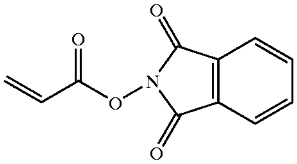

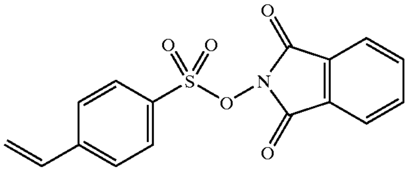

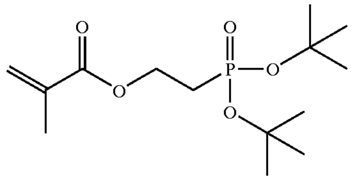

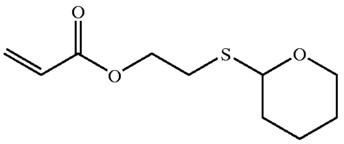

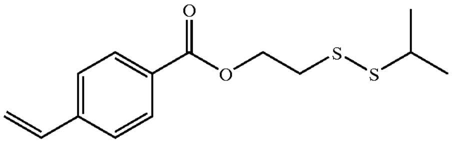

The positive type polarity converting high molecular weight compounds for use in the present invention are not particularly restricted so long as they have a hydrophobic functional group which is converted into hydrophilic by heat at least at a part of the side chain, and the compounds may have a functional group besides a hydrophobic functional group converted into hydrophilic by heat at the side chain. Consequently, a copolymer with a monomer having a functional group besides a hydrophobic functional group converted into hydrophilic by heat can be preferably used in the present invention so long as the copolymer does not inhibit the effect of the present invention. The following monomers can be exemplified as the radical polymerizable monomers having such a side chain.

As other radical polymerizable monomers which can be used for the synthesis of the copolymers, the following well-known monomers can be exemplified, e.g., acrylic acid, acrylates, acrylamides, methacrylic acid, methacrylates, methacrylamides, maleic acid, maleic anhydride, maleates, maleic acid amides, maleic acid imides, itaconic acid, itaconic anhydride, itaconates, itaconic acid amides, itaconic acid imides, crotonic acid, crotonates, crotonic acid amides, fumaric acid, fumarates, fumaric acid amides, mesaconic acid, mesaconates, mesaconic acid amides, α,β-unsaturated lactones, α,β-unsaturated lactams, unsaturated hydrocarbons, vinyl ethers, vinyl esters, α,β-unsaturated ketones, styrenes, etc.

Specific examples of acrylates include methyl acrylate, ethyl acrylate, (n- or i-)propyl acrylate, (n-, i-, sec- or t-)butyl acrylate, pentyl acrylate, hexyl acrylate, heptyl acrylate, octyl acrylate, nonyl acrylate, decyl acrylate, amyl acrylate, 2-ethylhexyl acrylate, dodecyl acrylate, chloroethyl acrylate, 2-hydroxyethyl acrylate, 2-hydroxypropyl acrylate, 5-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenylcarbonyloxy)ethyl acrylate.

Specific examples of acrylamides include acrylamide, N-methylacrylamide, N-ethylacrylamide, N-(n- or i-)propylacrylamide, N-(n-, i-, sec- or t-)acrylamide, N-benzylacrylamide, N-hydroxyethylacrylamide, N-phenylacrylamide, N-tolylacrylamide, N-(hydroxyphenyl)acrylamide, N-(sulfamoylphenyl) acrylamide, N-(phenylsulfonyl)acrylamide, N-(tolylsulfonyl)acrylamide, N,N-dimethylacrylamide, N-methyl-N-phenylacrylamide, and N-hydroxyethyl-N-methylacrylamide.

Specific examples of methacrylates include methyl methacrylate, ethyl methacrylate, (n- or i-)propyl methacrylate, (n-, i-, sec- or t-)butyl methacrylate, pentyl methacrylate, hexyl methacrylate, heptyl methacrylate, octyl methacrylate, nonyl methacrylate, decyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 5-hydroxypentyl methacrylate, cyclohexyl methacrylate, allyl methacrylate, trimethylolpropane monomethacrylate, pentaerythritol monomethacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, and 2-(hydroxyphenylcarbonyloxy)ethyl methacrylate.

Specific examples of methacrylamides include methacrylamide, N-methylmethacrylamide, N-ethylmethacrylamide, N-(n- or i-)propylmethacrylamide, N-(n-, i-, sec- or t-)methacrylamide, N-benzylmethacrylamide, N-hydroxyethylmethacrylamide, N-phenylmethacrylamide, N-tolylmethacrylamide, N-(hydroxyphenyl)methacrylamide, N-(sulfamoylphenyl) methacrylamide, N-(phenylsulfonyl)methacrylamide, N-(tolylsulfonyl)methacrylamide, N,N-dimethylmethacrylamide, N-methyl-N-phenylmethacrylamide, and N-hydroxyethyl-N-methylmethacrylamide.

Specific examples of crotonates include methyl crotonate, ethyl crotonate, (n- or i-)propyl crotonate, (n-, i-, sec- or t-)butyl crotonate, pentyl crotonate, hexyl crotonate, heptyl crotonate, octyl crotonate, nonyl crotonate, decyl crotonate, amyl crotonate, 2-ethylhexyl crotonate, dodecyl crotonate, chloroethyl crotonate, 2-hydroxyethyl crotonate, 2-hydroxypropyl crotonate, 5-hydroxypentyl crotonate, cyclohexyl crotonate, allyl crotonate, trimethylolpropane monocrotonate, pentaerythritol monocrotonate, benzyl crotonate, methoxybenzyl crotonate, chlorobenzyl crotonate, hydroxybenzyl crotonate, hydroxyphenethyl crotonate, dihydroxyphenethyl crotonate, furfuryl crotonate, tetrahydrofurfuryl crotonate, phenyl crotonate, hydroxyphenyl crotonate, chlorophenyl crotonate, sulfamoylphenyl crotonate, and 2-(hydroxyphenylcarbonyloxy)ethyl crotonate.

Specific examples of crotonic acid amides include crotonic acid amide, N-methylcrotonic acid amide, N-ethylcrotonic acid amide, N-(n- or i-)propylcrotonic acid amide, N-(n-, i-, sec- or t-)crotonic acid amide, N-benzylcrotonic acid amide, N-hydroxyethylcrotonic acid amide, N-phenylcrotonic acid amide, N-tolylcrotonic acid amide, N-(hydroxyphenyl)crotonic acid amide, N-(sulfamoylphenyl)crotonic acid amide, N-(phenylsulfonyl)crotonic acid amide, N-(tolylsulfonyl) crotonic acid amide, N,N-dimethylcrotonic acid amide, N-methyl-N-phenylcrotonic acid amide, and N-hydroxyethyl-N-methylcrotonic acid amide.

Specific examples of maleates include dimethyl maleate, diethyl maleate, di(n- or i-)propyl maleate, di(n-, i-, sec- or t-)butyl maleate, diphenyl maleate, diallyl maleate, monomethyl maleate, monoethyl maleate, mono(n- or i-)propyl maleate, mono(n-, i-, sec- or t-)butyl maleate, dibenzyl maleate, monobenzyl maleate, methylethyl maleate, methylpropyl maleate, and ethylpropyl maleate.

Specific examples of maleic acid amides include maleic acid amide, N-methylmaleic acid amide, N-ethylmaleic acid amide, N-(n- or i-)propylmaleic acid amide, N-(n-, i-, sec- or t-)butylmaleic acid amide, N-benzylmaleic acid amide, N-hydroxyethylmaleic acid amide, N-phenylmaleic acid amide, N-tolylmaleic acid amide, N-(hydroxyphenyl)maleic acid amide, N-(sulfamoylphenyl)maleic acid amide, N-(phenylsulfonyl)-maleic acid amide, N-(tolylsulfonyl) maleic acid amide, N,N-dimethylmaleic acid amide, N-methyl-N-phenylmaleic acid amide, N-hydroxyethyl-N-methylmaleic acid amide, N-methylmaleic acid monoamide, N-ethylmaleic acid monoamide, N,N-dimethylmaleic acid monoamide, N-methyl-N'-ethylmaleic acid amide, and N-methyl-N'-phenylmaleic acid amide.

Specific examples of maleic acid imides include maleic acid imide, N-methylmaleic acid imide, N-ethylmaleic acid imide, N-(n- or i-)propylmaleic acid imide, N-(n-, i-, sec- or t-)butylmaleic acid imide, N-benzylmaleic acid imide, N-hydroxyethylmaleic acid imide, N-phenylmaleic acid imide, N-tolylmaleic acid imide, N-(hydroxyphenyl)maleic acid imide, N-(sulfamoylphenyl)maleic acid imide, N-(phenylsulfonyl)-maleic acid imide, and N-(tolylsulfonyl) maleic acid imide.

Specific examples of itaconates include dimethyl itaconate, diethyl itaconate, di(n- or i-)propyl itaconate, di(n-, i-, sec- or t-)butyl itaconate, diphenyl itaconate, diallyl itaconate, monomethyl itaconate, monoethyl itaconate, mono(n- or i-)propyl itaconate, mono(n-, i-, sec- or t-)butyl itaconate, dibenzyl itaconate, and ethylpropyl itaconate.

Specific examples of itaconic acid amides include itaconic acid amide, N-methylitaconic acid amide, N-ethyl-itaconic acid amide, N-(n- or i-)propylitaconic acid amide, N-(n-, i-, sec- or t-)butylitaconic acid amide, N-benzyl-itaconic acid amide, N-hydroxyethylitaconic acid amide, N-phenylitaconic acid amide, N-tolylitaconic acid amide, N-(hydroxyphenyl)itaconic acid amide, N-(sulfamoylphenyl)-itaconic acid amide, N-(phenylsulfonyl)itaconic acid amide, N-(tolylsulfonyl) itaconic acid amide, N,N-dimethylitaconic acid amide, N-methyl-N-phenylitaconic acid amide, N-hydroxyethyl-N-methylitaconic acid amide, N-methylitaconic acid monoamide, N-ethylitaconic acid monoamide, N,N-dimethylitaconic acid monoamide, N-methyl-N'-ethylitaconic acid amide, and N-methyl-N'-phenylitaconic acid amide.

Specific examples of itaconic acid imides include itaconic acid imide, N-methylitaconic acid imide, N-ethylitaconic acid imide, N-(n- or i-)propylitaconic acid imide, N-(n-, i-, sec- or t-)butylitaconic acid imide, N-benzylitaconic acid imide, N-hydroxyethylitaconic acid imide, N-phenylitaconic acid imide, N-tolylitaconic acid imide, N-(hydroxyphenyl)itaconic acid imide, N-(sulfamoylphenyl)itaconic acid imide, N-(phenylsulfonyl)itaconic acid imide, and N-(tolylsulfonyl)itaconic acid imide.

Specific examples of fumarates include dimethyl fumarate, diethyl fumarate, di(n- or i-)propyl fumarate, di(n-, i-, sec- or t-)butyl fumarate, diphenyl fumarate, diallyl fumarate, monomethyl fumarate, monoethyl fumarate, mono(n- or i-)propyl fumarate, mono(n-, i-, sec- or t-)butyl fumarate, dibenzyl fumarate, monobenzyl fumarate, methylethyl fumarate, methylpropyl fumarate, and ethylpropyl fumarate.

Specific examples of fumaric acid amides include fumaric acid amide, N-methylfumaric acid amide, N-ethylfumaric acid amide, N-(n- or i-)propylfumaric acid amide, N-(n-, i-, sec- or t-)butylfumaric acid amide, N-benzylfumaric acid amide, N-hydroxyethylfumaric acid amide, N-phenylfumaric acid amide, N-tolylfumaric acid amide, N-(hydroxyphenyl)fumaric acid amide, N-(sulfamoylphenyl)fumaric acid amide, N-(phenylsulfonyl)fumaric acid amide, N-(tolylsulfonyl) fumaric acid amide, N,N-dimethylfumaric acid amide, N-methyl-N-phenylfumaric acid amide, N-hydroxyethyl-N-methylfumaric acid amide, N-methylfumaric acid monoamide, N-ethylfumaric acid monoamide, N,N-dimethylfumaric acid monoamide, N-methyl-N'-ethylfumaric acid amide, and N-methyl-N'-phenylfumaric acid amide.

Specific examples of mesaconates include dimethyl mesaconate, diethyl mesaconate, di(n- or i-)propyl mesaconate, di(n-, i-, sec- or t-)butyl mesaconate, diphenyl mesaconate, diallyl mesaconate, monomethyl mesaconate, monoethyl mesaconate, mono(n- or i-)propyl mesaconate, mono(n-, i-, sec- or t-)butyl mesaconate, dibenzyl mesaconate, monobenzyl mesaconate, methylethyl mesaconate, methylpropyl mesaconate, and ethylpropyl mesaconate.

Specific examples of mesaconic acid amides include mesaconic acid amide, N-methylmesaconic acid amide, N-ethylmesaconic acid amide, N-(n- or i-)propylmesaconic acid amide, N-(n-, i-, sec- or t-)butylmesaconic acid amide, N-benzylmesaconic acid amide, N-hydroxyethylmesaconic acid amide, N-phenylmesaconic acid amide, N-tolylmesaconic acid amide, N-(hydroxyphenyl) mesaconic acid amide, N-(sulfamoylphenyl)-mesaconic acid amide, N-(phenylsulfonyl)mesaconic acid amide, N-(tolylsulfonyl)mesaconic acid amide, N,N-dimethylmesaconic acid amide, N-methyl-N-phenylmesaconic acid amide, N-hydroxyethyl-N-methylmesaconic acid amide, N-methylmesaconic acid monoamide, N-ethylmesaconic acid monoamide, N,N-dimethylmesaconic acid monoamide, N-methyl-N'-ethylmesaconic acid amide, and N-methyl-N'-phenylmesaconic acid amide.

Specific examples of styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, carboxystyrene, and sodium 4-vinylbenzenesulfonate.

As the specific examples of α,β-unsaturated lactones, the following compounds can be exemplified.

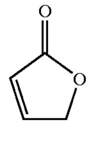
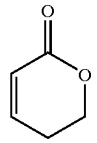
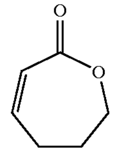

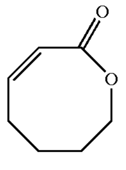
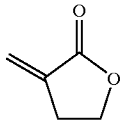
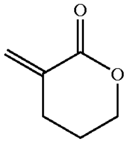

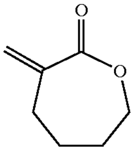
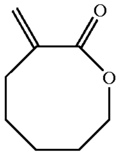
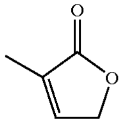

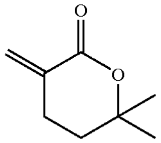
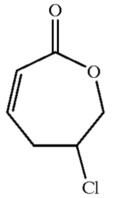
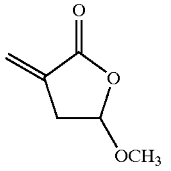

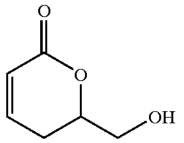
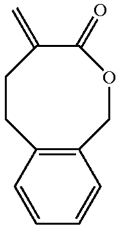

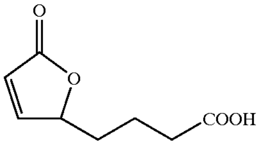
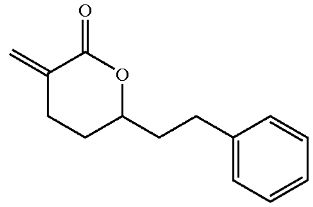

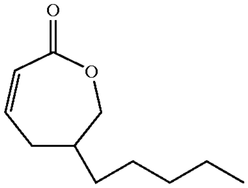
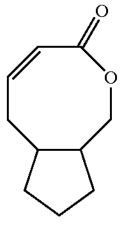

As the specific examples of α,β-unsaturated lactams, the following compounds can be exemplified.

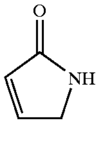
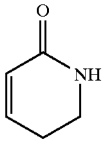
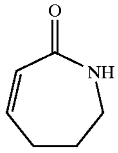

-continued

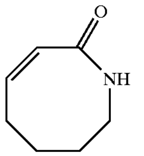 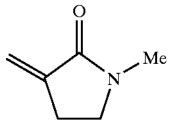 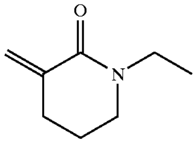

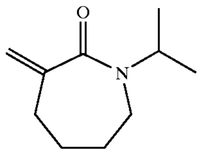 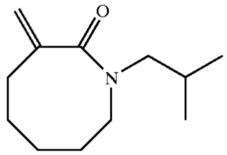

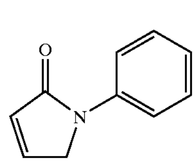 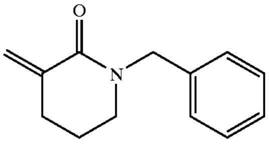

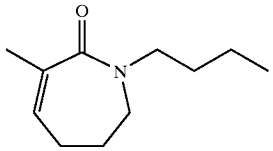 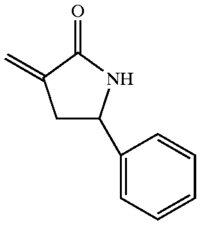

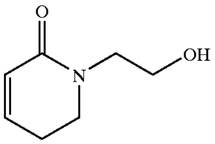 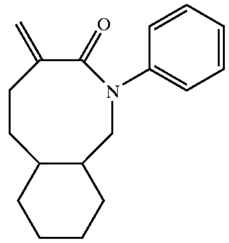

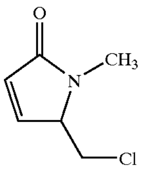 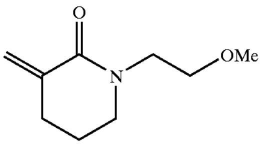

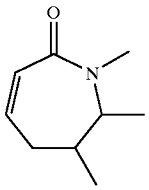 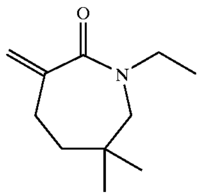

-continued

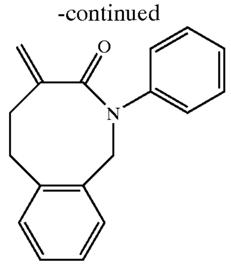

As the specific examples of unsaturated hydrocarbons, the foregoing compounds can be exemplified. As the specific examples of vinyl ethers, the foregoing compounds can be exemplified. As the specific examples of vinyl esters, the foregoing compounds can be exemplified.

As the specific examples of α,β-unsaturated ketones, the foregoing compounds can be exemplified.

The proportion of the monomer having a hydrophobic functional group converted into hydrophilic by heat which is used for synthesizing the positive type polarity converting high molecular weight compound for use in the present inven□tion is preferably 5 wt % or more, more preferably from 10 to 95 wt %. When the proportion of such a monomer is less than 5 wt %, the positive type polarity converting high molecular weight compound is not converted into hydrophilic even if the hydrophobic functional group of the side chain is converted into hydrophilic, as a result, staining occurs in the non-image area. Further, when other monomers as described above are used in the synthesis of the positive type polarity converting high molecular weight compound for use in the present invention, the proportion of copolymerizable other monomers is not particularly limited so long as monomers having specific functional groups as described above are used in a preferred amount. These copolymerizable other monomers may be used alone or two or more of them may be used as mixture.

Specific examples of the positive type polarity converting high molecular weight compounds for use in the present invention are shown below, but the present invention is not limited thereto.

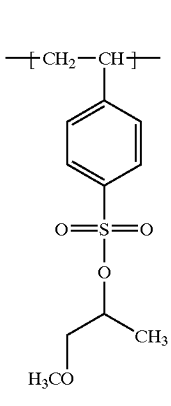 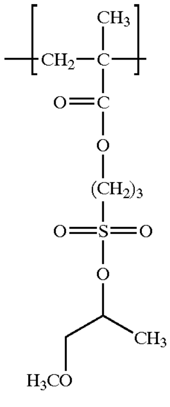 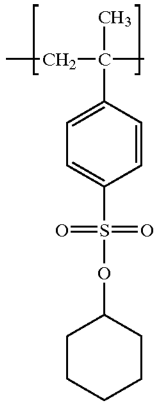

-continued
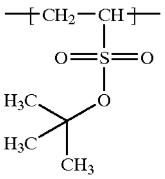
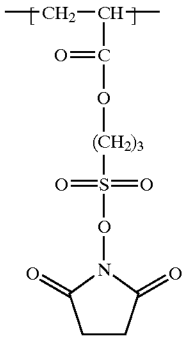
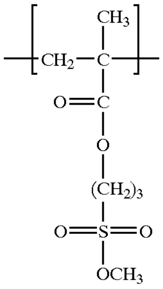
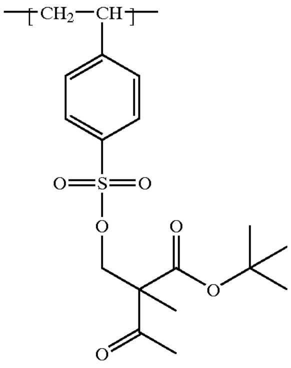
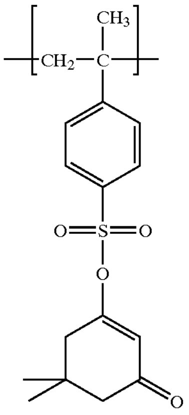
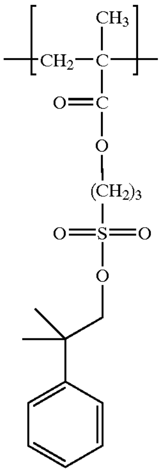
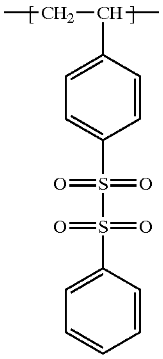
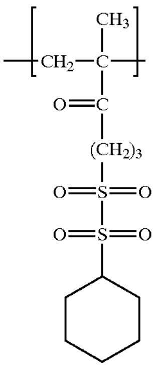
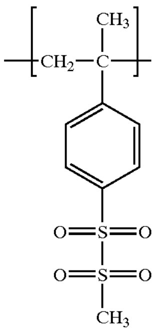
-continued
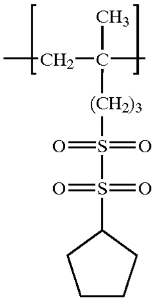
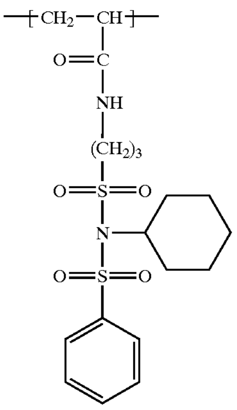
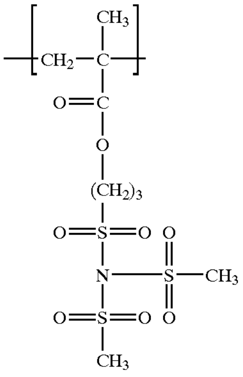
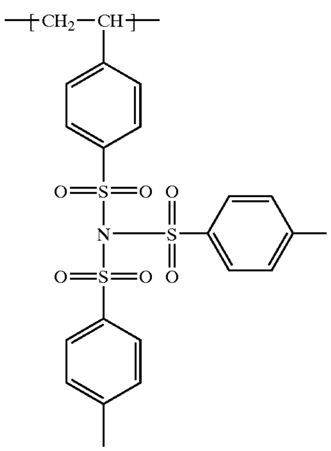
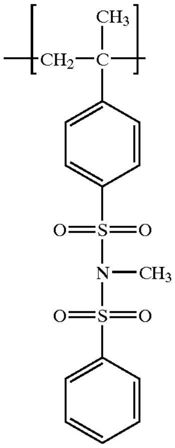
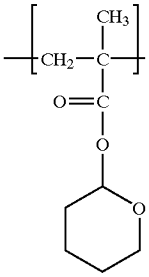
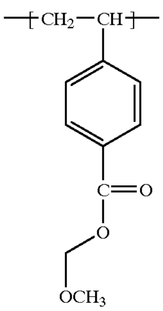
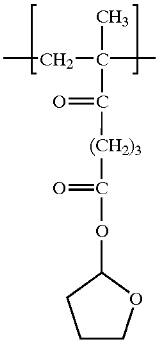
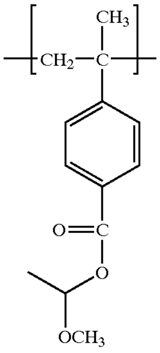

-continued

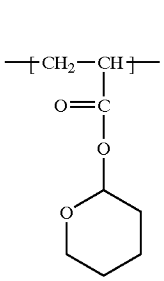

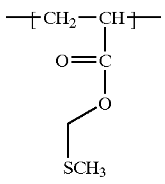

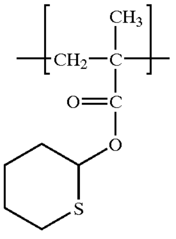

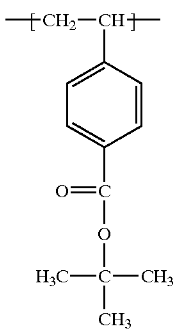

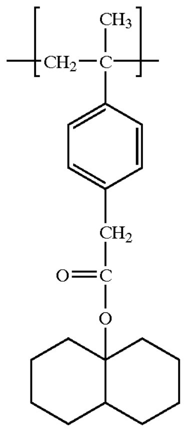

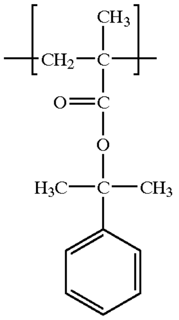

The positive type polarity converting high molecular weight compounds for use in the lithographic printing plate precursor of the present invention preferably have a weight average molecular weight measured by GPC of preferably 2,000 or more, more preferably from 5,000 to 300,000, and a number average molecular weight of preferably 800 or more, more preferably from 1,000 to 250,000. The degree of polydispersion (a weight average molecular weight/a number average molecular weight) of the high molecular weight compounds is preferably 1 or more, more preferably from 1.1 to 10.

These positive type polarity converting high molecular weight compounds may be any of a random polymer, a block polymer and a graft polymer but a random polymer is preferred.

As the solvents which are used for synthesizing the positive type polarity converting high molecular weight compound of the present invention, tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, ethyl lactate, methyl lactate, dimethyl sulfoxide, and water can be exemplified. These solvents may be used alone or two or more of them may be used as mixture.

Well-known compounds such as azo-based initiators and peroxide initiators can be used as the radical polymerization initiator for use in the synthesis of the positive type polarity converting high molecular weight compound for use in the present invention.

When the positive type polarity converting high molecular weight compound is contained in a positive type polarity converting high molecular weight compound-containing layer, the positive type polarity converting high molecular weight compound may be used alone or two or more of these compounds may be used as mixture.

The proportion of the positive type polarity converting high molecular weight compound contained in a positive type polarity converting high molecular weight compound-containing layer is preferably 40 wt % or more, more preferably 50 wt % or more. When the content is less than 40 wt %, the image strength becomes weak and the press life is deteriorated.

In the next place, the constitutional components other than the positive type polarity converting high molecular weight compound which can be contained in a layer containing a positive type polarity converting high molecular weight compound are described below.

Light/Heat Converting Agent

The light/heat converting agents described above can be preferably used as the light/heat converting agents which are added to the ink-receptive layer (layer B) containing a positive type polarity converting high molecular weight compound for use in the present invention.

Acid Generating Agent

The acid generating agents described later can be preferably used as the acid generating agents which are added to an ink-receptive layer containing a positive type polarity converting high molecular weight compound for use in the present invention.

Sensitizing Dye

The sensitizing dyes described later can be preferably used as the sensitizing dyes which are added to an ink-receptive layer containing a positive type polarity converting high molecular weight compound for use in the present invention.

Surfactant

The surfactants described later can be preferably used as the surfactants which are added to an ink-receptive layer containing a positive type polarity converting high molecular weight compound for use in the present invention.

Other Constitutional Components

Various kinds of additives can further be added to an ink-receptive layer containing a positive type polarity converting high molecular weight compound for use in the present invention, if necessary. For example, since onium salts, aromatic sulfone compounds and aromatic sulfonate compounds work as heat decomposable substances, these substances are preferably used for improving the dissolution inhibiting property of an image area in a developing solution.

A diazonium salt, an ammonium salt, a phosphonium salt, an iodonium salt, a sulfonium salt, a selenonium salt, and an arsonium salt can be exemplified as onium salts. Preferred examples of onium salts for use in the present invention include, e.g., the diazonium salts described in S.I. Schlesinger, *Photogr. Sci. Eng.,* 1B, 387 (1974), T. S. Bal et al., *Polymer,* 21, 423 (1980), and JP-A-5-158230; the ammonium salts described in U.S. Pat. Nos. 4,069,055, 4,069,056, and JP-A-3-140140; the phosphonium salts described in D. C. Necker et al., *Macromolecules,* 17, 2468 (1984), C. S. Wen et al., *Teh, Proc. Conf. Rad. Curing ASIA*, p. 478, Tokyo, Oct. (1988), and U.S. Pat. Nos. 4,069,055, 4,069,056; the iodonium salts described in J. V. Crivelloetal., *Macromolecules,* 10 (6), 1307 (1977), *Chem. & Eng. News*, Nov. 28, p. 31 (1988), EP 104143, U.S. Pat. Nos. 339,049, 410,201, and JP-A-2-150848, JP-A-2-296514; the sulfonium salts described in J. V. Crivello et al., *Polymer J,* 17, 73 (1985), J. V. Crivello et al., *J. Org. Chem.,* 43, 3055 (1978), W. R. Watt et al., *J. Polymer Sci.*, "Polymer Chem. Ed.", 22, 1789 (1984), J. V. Crivello et al., *Polymer Bull.,* 14, 279 (1985), J. V. Crivello et al., *Macromolecules,* 14 (5), 1141 (1981), J. V. Crivello et al., *J. Polymer Sci.*, "Polymer Chem. Ed.", 17, 2877 (1979), EP370693, EP233567, EP297443, EP297442, U.S. Pat. Nos. 4,933,377, 3,902,114, 410,201, 339,049, 4,760,013, 4,734,444, 2,833,827, and German Patents 293,804,626, 3,604,580, 3,604,581; the selenonium salts described in J. V. Crivello et al., *Macromolecules,* 10 (6), 1307 (1977), and J. V. Crivello et al., *J. Polymer Sci.*, "Polymer Chemich.", 17, 1047 (1979); and the arsonium salts described in C. S. Wen et al., *Teh, Proc. Conf. Rad. Curing ASIA*, p. 478, Tokyo, Oct. (1988).

As counter ions of onium salts, tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid, and paratoluenesulfonic acid can be exemplified. Of these, aromatic alkylsulfonic acid such as hexafluorophosphoric acid, triisopropylnaphthalenesulfonic acid, and 2,5-dimethylbenzenesulfonic acid are preferably used.

The addition amount of onium salt additives is preferably from 1 to 50 wt %, more preferably from 5 to 30 wt %, and especially preferably from 10 to 30 wt %. Additives and binders are preferably added to the same layer in the present invention.

For further improving sensitivity, cyclic acid anhydrides, phenols and organic acids can be used in combination. Examples of cyclic acid anhydrides include, as disclosed in U.S. Pat. No. 4,115,128, phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride and pyromellitic anhydride. Examples of phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane.

Further, examples of organic acids include, which are disclosed in JP-A-60-88942 and JP-A-2-96755, sulfonic acids, sulfinic acids, alkylsulfuric acids, phosphonic acids, phosphates, and carboxylic acids, specifically, p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid can be exemplified.

The content of the above cyclic acid anhydrides, phenols and organic acids in the ink-receptive layer is preferably from 0.05 to 20 wt %, more preferably from 0.1 to 15 wt %, and particularly preferably from 0.1 to 10 wt %.

Printing out agents for obtaining a visible image immediately after exposure and dyes and pigments as image-coloring agents can be added to the ink-receptive layer containing the positive type polarity converting high molecular weight compound for use in the present invention.

As the printing out agent, combinations of the compounds which release an acid upon heating by exposure (light-acid releasing agents) with organic dyes which can form a salt can be exemplified as representatives. Specifically, the combinations of o-naphthoquinonediazide-4-sulfonic acid halogenide with salt-forming organic dyes disclosed in JP-A-50-36209 and JP-A-53-8128, and the combinations of trihalomethyl compounds with salt-forming organic dyes disclosed in JP-A-53-36223, JP-A-54-74728, JP-A-60-3626, JP-A-61-143748, JP-A-61-151644 and JP-A-63-58440 can be exemplified. As such trihalomethyl compounds, there are oxazole compounds and triazine compounds and they are both excellent in aging stability and clear printing out image can be obtained.

As the image-coloring agents, other dyes can be used besides the above-described salt-forming organic dyes. Oil-soluble dyes and basic dyes can be exemplified as appropriate dyes including the salt-forming organic dyes. Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), and Methylene Blue (C.I. 52015) can be exemplified. Further, the dyes disclosed in JP-A-62-293247 are particularly preferably used. These dyes can be added to the ink-receptive layer in an amount of from 0.01 to 10 wt %, preferably from 0.1 to 3 wt %, based on the entire solid contents of the image-forming material.

Moreover, plasticizers can be added to the ink-receptive layer for improving the flexibility of the coating film, e.g., butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid can be used.

In addition to these compounds, epoxy compounds, vinyl ethers, the phenol compounds having a hydroxymethyl group and the phenol compounds having an alkoxymethyl group as disclosed in JP-A-8-276558, and the crosslinking agent for enhancing dissolution inhibition disclosed in Japanese Patent Application No. 9-328937 applied by the present inventors can be arbitrarily added to the ink-receptive layer according to purposes.

Layer Containing Resin Soluble in Alkali Aqueous Solution

"A layer containing a resin soluble in an alkali aqueous solution" for use in the lithographic printing plate precursor according to the present invention means a layer which contains at least a resin soluble in an alkali aqueous solution as described below.

Resin Soluble in Alkali Aqueous Solution

An alkali aqueous solution-soluble high molecular weight compound (b) for use in the present invention is a compound having acid radical structure as shown below at the main chain or side chain of the compound:

A phenolic hydroxyl group (—Ar—OH), a carboxylic acid group (—$CO_2H$), a sulfonic acid group (—$SO_3H$), a phosphoric acid group (—$OPO_3H$), a sulfonamido group (—$SO_2NH$—R—), a substituted sulfonamido-based group (an active imido group) (—$SO_2NHCOR$, —$SO_2NHSO_2R$, —$CONHSO_2R$), wherein Ar represents a divalent aryl group which may have a substituent, and R represents a hydrocarbon group which may have a substituent.

Of these, preferred acid radicals are (b-1) a phenolic hydroxyl group, (b-2) a sulfonamido group, and (b-3) an active imido group, and an alkali aqueous solution-soluble resin having (b-1) a phenolic hydroxyl group (hereinafter referred to as "a resin having a phenolic hydroxyl group") can be most preferably used.

As the high molecular weight compounds having (b-1) a phenolic hydroxyl group, novolak resins, e.g., a condensed polymer of phenol and formaldehyde (hereinafter referred to as "a phenol/formaldehyde resin"), a condensed polymer of m-cresol and formaldehyde (hereinafter referred to as "an m-cresol/formaldehyde resin"), a condensed polymer of p-cresol and formaldehyde, a condensed polymer of m-/p-mixed cresol and formaldehyde, and a condensed polymer of phenol, cresol (m-, p-, or m-/p- mixed) and formaldehyde, and a condensed polymer of pyrogallol and acetone can be exemplified. Further, copolymers obtained by copolymerizing monomers having a phenol group at the side chain can also be used. As such monomers having a phenol group, acrylamide, methacrylamide, acrylic ester, methacrylic ester and hydroxystyrene each having a phenol group can be exemplified.

Specifically, N-(2-hydroxyphenyl)acrylamide, N-(3-hydroxyphenyl)acrylamide, N-(4-hydroxyphenyl) acrylamide, N-(2-hydroxyphenyl)methacrylamide, N-(3-hydroxyphenyl)-methacrylamide, N-(4-hydroxyphenyl) methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl) ethyl acrylate, 2-(4-hydroxyphenyl)ethyl acrylate, 2-(2-hydroxyphenyl)ethyl methacrylate, 2-(3-hydroxyphenyl) ethyl methacrylate, and 2-(4-hydroxyphenyl)ethyl methacrylate can be preferably used.

In view of the image-forming property, these resins preferably have a weight average molecular weight of from $5.0\times10^2$ to $2.0\times10^4$ and a number average molecular weight of from $2.0\times10^2$ to $1.0\times10^4$. These resins may be used alone or in combination of two or more. When they are used in combination, as disclosed in U.S. Pat. No. 4,123,279, a condensed polymer of phenol and formaldehyde having an alkyl group having from 3 to 8 carbon atoms as a substituent, e.g., a condensed polymer of t-butylphenol and formaldehyde, a condensed polymer of octylphenol and formaldehyde can be used in combination.

These resins having a phenolic hydroxyl group have a weight average molecular weight of from 500 to 20,000 and a number average molecular weight of from 200 to 10,000.

In the case of an alkali aqueous solution-soluble high molecular weight compound having (b-2) a sulfonamido group, a high molecular weight compound which can be obtained by homopolymerizing polymerizable a monomer having (b-2) a sulfonamido group which is a primary monomer constituting this high molecular weight compound, and a high molecular weight compound which can be obtained by copolymerizing the above monomer with other polymerizable monomer can be exemplified. As the polymerizable monomer having a sulfonamido group, monomers comprising low molecular weight compounds having, in one molecule, one or more of a sulfonamido group $—NH—SO_2—$in which at least one hydrogen atom is bonded to the nitrogen atom, and a polymerizable unsaturated bond respectively can be exemplified. Of these monomers, low molecular weight compounds having an acryloyl group, an aryl group or a vinyloxy group, and a substituted or mono-substituted aminosulfonyl group or a substituted sulfonylimino group are preferred.

As such a compound, e.g., the compounds represented by the following formulae (6) to (10) respectively can be exemplified.

(6)

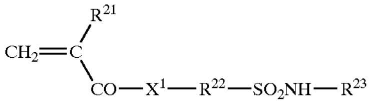

(7)

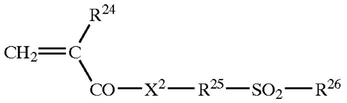

(8)

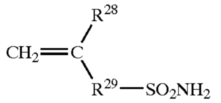

(9)

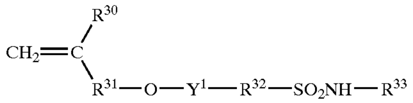

(10)

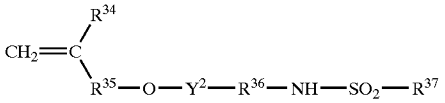

wherein $X^1$ and $X^2$ each represents ——or $—NR^{27}—$; $R^{21}$ and $R^{24}$ each represents a hydrogen atom or $—CH_3$; $R^{22}$, $R^{26}$, $R^{29}$, $R^{32}$ and $R^{36}$ each represents an alkylene group, a cycloalkylene group, an arylene group, or an aralkylene group, each of which may have a substituent and has from 1 to 12 carbon atoms; $R^{23}$, $R^{27}$and $R^{33}$ each represents a hydrogen atom, an alkyl group, a cycloalkyl group, an aryl group, or an aralkyl group, each of which may have a substituent and has from 1 to 12 carbon atoms; $R^{26}$ and $R^{27}$ each represents an alkyl group, a cycloalkyl group, an aryl group, or an aralkyl group, each of which may have a substituent and has from 1 to 12 carbon atoms; $R^{28}$, $R^{30}$ and $R^{34}$ each represents a hydrogen atom or $—CH_3$; $R^{31}$ and $R^{35}$ each represents an alkylene group, a cycloalkylene group, an arylene group, or an aralkylene group, each of which may have a single bond or a substituent and has from 1 to 12 carbon atoms; and $Y^1$ and $Y^2$ each represents a single bond or —CO—.

Specifically, m-aminosulfonylphenyl methacrylate, N-(p-aminosulfonylphenyl)methacrylamide, and N-(p-aminosulfonylphenyl)acrylamide can be preferably used as such monomers.

In the case of an alkali aqueous solution-soluble high molecular weight compound having (b-3) an active imido group, the compound has the active imido group represented by the formula shown below in the molecule. As the monomer having (b-3) an active imido group which is a primary monomer constituting this high molecular weight compound, high molecular weight compounds which can be obtained by copolymerizing monomers comprising low molecular weight compounds having, in one molecule, one or more of the imino group represented by the following formula and a polymerizable unsaturated bond respectively can be exemplified.

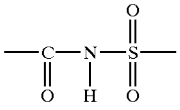

As specific examples of such compounds, N-(p-toluenesulfonyl)methacrylamide and N-(p-toluenesulfonyl) acrylamide can be preferably used.

The monomers having acid radicals (b-1), (b-2) and (b-3) in the alkali aqueous solution-soluble polymers usable in the present invention need not be one kind, and those obtained by copolymerizing two or more monomers having the same acid radical and two or more monomers having different acid radicals can be used.

Well-known copolymerization such as graft copolymerization, block copolymerization and random copolymerization can be used for copolymerization.

It is preferred that the above copolymers should contain 10 mol% or more of the monomers having acid radicals (b-1) to (b-3) as the copolymer components, more preferably 20 mol% or more. If the content of the copolymer components is less than 10 mol%, the interaction with a resin containing a phenolic hydroxyl group becomes insufficient, as a result, the improving effect of development latitude, which is the advantage of using copolymer components, becomes unsatisfactory.

Other copolymer components may be contained in the copolymers besides the monomers having acid radicals (b-1) to (b-3).

As other copolymerizable components, e.g., monomers of the following (1) to (12) can be exemplified.

(1) Acrylates and methacrylates having an aliphatic hydroxyl group,. e.g., 2-hydroxyethyl acrylate and 2-hydroxyethyl methacrylate.

(2) Alkyl acrylates, e.g., methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate.

(3) Alkyl methacrylates, e.g., methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate.

(4) Acrylamide or methacrylamide, e.g., acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, and N-ethyl-N-phenylacrylamide.

(5) Vinyl ethers, e.g., ethyl vinyl ether, 2-chloroethyl vinyl ether, hydroxyethyl vinyl ether, propyl vinyl ether, butyl vinyl ether, octyl vinyl ether, and phenyl vinyl ether.

(6) Vinyl esters, e.g., vinyl acetate, vinyl chloroacetate, vinyl butyrate, and vinyl benzoate.

(7) Styrenes, e.g., styrene, a-methylstyrene, methylstyrene, and chloromethylstyrene.

(8) Vinyl ketones, e.g., methyl vinyl ketone, ethyl vinyl ketone, propyl vinyl ketone, and phenyl vinyl ketone.

(9) Olefins, e.g., ethylene, propylene, isobutylene, butadiene, and isoprene.

(10) N-vinylpyrrolidone, N-vinylcarbazole, 4-vinylpyridine, acrylonitrile, and methacrylonitrile.

(11) Unsaturated imide, e.g., maleimide, N-acryloylacrylamide, N-acetylmethacrylamide, N-propionylmethacrylamide, and N-(p-chlorobenzoyl) methacrylamide.

(12) Unsaturated carboxylic acids, e.g., acrylic acid, methacrylic acid, maleic anhydride, and itaconic acid.

From the viewpoint of film strength, it is preferred that the alkali aqueous solution-soluble high molecular weight compounds in the present invention have a weight average molecular weight of 2,000 or more and a number average molecular weight of 500 or more, more preferably a weight average molecular weight of from 5,000 to 300,000 and a number average molecular weight of from 800 to 250,000, and degree of polydispersion (a weight average molecular weight/a number average molecular weight) of from 1.1 to 10, no matter whether it is homopolymer or copolymer.

In the above-described copolymers, the compounding ratio by weight of the monomers having acid radicals of (b-1) to (b-3) to other monomers is preferably within the range of from 50/50 to 5/95, more preferably from 40/60 to 10/90, in view of development latitude.

These alkali aqueous solution-soluble high molecular weight compounds may be used alone or may be comprised of two or more in combination, and the addition amount thereof is from 30 to 99 wt %, preferably from 40 to 95 wt %, and particularly preferably from 50 to 90 wt %, based on the entire solid contents of the ink-receptive layer. When the addition amount of the alkali-soluble high molecular weight compound is less than 30 wt %, the durability of the ink-receptive layer is deteriorated, on the other hand if it exceeds 90 wt %, the sensitivity and durability are both lowered.

In the next place, the constitutional components other than the alkali aqueous solution-soluble resin which can be contained in a layer containing an alkali aqueous solution-soluble resin are described below.

Light/Heat Converting Agent

The light/heat converting agents described above can be preferably used as the light/heat converting agents which are added to a layer containing an alkali aqueous solution-soluble resin for use in the present invention.

Surfactant

The surfactants described later can be preferably used as the surfactants which are added to a layer containing an alkali aqueous solution-soluble resin for use in the present invention.

Other Constitutional Components

As the constitutional components other than the components described above which are added to a layer containing an alkali aqueous solution-soluble resin for use in the present invention, those similar to other constitutional components contained in a layer containing a positive type polarity converting high molecular weight compound can be preferably used.

Layer Containing Negative Type Polarity Converting High Molecular Weight Compound "A layer containing a negative type polarity converting high molecular weight compound"for use in the lithographic printing plate precursor of the present invention is a layer which contains at least a negative type polarity converting high molecular weight compound described below.

Negative Type Polarity Converting High Molecular Weight Compound

A negative type polarity converting high molecular weight compound for use in the present invention is a hydrophilic high molecular weight compound which is converted into hydrophobic by heat as described above. As such a high molecular weight compound, a hydrophilic high molecular weight compound having a hydrophilic functional group which is converted into hydrophobic by heat at the side chain can be exemplified. This conversion is required to be conversion of the degree that a compound which shows the affinity such as dissolving or swelling in water at normal temperature comes not to show the affinity such as dissolving or swelling in water due to the conversion of a part of or the entire of the polarity converting functional group of the side chain when heat is applied to the compound by light/heat conversion after laser exposure.

The process that the hydrophilic functional group of a hydrophilic high molecular weight compound is converted into hydrophobic by heat is regarded to be classified into a process that an originally hydrophilic functional group of the side chain is converted into hydrophobic by the reaction by heat, and a process that an originally hydrophilic functional group of the side chain is decomposed by heat and the compound is converted into hydrophobic by losing the hydrophilic functional group.

As the former process of an originally hydrophilic functional group of the side chain converted into hydrophobic by the reaction by heat, there are a process that the hydrophilic functional group reacts with other functional group in the same polymer by heat and is converted into hydrophobic, and a process that the hydrophilic functional group reacts by heat with other compound on the outside of the polymer and is converted into hydrophobic, and functional groups may undergo the conversion into hydrophobic by these two kinds of processes in combination.

Of the above processes, a process that an originally hydrophilic functional group of the side chain is decomposed by heat and the compound is converted into hydrophobic by losing the hydrophilic functional group is preferred from the viewpoint of reactivity.

Further, it is more preferred in the present invention for the polarity converting functional group of the side chain of a polarity converting hydrophilic high molecular weight compound to be entirely converted into hydrophobic, but if the conversion occurs to a degree that a polarity converting high molecular weight compound comes not to show the affinity such as dissolving or swelling in water, the polarity converting functional group need not be entirely converted into hydrophobic.

Of these hydrophilic functional groups which are converted into hydrophobic by heat, particularly preferred functional groups are a carboxylic acid group and a carboxylate group represented by the following formulae (11) and (12) from the viewpoint of reactivity, storage stability and hydrophilic/hydrophobic discriminability.

(11)

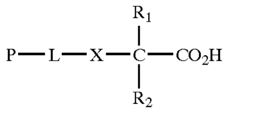

(12)

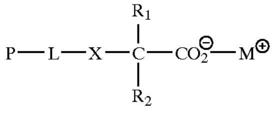

wherein X is selected from the group consisting of the elements belonging to Group IV to Group VI of the Periodic Table, the oxides thereof, the sulfides thereof, the selenides thereof and the tellurides thereof; P represents a polymer main chain; —L—represents a divalent linking group; $R_1$ and $R_2$, which may be the same or different, each represents a monovalent group; and M represents an alkali metal, an alkaline earth metal or an onium.

As the preferred example of $R_1$, and $R_2$, a straight chain, branched or cyclic alkyl group having from 1 to 20 carbon atoms can be exemplified, and specific examples of the alkyl groups include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Of these groups, a straight chain alkyl group having from 1 to 12 carbon atoms, a branched alkyl group having from 3 to 12 carbon atoms, and a cyclic alkyl group having from 5 to 10 carbon atoms are more preferred.

When $R_1$, and $R_2$ each represents a substituted alkyl group, monovalent nonmetallic atomic groups exclusive of a hydrogen atom are used as the substituents. Preferred examples of the substituents of the substituted alkyl group include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter referred to as a phosphonato group), a dialkylphosphono group (—PO3(alkyl)$_2$), a diarylphosphono group (—$PO_3$(aryl)$_2$), an alkylarylphosphono group (—$PO_3$(alkyl)(aryl)), a monoalkylphosphono group (—$PO_3$H(alkyl)) and a conjugate base group thereof (hereinafter referred to as an alkylphosphonato group), a monoarylphosphono group (—$PO_3$H(aryl)) and a conjugate base group thereof (hereinafter referred to as an arylphosphonato group), a phosphonoxy group (—$OPO_3H_2$) and a conjugate base group thereof (hereinafter referred to as a phosphonatoxy group), a dialkylphosphonoxy group (—$OPO_3$(alkyl)$_2$), a diarylphosphonoxy group (—$OPO_3$(aryl)$_2$), an alkylarylphosphonoxy group (—$OPO_3$—(alkyl)(aryl)), a monoalkylphosphonoxy group (—$OPO_3$H(alkyl)) and a conjugate base group thereof (hereinafter referred to as an alkylphosphonatoxy group), a monoarylphosphonoxy group (—$OPO_3$H(aryl)) and a conjugate base group thereof (hereinafter referred to as an arylphosphonatoxy group), a cyano group, a nitro group, an aryl group, an alkenyl group, and an alkynyl group.

As the specific examples of the alkyl groups in the substituents of the substituted alkyl groups, the above-described alkyl groups can be exemplified. As the specific examples of the aryl groups in the substituents of the substituted alkyl groups, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group can be exemplified. As the examples of the alkenyl groups in the substituents of the substituted alkyl groups, a vinyl group, a 1-propenyl group, a 1-butenyl group, a cinnamyl group, and a 2-chloro-1-ethenyl group can be exemplified, and as the examples of the alkynyl groups, an ethynyl group, a 1-propynyl group, a 1-butynyl group and a trimethylsilylethynyl group can be exemplified.

As $G^1$ in the acyl group ($G^1$CO—), a hydrogen atom and the above-described alkyl groups and aryl groups can be exemplified. Of these substituents, more preferred groups include a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group, and an alkenyl group.

On the other hand, as the alkylene group in the substituted alkyl groups, divalent organic residues obtained by removing any one hydrogen atom on the above-described alkyl groups having from 1 to 20 carbon atoms can be exemplified, preferably a straight chain alkylene group having from 1 to 12 carbon atoms, a branched alkylene group having from 3 to 12 carbon atoms, and a cyclic alkylene group having from 5 to 10 carbon atoms.

Specific examples of the preferred substituted alkyl groups obtained by combining the above substituents and alkylene groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

When $R_1$ and $R_2$ each represents an aryl group, the aryl groups include a condensed ring formed by 1 to 3 benzene rings and a condensed ring formed by a benzene ring and a 5-membered unsaturated ring, and specific examples include a phenyl group, a naphthyl group, an anthryl group, a phenanthryl group, an indenyl group, an acenaphthenyl group, and a fluorenyl group. Of these groups, a phenyl group and a naphthyl group are more preferred. Heterocyclic aryl groups are included in the aryl group besides the above carbocyclic aryl groups. As the heterocyclic aryl groups, those containing from 3 to 20 carbon atoms and from 1 to 5 hetero atoms, e.g., a pyridyl group, a furyl group, a quinolyl group condensed with a benzene ring, a benzofuryl group, a thioxanthone group, and a carbazole group are used.

When $R_1$, and $R_2$ each represents a substituted aryl group, the substituted aryl groups are those having monovalent nonmetallic atomic groups exclusive of a hydrogen atom on the ring-forming carbon atoms of the above-described aryl groups as the substituents. As preferred examples of the substituents, the above-described alkyl groups, substituted alkyl groups, and the groups described above as the examples of the substituents in the substituted alkyl groups can be exemplified. Preferred specific examples of these substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl) carbamoylphenyl group, an N-methyl-N-(sulfophenyl) carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group, and a 3-butynylphenyl group.

—X— specifically preferably represents —O—, —S—, —Se—, —$NR_3$—, —CO—, —SO—, —$SO_2$—, or —PO—. Of these, —CO—, —SO— and —$S_2$— are preferred from the viewpoint of thermal reactivity.

Preferred specific examples of $R_3$ can be selected from the specific examples of $R_1$ and $R_2$, and $R_3$ may be the same with or different from $R_1$ and $R_2$.

The polyvalent linking group comprising nonmetallic atoms represented by L is a polyvalent linking group comprising from 1 to 60 carbon atoms, from 0 to 10 nitrogen atoms, from 0 to 50 oxygen atoms, from 1 to 100 hydrogen atoms, and from 0 to 20 sulfur atoms. As more specific examples of the linking groups, those comprising the following structural units in combination can be exemplified.

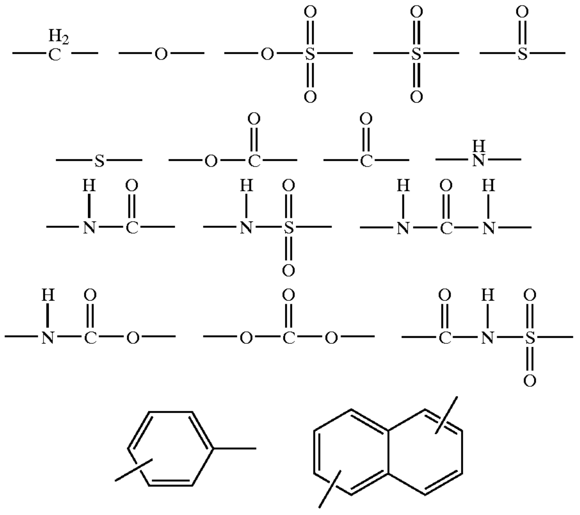

-continued

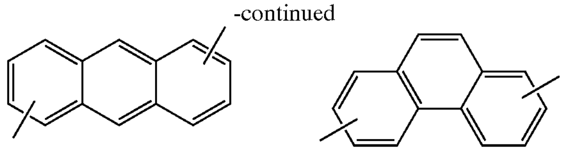

M is not particularly restricted so long as it represents a cation but it is preferably a monovalent to tetravalent metal cation or an ammonium salt represented by the following formula (13):

(13)

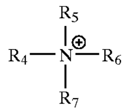

wherein $R_4$, $R_5$, $R_6$ and $R_7$, which may be the same or different, each represents a monovalent group.

The monovalent to tetravalent metal cation represented by M is selected from $Li^{30}$, $Na^{30}$, $K^{30}$, $Rb^{30}$, $Cs^{30}$, $Fr^{30}$, $Be^{2+}$, $Mg^{2+}$, $Ca^{2+}$, $Sr^{2+}$, $Ba^{2+}$, $Ra^{2+}$, $Cu^{+}$, $Cu^{2+}$, $Ag^{+}$, $Zn^{2+}$, $Al^{3+}$, $Fe^{2+}$, $Fe^{3+}$, $Co^{2+}$, $Ni^{2+}$, $Ti^{4+}$and $Zr^{4+}$, more preferably $Li^{+}$, $Na^{+}$, $K^{+}$, $Rb^{+}$, $Cs^{+}$, $Fr^{+}$, $Cu^{+}$or $Ag^{+}$.

In the ammonium ion represented by formula (13), specific examples of the groups represented by $R_4$, $R_5$, $R_6$ and $R_7$ are the same as the groups represented by $R^1$,$R^2$ and $R^3$ described above. Specific examples of the ammonium ions represented by formula (13) are shown below.

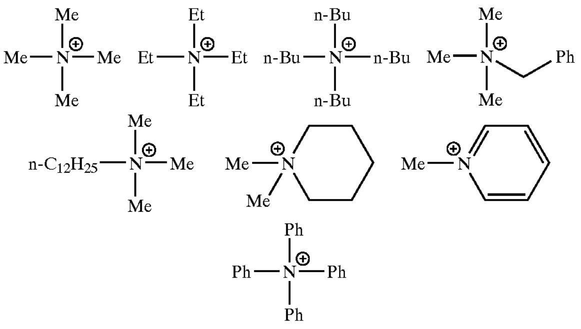

The polymer main chain represented by P is selected at least from the group consisting of the partial structural monomers represented by the formulae shown below.

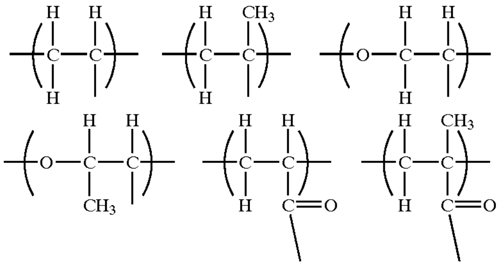

-continued

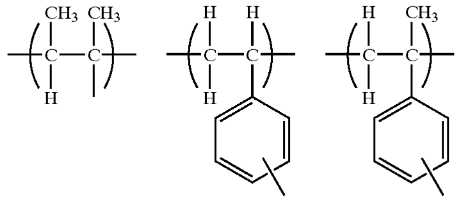

The polymer having a functional group selected from the carboxylic acid groups and the carboxylate groups according to the present invention may be a homopolymer comprised of one kind of monomer alone or may be a copolymer comprised of two or more kinds of monomers, alternatively, a copolymer with other monomers.

As such other monomers, well-known monomers, e.g., acrylates, methacrylates, acrylamides, methacrylamides, vinyl esters, styrenes, acrylic acid, methacrylic acid, acrylonitrile, maleic anhydride, and maleic acid imides can be used. These monomers can be used for improving various physical properties such as the degree of copolymerization, hydrophilicity, hydrophobicity, solubility, reactivity and stability.

Specific examples of acrylates include methyl acrylate, ethyl acrylate, (n- or i-)propyl acrylate, (n-, i-, sec- or t-)butyl acrylate, amyl acrylate, 2-ethylhexyl acrylate, dodecyl acrylate, chloroethyl acrylate, 2-hydroxyethyl acrylate, 2-hydroxypropyl acrylate, 2-hydroxypentyl acrylate, cyclohexyl acrylate, allyl acrylate, trimethylolpropane monoacrylate, pentaerythritol monoacrylate, benzyl acrylate, methoxybenzyl acrylate, chlorobenzyl acrylate, hydroxybenzyl acrylate, hydroxyphenethyl acrylate, dihydroxyphenethyl acrylate, furfuryl acrylate, tetrahydrofurfuryl acrylate, phenyl acrylate, hydroxyphenyl acrylate, chlorophenyl acrylate, sulfamoylphenyl acrylate, and 2-(hydroxyphenylcarbonyloxy)ethyl acrylate.

Specific examples of methacrylates include methyl methacrylate, ethyl methacrylate, (n- or i-)propyl methacrylate, (n-, i-, sec- or t-)butyl methacrylate, amyl methacrylate, 2-ethylhexyl methacrylate, dodecyl methacrylate, chloroethyl methacrylate, 2-hydroxyethyl methacrylate, 2-hydroxypropyl methacrylate, 2-hydroxypentyl methacrylate, cyclohexyl methacrylate, allyl methacrylate, trimethylolpropane monomethacrylate, pentaerythritol monomethacrylate, benzyl methacrylate, methoxybenzyl methacrylate, chlorobenzyl methacrylate, hydroxybenzyl methacrylate, hydroxyphenethyl methacrylate, dihydroxyphenethyl methacrylate, furfuryl methacrylate, tetrahydrofurfuryl methacrylate, phenyl methacrylate, hydroxyphenyl methacrylate, chlorophenyl methacrylate, sulfamoylphenyl methacrylate, and 2-(hydroxyphenylcarbonyloxy)ethyl methacrylate.

Specific examples of acrylamides include acrylamide, N-methylacrylamide, N-ethylacrylamide, N-propylacrylamide, N-butylacrylamide, N-benzylacrylamide, N-hydroxyethylacrylamide, N-phenylacrylamide, N-tolylacrylamide, N-(hydroxyphenyl)acrylamide, N-(sulfamoylphenyl)acrylamide, N-(phenylsulfonyl)acrylamide, N-(tolylsulfonyl) acrylamide, N,N-dimethylacrylamide, N-methyl-N-phenylacrylamide, and N-hydroxyethyl-N-methylacrylamide.

Specific examples of methacrylamides include methacrylamide, N-methylmethacrylamide, N-ethylmethacrylamide, N-propylmethacrylamide, N-butylmethacrylamide, N-benzylmethacrylamide, N-hydroxyethylmethacrylamide, N-phenylmethacrylamide, N-tolylmethacrylamide, N-(hydroxy-phenyl) methacrylamide, N-(sulfamoylphenyl)methacrylamide, N-(phenylsulfonyl)methacrylamide, N-(tolylsulfonyl) methacrylamide, N,N-dimethylmethacrylamide, N-methyl-N-phenylmethacrylamide, and N-hydroxyethyl-N-methylmethacrylamide.

Specific examples of vinyl esters include vinyl acetate, vinyl butyrate and vinyl benzoate.

Specific examples of styrenes include styrene, methylstyrene, dimethylstyrene, trimethylstyrene, ethylstyrene, propylstyrene, cyclohexylstyrene, chloromethylstyrene, trifluoromethylstyrene, ethoxymethylstyrene, acetoxymethylstyrene, methoxystyrene, dimethoxystyrene, chlorostyrene, dichlorostyrene, bromostyrene, iodostyrene, fluorostyrene, and carboxystyrene.

The content of these other monomers which are used for synthesizing the polymers for use in the present invention should be sufficient amount for improving various physical properties but the amount of carboxylic acid or the total amount of the monomer is 80 wt % or less, more preferably 50 wt % or less.

Specific examples of the polymers having any group at least selected from a carboxylic acid group or a carboxylate group which undergoes decarboxylation by heat for use in the present invention are shown below.

P-1

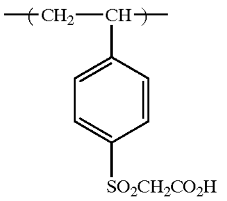

P-2

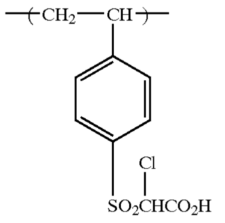

P-3

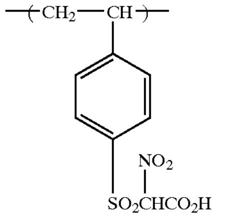

P-4

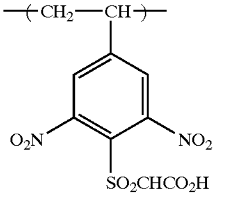

-continued
P-5
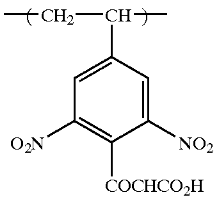
P-6
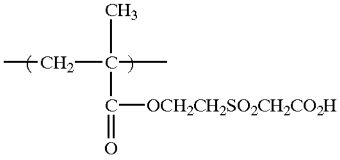
P-7
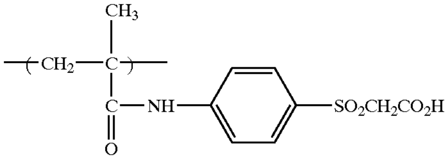
P-8
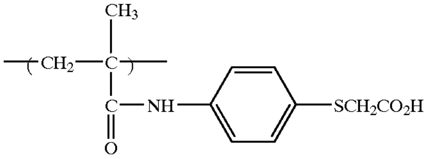
P-9
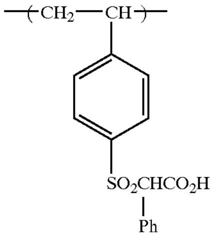
P-10
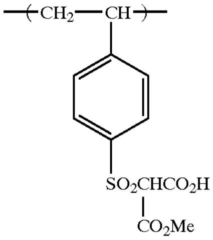
P-11
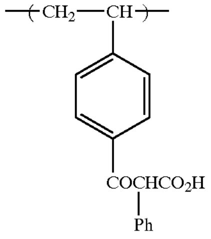
-continued
P-12
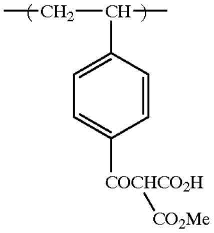
p-13
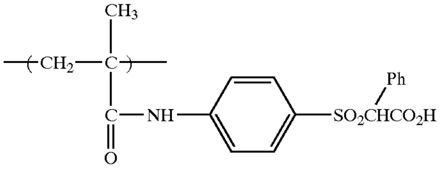
p-14
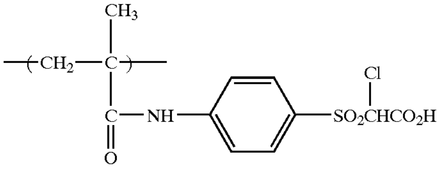
p-15
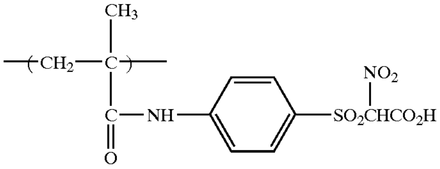
p-16
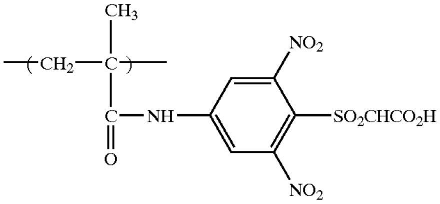
p-17
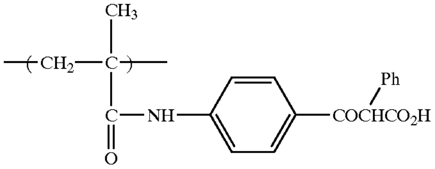
p-18
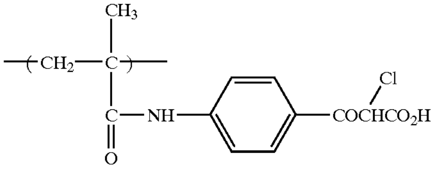
p-19
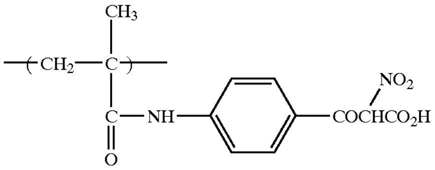

-continued
p-20
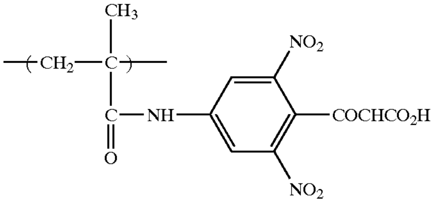
P-21
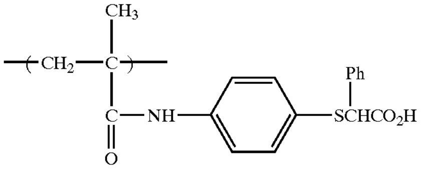
P-22
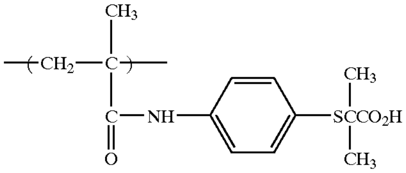
P-23
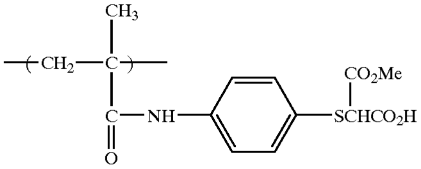
P-24
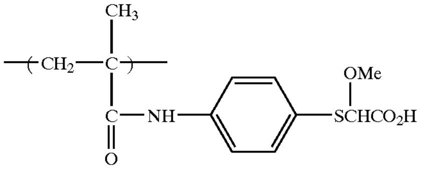
P-25
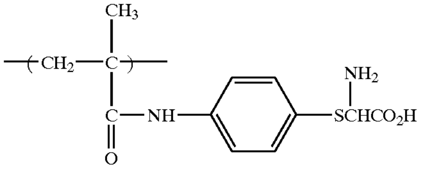
P-26
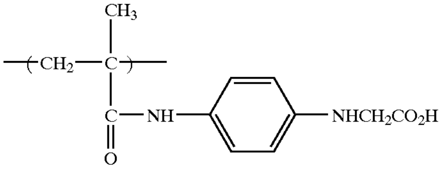
P-27
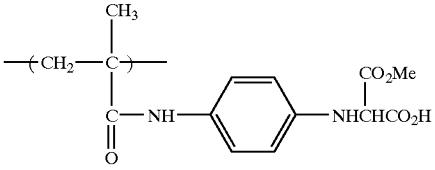
-continued
P-28
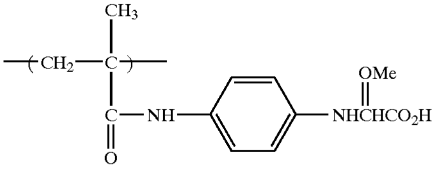
P-29
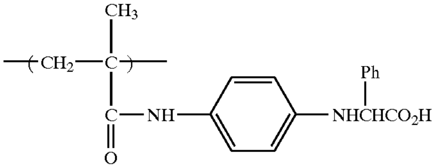
P-30
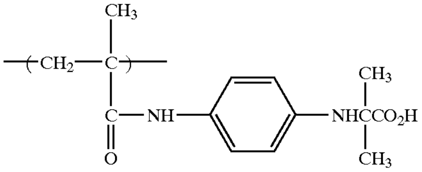
P-31
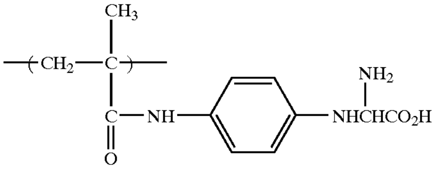
P-32
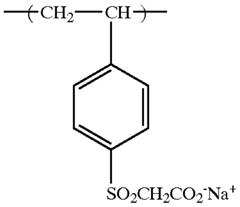
P-33
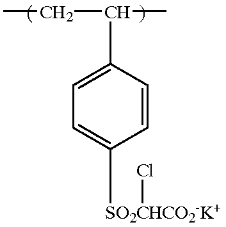
P-34
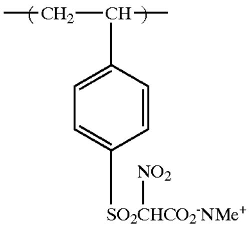
P-35
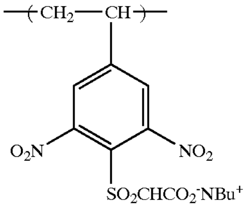

-continued
P-36
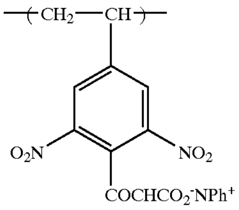
P-37
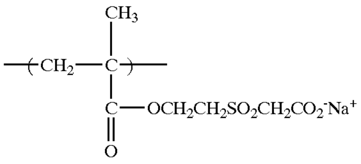
P-38
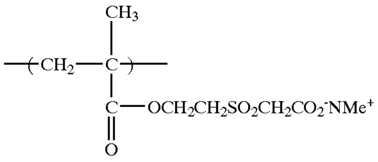
P-39
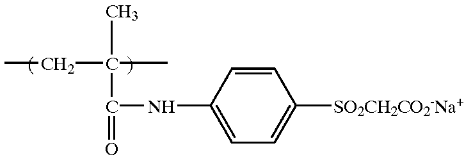
P-40
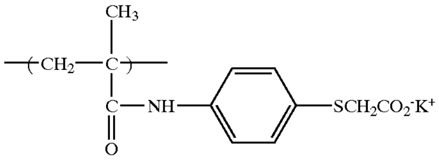
P-41
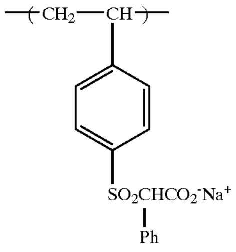
P-42
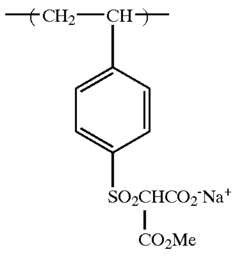
-continued
p-43
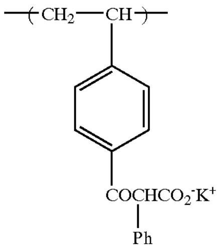
p-44
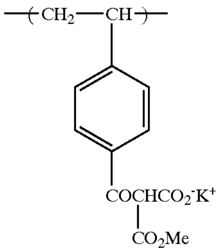
p-45
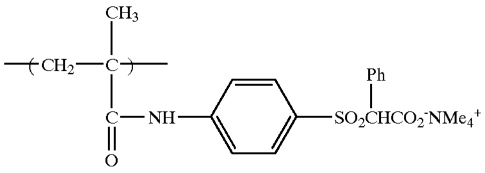
p-46
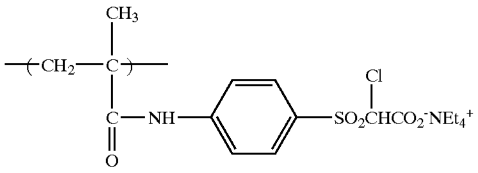
p-47
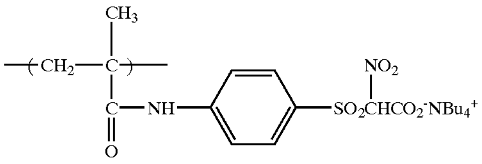
p-48
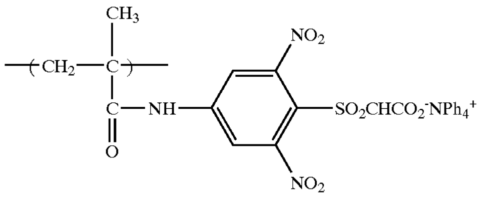
p-49
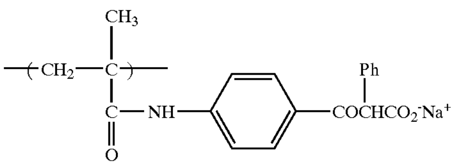
p-50
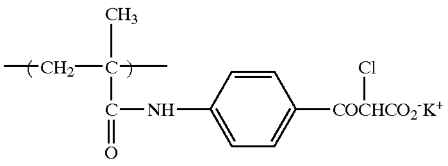

-continued
p-51
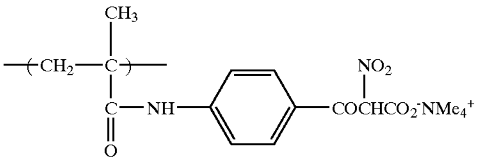
p-52
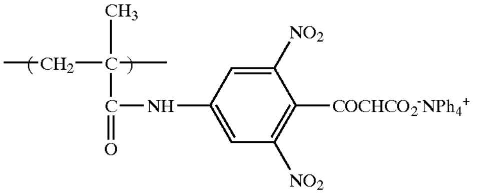
P-53
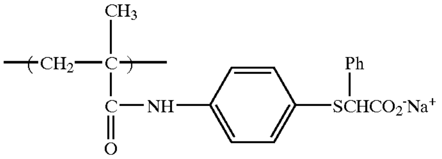
P-54
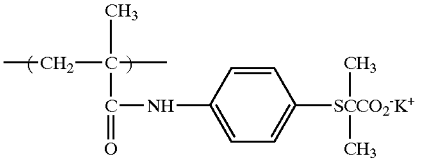
P-55
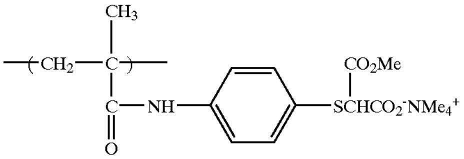
P-56
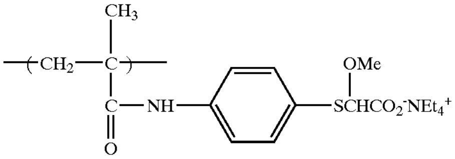
P-57
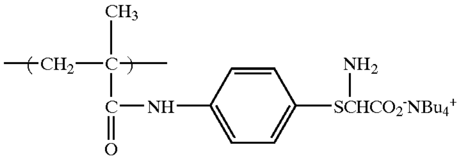
P-58
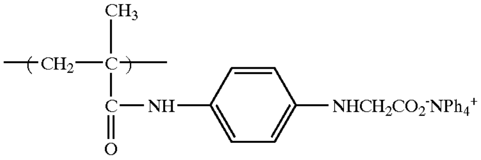
P-59
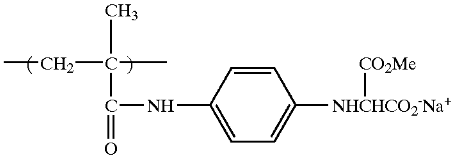
-continued
P-60
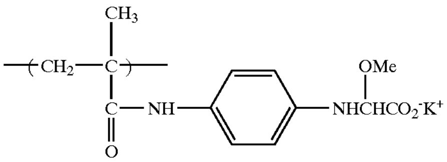
P-61
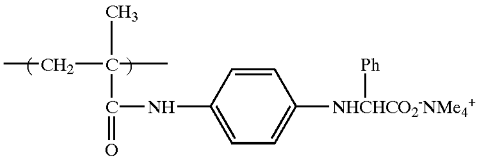
P-62
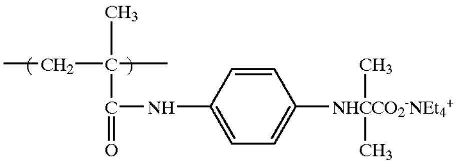
P-63
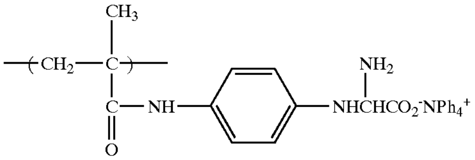
P-64
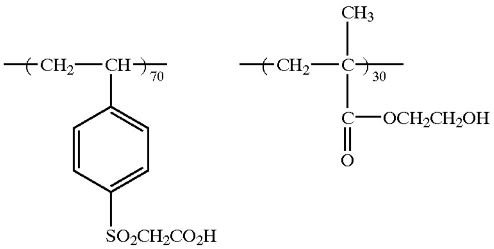
P-65
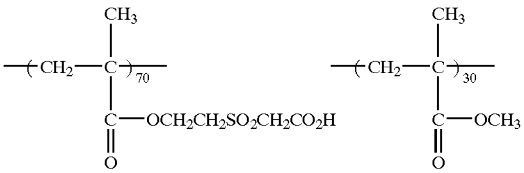
P-66
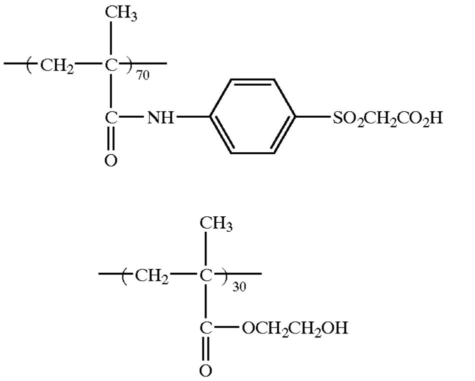

-continued

P-67

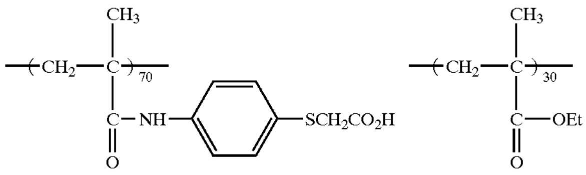

P-68

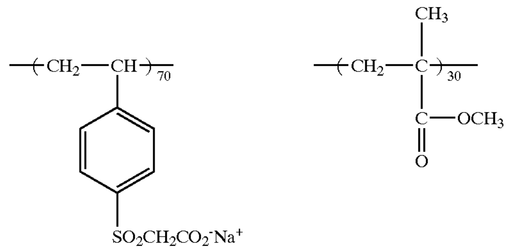

P-69

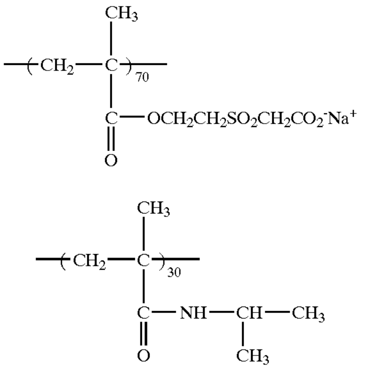

In the next place, the constitutional components other than the negative type polarity converting high molecular weight compound which can be contained in the layer containing the negative type polarity converting high molecular weight compound are described below.

Light/Heat Converting Agent

The light/heat converting agents described above can be preferably used as the light/heat converting agents which are added to a layer containing a negative type polarity converting high molecular weight compound for use in the present invention.

Surfactant

The surfactants described later can be preferably used as the surfactants which are added to a layer containing a negative type polarity converting high molecular weight compound for use in the present invention.

Other Constitutional Components

As the constitutional components other than the components described above which are added to a layer containing an alkali aqueous solution-soluble resin for use in the present invention, those similar to other constitutional components contained in a layer containing a positive type polarity converting high molecular weight compound can be preferably used.

Layer Containing Compound Crosslinkable with Resin Soluble in Alkali Aqueous Solution "A layer containing a compound crosslinkable with a resin soluble in an alkali aqueous solution" for use in the lithographic printing plate precursor according to the present invention means a layer containing at least a resin soluble in an alkali aqueous solution and a compound which crosslinks with the resin soluble in an alkali aqueous solution which is described below.

Compound Crosslinkable with Resin Soluble in Alkali Aqueous Solution

A compound which crosslinks with a resin soluble in an alkali aqueous solution (hereinafter referred to as merely "a crosslinkable compound" or "a crosslinking agent") for use in the present invention means a compound which reacts with a high molecular weight compound and crosslinks in the high molecular weight compound. Accordingly, a crosslinkable compound must have two or more functional groups capable of reaction with a high molecular weight compound. Such a compound can be preferably used in the present invention as a crosslinkable compound, but a compound having two or more functional groups crosslinkable with an alkali aqueous solution-soluble resin is particularly preferred.

The following crosslinking agents are preferably used in the present invention.

(i) An aromatic compound substituted with an alkoxymethyl group or a hydroxymethyl group (ii) A compound having an N-hydroxymethyl group, an N-alkoxymethyl group or an N-acyloxymethyl group (iii) An epoxy compound These compounds are described in detail below.

As (i) an aromatic compound substituted with an alkoxymethyl group or a hydroxymethyl group, e.g., aromatic compounds and heterocyclic compounds poly-substituted with a hydroxymethyl group, an acetoxymethyl group, or an alkoxymethyl group can be exemplified, provided that resinous compounds obtained by polycondensation of phenols, which are known as resol resins, with aldehydes under a basic condition are not included. Although resol resins are excellent in crosslinking property, heat stability is not sufficient. Therefore, in particular when resol resins contained in photosensitive materials are stored under high temperature for a long period of time, uniform development is ensured with difficulty.

Of the aromatic compounds and heterocyclic compounds poly-substituted with a hydroxymethyl group or an alkoxymethyl group, compounds having a hydroxymethyl group or an alkoxymethyl group at the position contiguous to the hydroxyl group are preferred.

When an aromatic compound is substituted with an alkoxymethyl group, the compound is preferably substituted with an alkoxymethyl group having 18 or less carbon atoms. Compounds represented by the following formulae (14) to (17) are particularly preferred.

(14)

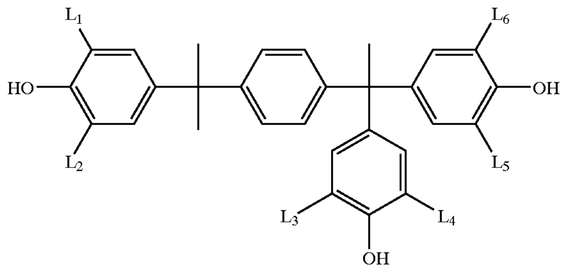

-continued (15)

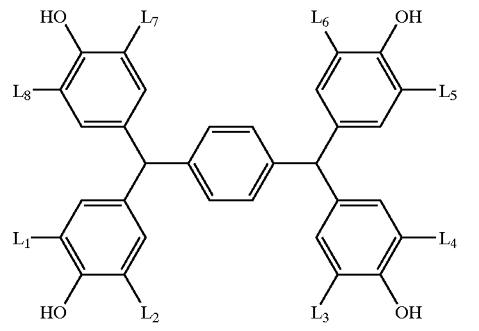

(16)

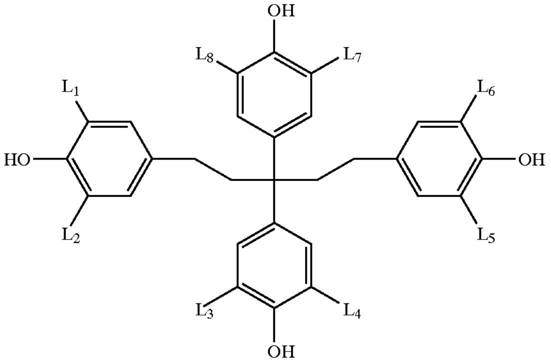

(17)

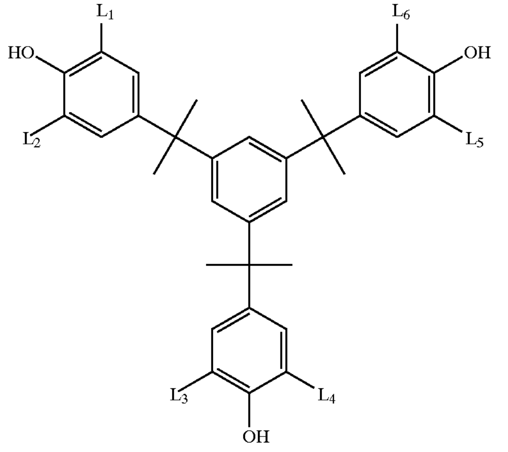

wherein $L_1$, $L_2$, $L_3$, $L_4$ and $L_5$ each represents a hydroxymethyl group or an alkoxymethyl group substituted with an alkoxyl group having 18 or less carbon atoms such as a methoxymethyl group or an ethoxymethyl group. These compounds are preferred for their high crosslinking efficiency and capable of improving the press life. The above-exemplified crosslinking agents may be used alone or may be used in combination of two or more.

As (ii) a compound having an N-hydroxymethyl group, an N-alkoxymethyl group or an N-acyloxymethyl group, e.g., monomers and an oligomers of melamine-formaldehyde condensation products, and urea-formaldehyde condensation products disclosed in EP-A-0133216, German Patents 3,634,671 and 3,711,264, and alkoxyl-substituted compounds disclosed in EP-A-0212482 can be exemplified.

As further preferred examples, e.g., melamine-formaldehyde derivatives having at least two of a free N-hydroxymethyl group, an N-alkoxymethyl group or an N-acyloxymethyl group can be exemplified, and N-alkoxymethyl derivatives are preferred above all.

As (iii) an epoxy compound, epoxy compounds of monomer, dimer, oligomer, and polymer containing one or more epoxy groups can be exemplified. For instance, reaction products of bisphenol A and epichlorohydrin, and reaction products of low molecular weight phenol-formaldehyde resins and epichlorohydrin can be exemplified. In addition to these compounds, epoxy resins disclosed in U.S. Pat. No. 4,026,705 and British Patent 1,539,192 and now in use can be exemplified.

The addition amount of these crosslinking agents in (i), (ii) and (iii) for use in the present invention is from 5 to 80 wt %, preferably from 10 to 75 wt %, and particularly preferably from 20 to 70 wt %, based on the total solid contents of the ink-receptive layer. If the addition amount of crosslinking agents is less than 5 wt %, the durability of the ink-receptive layer obtained is deteriorated, while when the amount exceeds 80 wt %, the stability during storage disadvantageously lowers. (iv) A phenol derivative represented by the following formula (18) is also preferably used as a crosslinking agent.

(18)

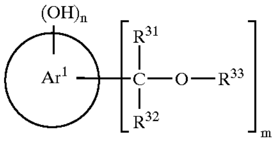

wherein $Ar^1$ represents an aromatic hydrocarbon ring which may be substituted. From the availability of the raw materials, the aromatic hydrocarbon ring is preferably a benzene ring, a naphthalene ring or an anthracene ring. Further, preferred examples of the substituents include a halogen atom, a hydrocarbon group having 12 or less carbon atoms, an alkoxyl group having 12 or less carbon atoms, an alkylthio group having 12 or less carbon atoms, a cyano group, a nitro group, and a trifluoromethylgroup. $Ar^1$ particularly preferably represents an unsubstituted benzene ring, an unsubstituted naphthalene ring, or a benzene ring and naphthalene ring substituted with a halogen atom, a hydrocarbon group having 6 or less carbon atoms, an alkoxyl group having 6 or less carbon atoms, an alkylthio group having 6 or less carbon atoms, or a nitro group, for the reason of capable of obtaining high sensitivity.

$R^{31}$ and $R^{32}$, which may be the same or different, each represents a hydrogen atom or a hydrocarbon group having 12 or less carbon atoms. $R^{31}$ and $R^{32}$ each particularly preferably represents a hydrogen atom or a methyl group, for the reason of the easiness of synthesis. $R^{33}$ represents a hydrogen atom or a hydrocarbon group having 12 or less carbon atoms. $R^{33}$ particularly preferably represents a hydrocarbon group having 7 or less carbon atoms, e.g., a methyl group, an ethyl group, a propyl group, a cyclohexyl group, or a benzyl group, for the reason of capable of obtaining high sensitivity. m represents an integer of from 2 to 4, and n represents an integer of from 1 to 3.

Specific examples of the phenol derivatives represented by formula (18) (crosslinking agents (KZ-1) to (KZ-8)) which are preferably used in the present invention are shown below, but it should not be construed as the present invention is limited thereto.

[KZ-1]

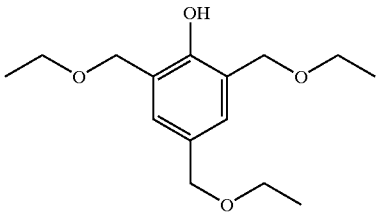

[KZ-2]

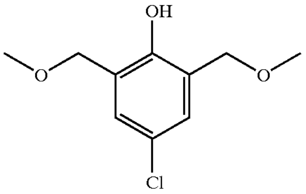

[KZ-3]

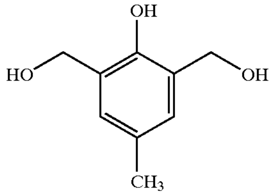

[KZ-4]

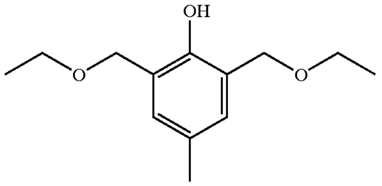

[KZ-5]

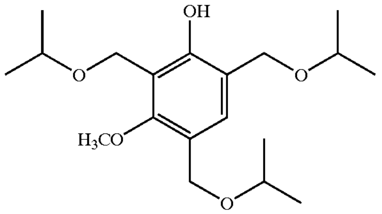

[KZ-6]

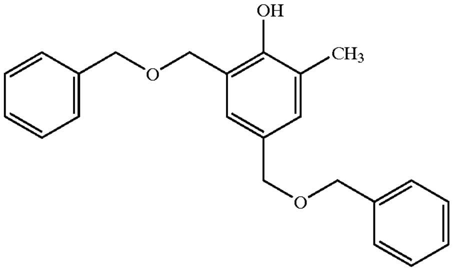

[KZ-7]

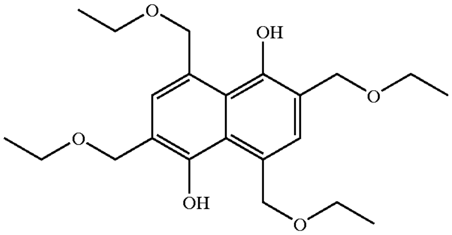

-continued

[KZ-8]

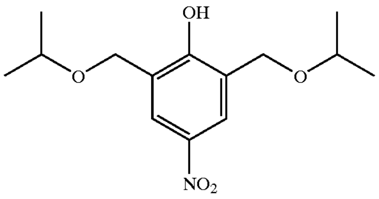

These phenol derivatives can be synthesized according to well-known methods. For example, (KZ-1) can be synthesized by the reaction of phenol and formaldehyde with secondary amine such as dimethylamine and morpholine to obtain tri(dialkylaminomethyl)phenol, and the obtained product is reacted with acetic anhydride, followed by the reaction with ethanol in the presence of weak alkali such as potassium carbonate, thus (KZ-1) is obtained as shown in the following Reaction Scheme 1

[KZ-1]

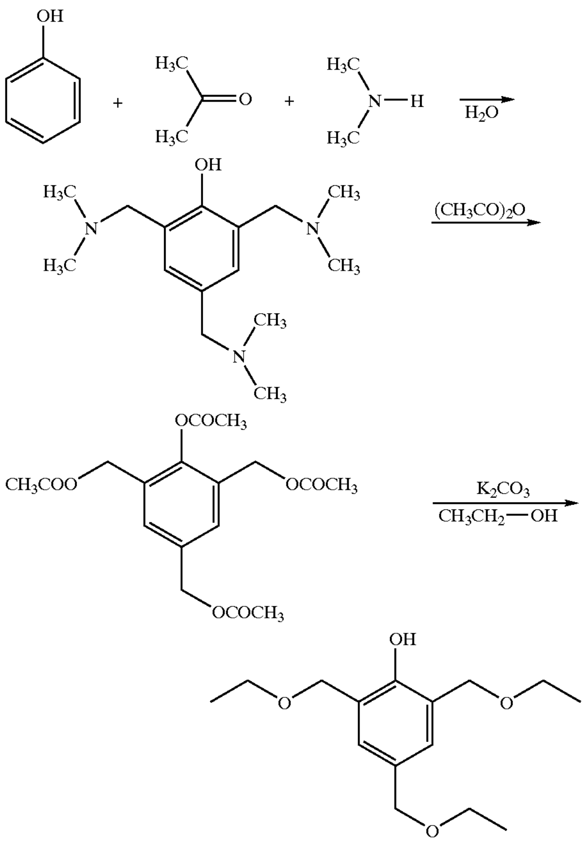

(KZ-1) can also be synthesized by other method. For example, phenol and formaldehyde or paraformaldehyde are subjected to reaction in the presence of an alkali such as KOH to obtain 2,4,5-trihydroxymethylphenol, and the reaction product is subsequently subjected to reaction with ethanol in the presence of acid such as a sulfuric acid, thus (KZ-1) is obtained as shown in the following Reaction Scheme 2.

Reaction Scheme 2

[KZ-1]

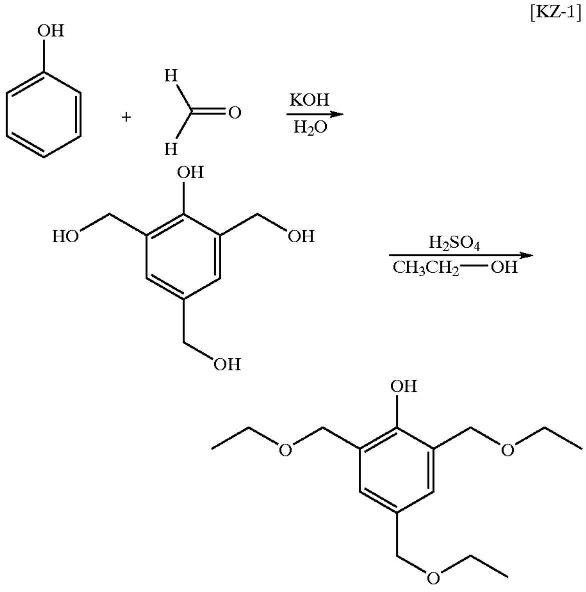

These phenol derivatives may be used alone or two or more may be used in combination. When phenol derivatives are synthesized, phenol derivatives are sometimes condensed with each other to form impurities such as dimers or trimers as by-products. The produced phenol derivatives may be used with leaving the impurities intact. In such a case, the content of the purities is preferably 30% or less, more preferably 20% or less.

Phenol derivatives are used in the present invention in an amount of from 5 to 70 wt %, preferably from 10 to 50 wt %, based on the total solid contents of the ink-receptive layer. When the addition amount of the phenol derivatives as the crosslinking agent is less than 5 wt %, the film strength of the image area after image-recording is deteriorated, while when the addition amount exceeds 70 wt %, the stability during storage disadvantageously lowers.

In the next place, the constitutional components other than the alkali aqueous solution-soluble resin and the crosslinkable compound which can be contained in a layer containing an alkali aqueous solution-soluble resin and a crosslinkable compound are described below.

Light/Heat Converting Agent

The light/heat converting agents described above can be preferably used as the light/heat converting agents which are added to a layer containing an alkali aqueous solution-soluble resin and a crosslinkable compound for use in the present invention.

Acid Generating Agent

The acid generating agents described later can be preferably used as the acid generating agents which are added to a layer containing an alkali aqueous solution-soluble resin and a crosslinkable compound for use in the present invention.

Sensitizing Dye

The above-described sensitizing dyes contained in a layer containing a positive type polarity converting high molecular weight compound can be preferably used as the sensitizing dyes which are added to a layer containing an alkali aqueous solution-soluble resin and a crosslinkable compound for use in the present invention.

Surfactant

The surfactants described later can be preferably used as the surfactants which are added to a layer containing an alkali aqueous solution-soluble resin and a crosslinkable compound for use in the present invention.

Other Constitutional Components

As the constitutional components other than the components described above which are added to a layer containing an alkali aqueous solution-soluble resin and a crosslinkable compound for use in the present invention, those similar to other constitutional components contained in a layer containing a positive type polarity converting high molecular weight compound can be preferably used.

Thermal Fusion Type Heat-Sensitive Layer

In the next place, a thermal fusion type heat-sensitive layer is described below.

A thermal fusion type heat-sensitive layer (herein-after sometimes referred to as merely "heat-sensitive layer") can contain at least one component selected from polymer fine particles having a heat-reactive functional group, a microcapsule containing a compound having a heat-reactive functional group, and a thermoplastic fine particle polymer.

As the above-described heat-reactive functional groups, ethylenically unsaturated groups which do a polymerization reaction (e.g., an acryloyl group, a methacryloyl group, a vinyl group, an allyl group, etc.), isocyanate groups which do an addition reaction, or the block of the isocyanate groups, and the functional groups having active hydrogen atoms of the opposite compounds of the reaction (e.g., an amino group, a hydroxyl group, a carboxyl group, etc.), epoxy groups which do an addition reaction, and the amino group, the carboxyl group, and the hydroxyl group of the opposite compounds of the reaction, a carboxyl group, a hydroxyl group and an amino group which do a condensation reaction, and an acid anhydride and an amino group and a hydroxyl group which do a ring-opening addition reaction can be exemplified. However, so long as a chemical bond is formed, functional groups which do any reaction may be used in the present invention.

Polymer fine particles having heat-reactive functional group

As the fine particle polymers having a heat-reactive functional group for use in a thermal fusion type heat-sensitive layer, polymers having an acryloyl group, a methacryloyl group, a vinyl group, an allyl group, an epoxy group, an amino group, a hydroxyl group, a carboxyl group, an isocyanate group, an acid anhydride, and the protective groups of them can be specifically exemplified. These functional groups may be incorporated into polymer fine particles at the time of polymerization of the polymer fine particles or may be incorporated by utilizing a high polymer reaction after polymerization of the polymer fine particles. Alternatively, polymer fine particles may be prepared by dissolving a polymer having a heat-reactive functional group in an organic solvent, emulsifying and dispersing the solution in water with an emulsifying agent or a dispersant and then evaporating the organic solvent.

When these functional groups are incorporated into polymer fine particles at the time of polymerization, it is preferred that monomers having these functional groups undergo emulsion polymerization or suspension polymerization.

Specific examples of the monomers having such functional groups include allyl methacrylate, allyl acrylate, vinyl methacrylate, vinyl acrylate, glycidyl methacrylate, glycidyl acrylate, 2-isocyanatoethyl methacrylate or its block isocyanate by alcohol, etc. , 2-isocyanatoethyl acrylate or its block isocyanate by alcohol, etc., 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, and bifunctional methacrylate, but the present invention is not limited thereto.

As the monomers not having a heat-reactive functional group copolymerizable with these monomers, e.g., styrene, alkyl acrylate, alkyl methacrylate, acrylonitrile, and vinyl acetate can be exemplified, but the present invention is not limited thereto so long as they are monomers not having a heat-reactive functional group.

High polymer reactions which are used in the case where a heat-reactive functional group is introduced after polymerization of polymer fine particles are disclosed, e.g., in WO 96/34316.

Of the above polymer fine particles having a heat-reactive functional group, polymer fine particles in which polymer fine particles coalesce with each other by heat are preferred, and those having hydrophilic surfaces and dispersible in water are particularly preferred. It is preferred that only polymer fine particles are coated and the contact angle of the film (water droplet in air) prepared by drying at lower temperature than the coagulation temperature of the polymer fine particles is lower than the contact angle of the film (water droplet in air) prepared by drying at higher temperature than the coagulation temperature of the polymer fine particles. Thus, when hydrophilic polymers such as polyvinyl alcohol and polyethylene glycol, or oligomers, or hydrophilic low molecular weight compounds are adsorbed onto the surfaces of the polymer fine particles, the surfaces of the polymer fine particles are made hydrophilic, but the method is not limited thereto.

The coagulation temperature of these polymer fine particles having heat-reactive functional groups is preferably 70° C. or higher, more preferably 100° C. or higher, in view of aging stability.

These polymer fine particles preferably have an average particle size of from 0.01 to 20 $\mu$m, more preferably from 0.05 to 2.0 $\mu$m, and particularly preferably from 0.1 to 1.0 $\mu$m. If the average particle size is too big, resolution becomes worse and if it is too small, aging stability is deteriorated.

The addition amount of these polymer fine particles having heat-reactive functional groups is preferably 50 wt % or more, more preferably 60 wt % or more, based on the solid contents of the heat-sensitive layer.

Microcapsule Containing Compound Having Heat-Reactive Functional Group

The microcapsules to be contained in the heat-sensitive layer of the lithographic printing plate precursor according to the present invention contain a compound having a heat-reactive functional group. As the compound having a heat-reactive functional group, compounds having at least one functional group selected from a polymerizable unsaturated group, a hydroxyl group, a carboxyl group, a carboxylate group, an acid anhydride, an amino group, an epoxy group, an isocyanate group, or the block of isocyanate groups can be exemplified.

As the compound having a polymerizable unsaturated group, compounds having at least one, preferably two or more ethylenically unsaturated bonds, e.g., an acryloyl group, a methacryloyl group, a vinyl group or an aryl group. These compounds are well known in the field of this industry and these compounds can be used with no particular restriction in the present invention. As the chemical forms, they are monomers, prepolymers, i.e., dimers, trimers, oligomers, and mixtures of them, or copolymers of them.

As specific examples of such compounds, unsaturated carboxylic acid(e.g.,acrylic acid,methacrylic acid,itaconic acid, crotonic acid, isocrotonic acid, maleic acid, etc.), and esters and amides thereof can be exemplified, and preferably the esters of unsaturated carboxylic acid and aliphatic polyhydric alcohols, and the amides of unsaturated carboxylic acid and aliphatic polyhydric amines can be exemplified.

Further, the addition reaction products of unsaturated carboxylic acid esters or unsaturated carboxylic acid amides having nucleophilic substituents such as a hydroxyl group, an amino group, a mercapto group, etc., with monofunctional or polyfunctional isocyanates or epoxides, and the dehydration condensation reaction products of these unsaturated carboxylic acid esters or amides with monofunctional or polyfunctional carboxylic acids are also preferably used in the present invention.

Further, the addition reaction products of unsaturated carboxylic acid esters or amides having electrophilic substituents such as an isocyanate group and an epoxy group with monofunctional or polyfunctional alcohol, amine and thiol, and the substitution reaction products of unsaturated carboxylic acid esters or amides having eliminable substituents such as a halogen group and a tosyloxy group with monofunctional or polyfunctional alcohol, amine and thiol are also preferably used in the present invention.

As other preferred examples, the compounds in which unsaturated carboxylic acid is substituted with unsaturated phosphonic acid or chloromethylstyrene can be exemplified.

Specific examples of the polymerizable compounds of esters of unsaturated carboxylic acids and aliphatic polyhydric alcohols include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane diacrylate, trimethylolpropane triacrylate, trimethylolpropane tris (acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, etc.

As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloyloxy-2-hydroxypropoxy)phenyl]dimethylmethane, bis[p-(methacryloyloxy)phenyl]dimethylmethane, etc.

As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

As crotonates, examples include ethylene glycol dicrotonate, tetramethylene glycol dicrotonate, pentaerythritol dicrotonate, sorbitol tetradicrotonate, etc.

As isocrotonates, examples include ethylene glycol diisocrotonate, pentaerythritol diisocrotonate, sorbitol tetraisocrotonate, etc.

As maleates, examples include ethylene glycol dimaleate, triethylene glycol dimaleate, pentaerythritol dimaleate, sorbitol tetramaleate, etc.

As examples of other esters, e.g., aliphatic alcohol esters disclosed in JP-B-46-27926, JP-B-51-47334 and JP-A-57-196231, esters having an aromatic skeleton disclosed in JP-A-59-5240, JP-A-59-5241 and JP-A-2-226149, and esters having an amino group disclosed in JP-A-1-165613 can be exemplified.

Further, examples of amide monomers of aliphatic polyhydric amine compounds and unsaturated carboxylic acids includemethylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc.

As examples of other preferred amide monomers, those having cyclohexylene structure disclosed in JP-B-54-21726 can be exemplified.

Further, urethane-based addition polymerizable compounds produced by an addition reaction of isocyanate and a hydroxyl group are also preferably used, and as such specific examples, e.g., the urethane compound having two or more polymerizable unsaturated groups in one molecule obtained by adding an unsaturated monomer having a hydroxyl group represented by the following formula (I) to a polyisocyanate compound having two or more isocyanate groups in one molecule disclosed in JP-B-48-41708 can be exemplified.

$$CH_2{=}C(R^1)COOCH_2CH(R^2)OH \qquad (I)$$

wherein $R^1$ and $R^2$ each represents H or $CH_3$.

Further, the urethane acrylates as disclosed in JP-A-51-37193, JP-B-2-32293 and JP-B-2-16765, the urethane compounds having an ethylene oxide skeleton as disclosed in JP-B-58-49860, JP-B-56-17654, JP-B-62-39417 and JP-B-62-39418 can also be exemplified as preferred examples.

The radical polymerizable compounds having amino structure or sulfide structure in the molecule as disclosed in JP-A-63-277653, JP-A-63-260909 and JP-A-1-105238 can also be exemplified as preferred compounds.

As other preferred examples, polyfunctional acrylates and methacrylates such as the polyester acrylates, and the epoxy acrylates obtained by reacting epoxy resin and methacrylic acid as disclosed in JP-A-48-64183, JP-B-49-43191, and JP-B-52-30490 can be exemplified. In addition, the special unsaturated compounds disclosed in JP-B-46-43946, JP-B-1-40337, and JP-B-1-40336, and the vinyl sulfonic acid-based compounds disclosed in JP-A-2-25493 can also be exemplified as preferred compounds. Further, the compounds containing a perfluoroalkyl group disclosed in JP-A-61-22048 are preferably used in some cases. Those introduced into *Bulletin of Nihon Setchaku Kyokai*, Vol. 20, No. 7, pp. 300 to 308 (1984) as photosetting monomers and oligomers can also be used preferably in the present invention.

As preferred examples of epoxy compounds, glycerol polyglycidyl ether, polyethylene glycol diglycidyl ether, polypropylene diglycidyl ether, trimethylolpropane polyglycidyl ether, sorbitol polyglycidyl ether, bisphenols and polyphenols or hydrogenated polyglycidyl ethers of them can be exemplified.

As preferred examples of isocyanate compounds, tolylene diisocyanate, diphenylmethane diisocyanate, polymethylenepolyphenyl polyisocyanate, xylylene diisocyanate, naphthalene diisocyanate, cyclohexanephenylene diisocyanate, isophorone diisocyanate, hexamethylene diisocyanate, cyclohexyl diisocyanate, or compounds obtained by blocking these compounds with alcohol or amine can be exemplified.

As preferred examples of amine compounds, ethylenediamine, diethylenetriamine, triethylenetetramine, hexamethylenediamine, propylenediamine, polyethyleneimine can be exemplified.

As preferred examples of the compounds having a hydroxyl group, compounds having methylol groups at terminals, polyhydric alcohol such as pentaerythritol, bisphenol/polyphenols can be exemplified.

As preferred examples of the compounds having a carboxyl group, aromatic polyvalent carboxylic acids such as pyromellitic acid, trimellitic acid, and phthalic acid, aliphatic polyvalent carboxylic acids such as adipic acid can be exemplified.

As preferred acid anhydrides, pyromellitic anhydride and benzophenonetetracarboxylic anhydride can be exemplified.

As preferred examples of the copolymers of ethylenically unsaturated compounds, allyl methacrylate copolymers can be exemplified. For example, allyl methacrylate/methacrylic acid copolymers, allyl methacrylate/ethyl methacrylate copolymers, and allyl methacrylate/butyl methacrylate copolymers can be exemplified.

Various well-known methods of microencapsulation can be used in the present invention, e.g., a method utilizing coacervation as disclosed in U.S. Pat. Nos. 2,800,457 and 2,800,458, a method by interfacial polymerization as disclosed in British Patent 990,443, U.S. Pat. No. 3,287,154, JP-B-38-19574, JP-B-42-446 and JP-B-42-711, a method by the precipitation of a polymeras disclosed in U.S. Pat. Nos. 3,418,250 and 3,660,304, a method using isocyanate polyol wall materials as disclosed in U.S. Patent 3,796,669, a method using isocyanate wall materials as disclosed in U.S. Pat. No. 3,914,511, a method using urea-formaldehyde wall materials or urea-formaldehyde-resorcinol wall materials as disclosed in U.S. Pat. Nos. 4,001,140, 4,087,376 and 4,089,802, a method using wall materials such as melamine-formaldehyde resins and hydroxy cellulose as disclosed in U.S. Pat. No. 4,025,445, an in situ monomer polymerization method as disclosed in JP-B-36-9163 and JP-B-51-9079, a spray drying method as disclosed in British Patent 930,422 and U.S. Pat. No. 3,111,407, and an electrolytic dispersion cooling method as disclosed in British Patents 952,807 and 967,074 can be exemplified as microencapsulating methods, but the present invention is not limited thereto.

The microcapsule walls preferably used in the present invention have three dimensional crosslinks and have the property of swelling in a solvent. Considering these points, polyurea, polyurethane, polyester, polycarbonate, polyamide, and mixtures of these compounds are preferably used as microcapsule walls, and polyurea and polyurethane are particularly preferred. Compounds having a heat-reactive functional group may be contained in microcapsule walls.

Microcapsules preferably have an average particle size of from 0.01 to 20 μm, more preferably from 0.05 to 2.0 μm, and particularly preferably from 0.10 to 1.0 μm. If the average particle size is too big, resolution becomes worse and if it is too small, aging stability is deteriorated.

These microcapsules may or may not coalesce with each other by heat. In short, the contents in the microcapsules which oozed on the surface of the microcapsules or oozed out of the microcapsules or entered into the microcapsule walls at coating will suffice to cause chemical reaction by heat. The microcapsules may react with hydrophilic resins or low molecular weight compounds added to the heat-sensitive layer. Two or more kinds of microcapsules may have respectively different functional groups to undergo heat reaction with each other.

Accordingly, it is preferred for microcapsules to be melted and coalesced with each other by heat in view of image drawing but it is not essential.

The addition amount of microcapsules to a heat-sensitive layer is preferably from 10 to 60 wt %, more preferably from 15 to 40 wt %, based on the solid contents. Not only good developability on machine but also good sensitivity and press life can be obtained within this range of addition amount.

When microcapsules are added to a heat-sensitive layer, a solvent by which the contents of the microcapsules are dissolved and the microcapsule walls are swollen may be added to the dispersion medium of the microcapsules. The diffusion of the compounds having a heat-reactive functional group contained in the microcapsules to the out of the microcapsules is accelerated due to such a solvent.

Such a solvent depends upon the dispersion media of the microcapsules, the wall materials of the microcapsules, the wall thickness, and the content of the microcapsules, but a solvent can be easily selected from among many commercially available solvents. For example, when microcapsules are water-dispersible microcapsules comprising a crosslinked polyurea or polyurethane wall material, alcohols, ethers, acetals, esters, ketones, polyhydric alcohols, amides, amines and fatty acids are preferably used.

Specific examples of solvents include methanol, ethanol, t-butanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide, and N,N-dimethylacetamide. However, solvents are not limited thereto, and these solvents may be used two or more as mixture.

Solvents which are not dissolved in microcapsule dispersion solution but are dissolved when used as mixtures with the above solvents may be used. The addition amounts of solvents depend upon the combinations of the materials, but when the amount is less than the optimal value, image-drawing is insufficient, while when it exceeds the optimal value, the stability of the dispersion solution is deteriorated. The addition amount is generally from 5 to 95 wt %, preferably from 10 to 90 wt %, and more preferably from 15 to 85 wt %, of the amount of the solution.

Thermoplastic fine particle polymer

Thermoplastic fine particle polymers described in *Research Disclosure*, No. 33303 (January, 1992), JP-A-9-123387, JP-A-9-131850, JP-A-9-171249, JP-A-9-171250 and EP 931647 are preferably used in the present invention. Specific examples include homopolymers and copolymers of monomers such as ethylene, styrene, vinyl chloride, methyl acrylate, ethyl acrylate, methyl methacrylate, ethyl methacrylate, vinylidene chloride, acrylonitrile, and vinyl carbazole, and mixtures of these. Polystyrene and methyl polymethacrylate can be exemplified as more preferred of these.

However, particularly preferred are polymer fine particles having a heat-reactive functional group and microcapsules containing a compound having a heat-reactive functional group.

Compound Which Initiates or Accelerates Reaction

Since polymer fine particles having a heat-reactive functional group or microcapsules containing a compound having a heat-reactive functional group are used in the heat-sensitive layer in the lithographic printing plate precursor according to the present invention as described above, the compounds which initiate or accelerate these reactions can be used, if necessary. As the compounds which initiate or accelerate reactions, compounds which generate radicals or cations by heat can be exemplified, e.g., lophine dimers, trihalomethyl compounds, peroxides, azo compounds, onium salts containing a diazonium salt or a diphenyl iodonium salt, acylphosphine, and imidosulfonate can be exemplified.

These compounds can be added to the heat-sensitive layer in an amount of from 1 to 20 wt %, preferably from 3 to 10 wt %. Within this range, the developability on machine is not impaired and good initiating or accelerating effects of the reaction can be obtained.

Hydrophilic Resin

Hydrophilic resins may be added to the heat-sensitive layer. Not only the developability on machine is improved but also the film strength of the heat-sensitive layer itself is increased by the addition of hydrophilic resins. Lithographic printing plate precursors requiring no development process can be obtained by hardening hydrophilic resins by crosslinking.

As hydrophilic resins, those having a hydroxyl group such as hydroxyl, carboxyl, hydroxyethyl, hydroxypropyl, amino, aminoethyl, aminopropyl, and carboxymethyl, and hydrophilic sol/gel conversion series binder resins are preferably used.

Specific examples of hydrophilic resins include gum arabic, casein, gelatin, starch derivatives, carboxymethyl cellulose and Na salts thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, and polyvinyl alcohols, and in addition to these, hydrolyzed polyvinyl acetate having the degree of hydrolysis of at least 60 wt %, preferably at least 80 wt %, polyvinyl formal, polyvinyl butyral, polyvinyl pyrrolidone, homopolymers and copolymers of acrylamide, homopolymers and copolymers of methacrylamide, and homopolymers and copolymers of N-methylolacrylamide can be exemplified.

The above hydrophilic resins may be crosslinked. As waterproofing agents for curing the above-described hydrophilic resins, glyoxal, aldehydes such as melamine-formaldehyde resins and urea-formaldehyde resins, methylol compounds such as N-methylolurea, N-methylolmelamine, and methylolated polyamide resins, active vinyl compounds such as divinyl sulfone and bis(β-hydroxyethylsulfonic acid), epoxy compounds such as epichlorohydrin, polyethylene glycol diglycidyl ether, polyamide-polyamine-epichlorohydrin adducts, and polyammide epichlorohydrin resins, ester compounds such as monochloroacetate and thioglycolate, polycarboxylic acids such as polyacrylic acid, methyl vinyl ether-maleic acid copolymers, boric acid, titanyl sulfate, inorganic crosslinking agents such as salts of Cu, Al, Sn, V and Cr, and modified polyamide-polyimide resins can be exemplified.

In addition to these, crosslinking catalysts such as ammonium chloride, a silane coupling agent, and a titanate coupling agent can be used in combination.

Light/Heat Converting Materials

Image-drawing by laser ray irradiation can be effected by containing a light/heat converting material in the heat-sensitive layer. In particular, the melting and heat reaction of fine particles occur effectively by adding a light/heat converting material to fine particles.

As the light/heat converting materials, substances which absorb light of 700 nm or more suffice for this purpose and various pigments and dyes can be used.

As the pigments for use in the present invention, commercially available pigments and pigments described in *Color Index* (*C. I.*) *Binran* (*Color Index Handbook*), *Saishin Ganryo Binran* (*The Latest Pigment Handbook*), compiled by Nihon Ganryo Gijutsu Kyokai (1977), *Saishin Ganryo Oyo Gijutsu* (*The Latest Pigment Applied Technique*), published by CMC Publishing Co. (1986), and *Insatsu Ink Gijutsu* (*Printing Ink Technique*), CMC Publishing Co. (1984) can be used.

Various kinds of pigments can be used, e.g., black pigments, brown pigments, red pigments, purple pigments, blue pigments, green pigments, fluorescent pigments, metal powder pigments, and polymer-attaching pigments can be exemplified. Specifically, an insoluble azo pigment, an azo lake pigment, a condensation azo pigment, a chelate azo pigment, a phthalocyanine pigment, an anthraquinone pigment, a perylene pigment, a perinone pigment, a thioindigo pigment, a quinacridone pigment, a dioxazine pigment, an isoindolinone pigment, a quinophthalone pigment, an in-mold lake pigment, an azine pigment, a nitroso pigment, a nitro pigment, a natural pigment, a fluorescent pigment, an inorganic pigment, and a carbon black can be used.

These pigments can be used without surface treatment or may be surface-treated. As methods of surface treatments, a method of surface-coating with hydrophilic resins and lipophilic resins, a method of adhering surfactants, and a method of attaching reactive substances (e.g., silica sol, alumina sol, silane coupling agents, epoxy compounds and polyisocyanate compounds) on the surfaces of pigments can be exemplified. These surface treatment methods are described in *Kinzoku Sekken no Seishitsu to Oyo* (*Natures and Applications of Metal Soaps*), Saiwai Shobo Co., *Insatsu Ink Gijutsu* (*Printing Ink Technique*), CMC Publishing Co. (1984), and *Saishin Ganryo Oyo Gijutsu* (*The Latest Pigment Applied Technique*), CMC Publishing Co. (1986). Of these pigments, infrared-absorbing and near infrared-absorbing pigments are preferred in view of being suitable for use for lasers emitting infrared rays or near infrared rays. Carbon black is preferably used as such infrared-absorbing and near infrared-absorbing pigments. Carbon blacks which are easily dispersed with water-soluble or hydrophilic resins and surface-coated with hydrophilic resins or silica sol so as not to impair the hydrophilic property are particularly preferably used.

Pigments preferably have a particle size of preferably from 0.01 to 1 μm, more preferably from 0.01 to 0.5 μm.

As dyes for this purpose, those commercially available and well-known dyes described, for example, in *Senryo Binran* (*Dye Handbook*), compiled by Yuki Gosei Kagaku Kyokai (1970) can be utilized. Specific examples of these dyes include an azo dye, a metal complex azo dye, a pyrazolone azo dye, an anthraquinone dye, a phthalocyanine dye, a carbonium dye, a quinoneimine dye, a methine dye, and a cyanine dye. Of these dyes, infrared-absorbing and near infrared-absorbing dyes are particularly preferred in view of being suitable for use for lasers emitting infrared rays or near infrared rays.

As such dyes which absorb infrared rays or near infrared rays, cyanine dyes disclosed in JP-A-58-125246, JP-A-59-84356, JP-A-60-78787, U.S. Pat. No. 4,973,572 and JP-A-10-268512, methine dyes disclosed in JP-A-58-173696, JP-A-58-181690, and JP-A-58-194595, naphthoquinone dyes disclosed in JP-A-58-112793, JP-A-58-224793, JP-A-59-48187, JP-A-59-73996, JP-A-60-52940, and JP-A-60-63744, squarylium dyes disclosed in JP-A-58-112792, cyanine dyes disclosed in British Patent 434,875, dyes disclosed in U.S. Pat. No. 4,756,993, cyanine dyes disclosed in U.S. Pat. No. 4,973,572, and dyes disclosed in JP-A-10-268512 can be exemplified.

Further, near infrared-absorbing sensitizing dyes disclosed in U.S. Pat. No. 5,156,938 are also preferably used. In addition, substituted arylbenzo(thio)pyrylium salts disclosed in U.S. Pat. No. 3,881,924, trimethine thiapyrylium salts disclosed in JP-A-57-142645 (corresponding to U.S. Pat. No. 4,327,169), pyrylium based compounds disclosed in JP-A-58-181051, JP-A-58-220143, JP-A-59-41363, JP-A-59-84248, JP-A-59-84249, JP-A-59-146063, and JP-A-59-146061, cyanine dyes disclosed in JP-A-59-216146, pentamethine thiopyrylium salts disclosed in U.S. Pat. No. 4,283,475, pyrylium compounds disclosed in JP-B-5-13514 and JP-B-5-19702, Epolight III-178, Epolight III-130, and Epolight III-125 (manufactured by Epoline Co., Ltd.) are particularly preferably used.

Of these dyes, water-soluble cyanine dyes are particularly preferably used.

Specific examples of the compounds are shown below.

(I-1)

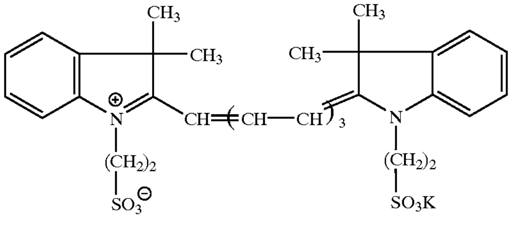

(I-2)

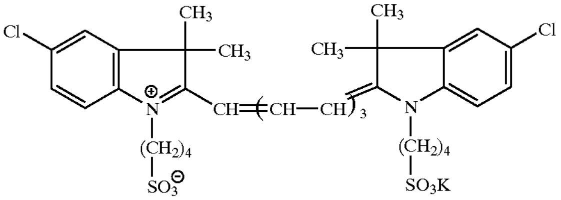

(I-3)

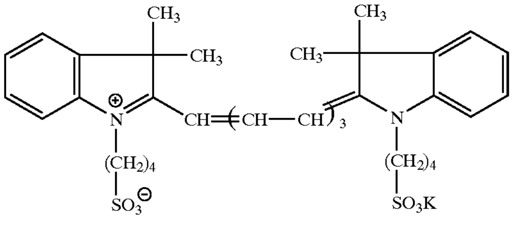

-continued
(I-4)
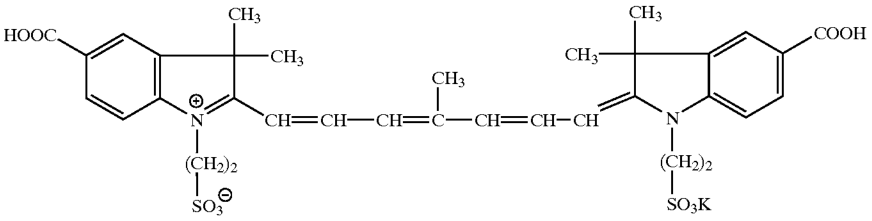
(I-5)
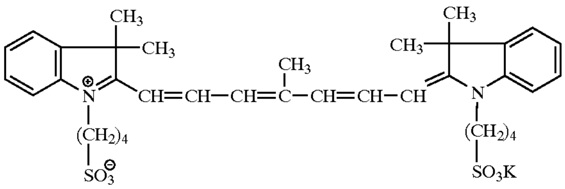
(I-6)
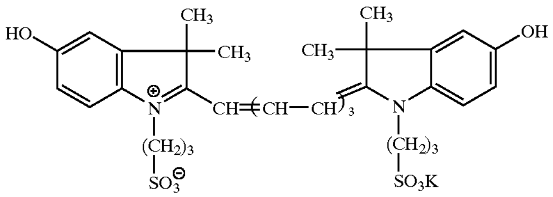
(I-7)
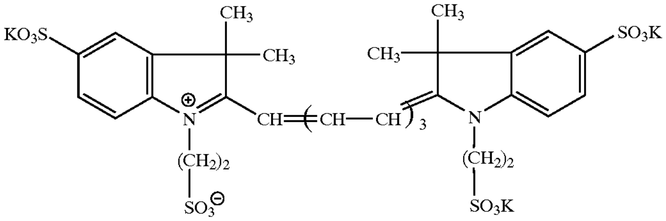
(I-8)
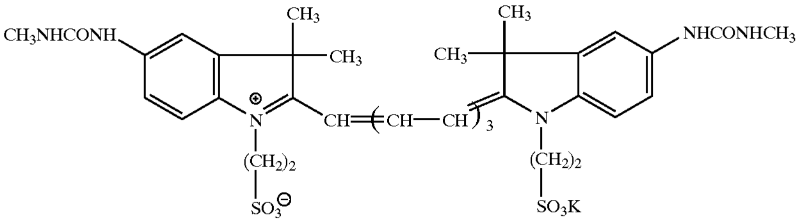
(I-9)
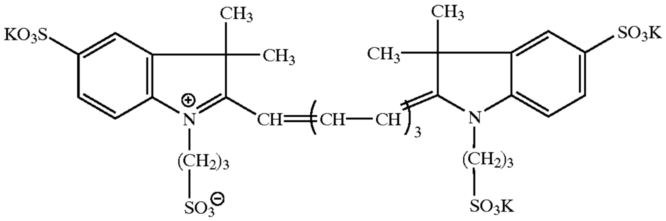
(I-10)
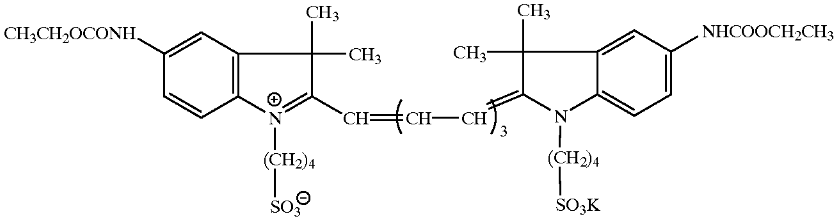
(I-11)
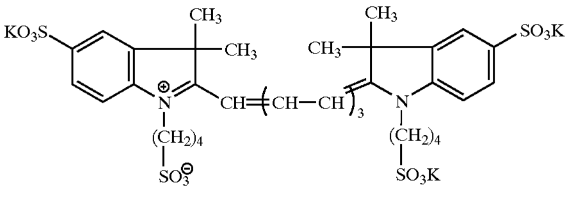
(I-12)
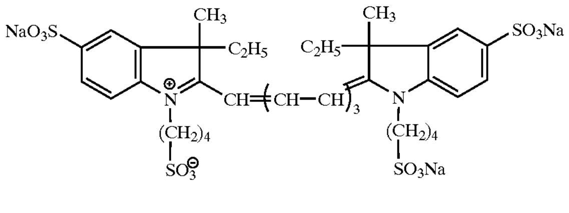

-continued
(I-13)
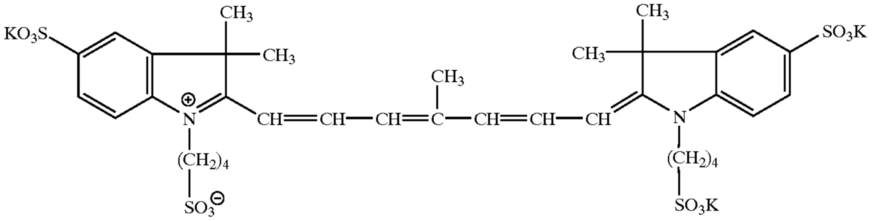
(I-14)
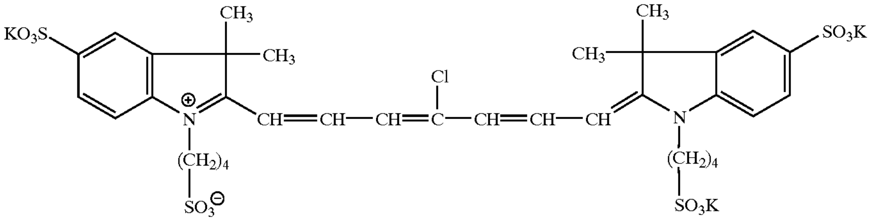
(I-15)
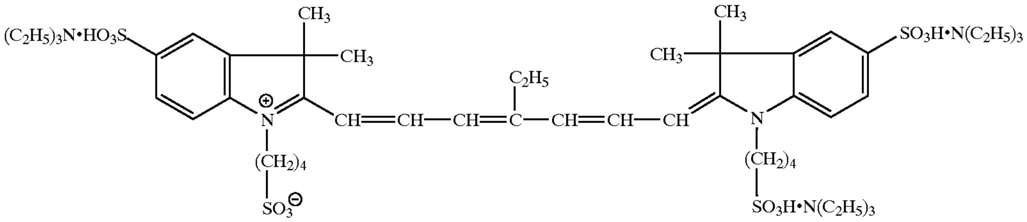
(I-16)
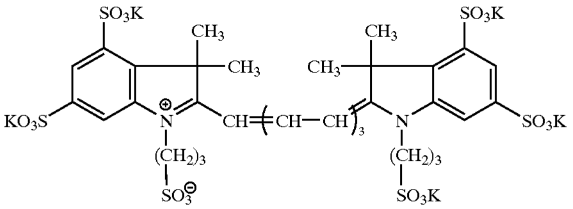
(I-17)
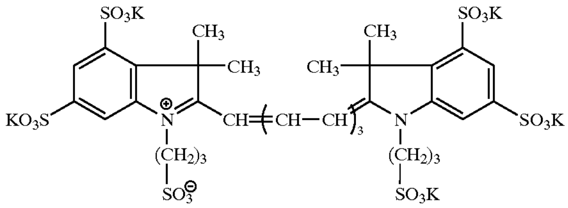
(I-18)
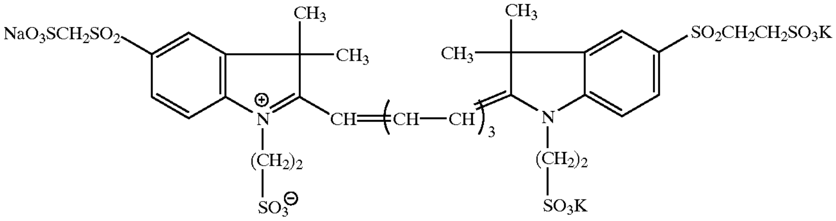
(I-19)
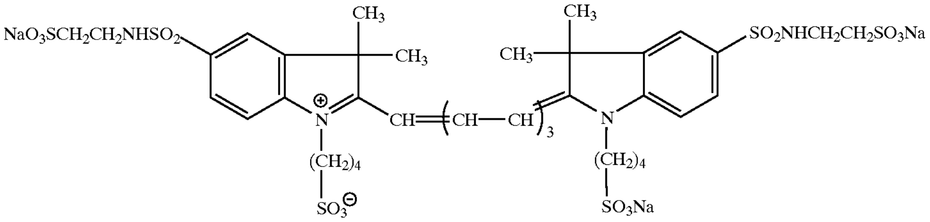
(I-20)
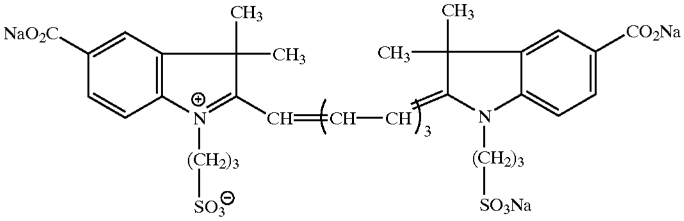

-continued
(I-21)
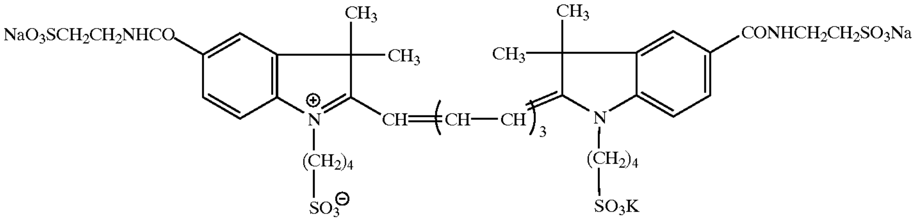
(I-22)
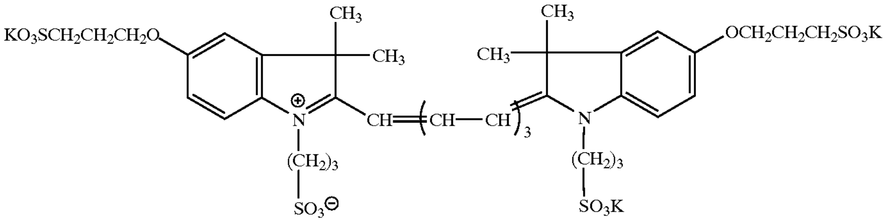
(I-23)
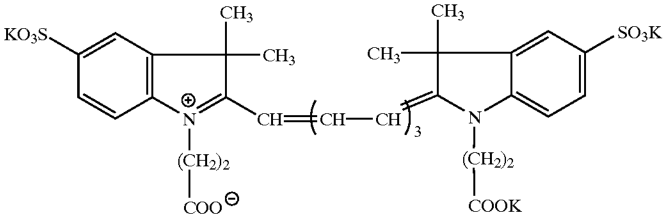
(I-24)
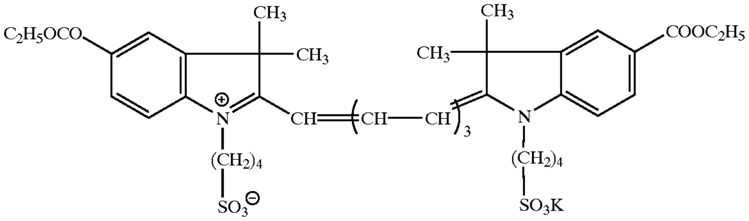
(I-25)
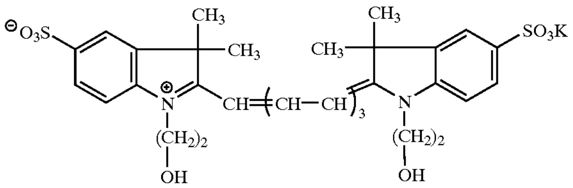
(I-26)
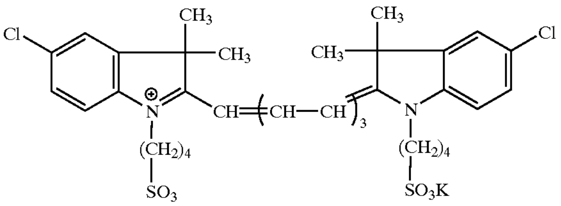
(I-27)
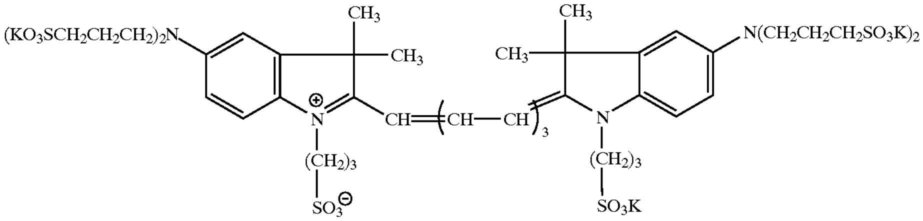
(I-28)
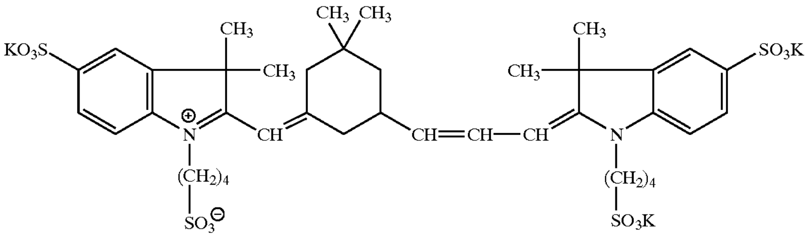

-continued (I-29)

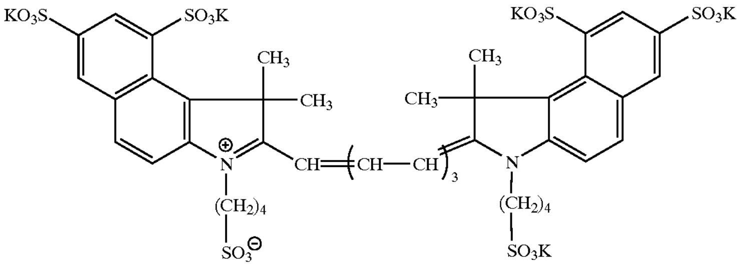

(I-30)

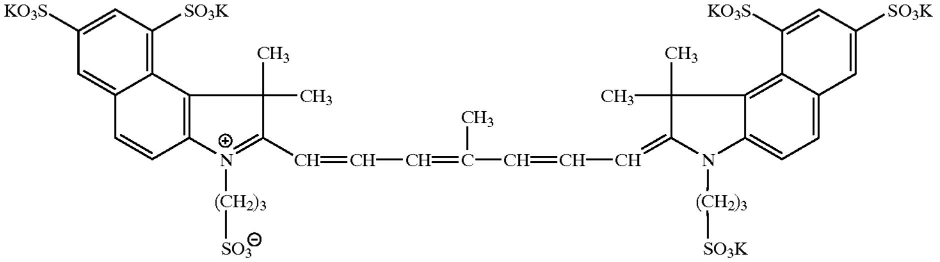

(I-31)

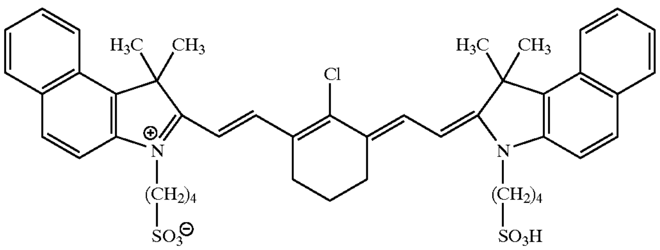

(I-32)

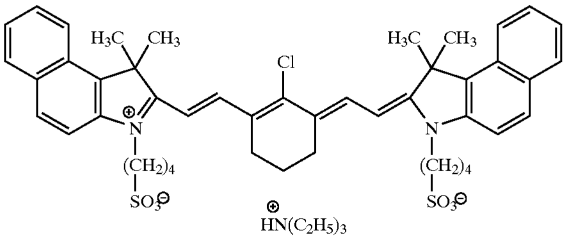

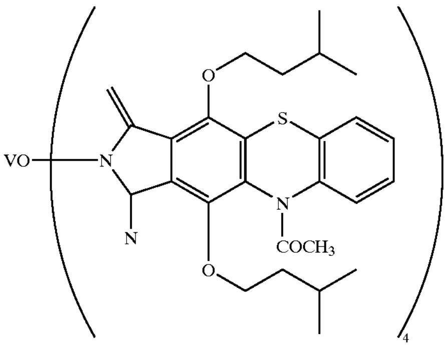

In the next place, light/heat converting metallic fine particles are described below. Themetallic fine particles for use as light/heat converting metallic fine particles according to the present invention may be any metallic fine particles so long as they are light/heat converting and fused by irradiation, but preferred metals which constitute the metallic fine particles are single or alloy metals selected from the metallic elements belonging to group VIII or group I-B of the Periodic Table. Single or alloy metallic fine particles of Ag, Au, Cu, Pt and Pd are particularly preferred.

Metal colloids for use in the present invention can be obtained by adding an aqueous solution containing the above metal salts or metal complex salts to an aqueous solution containing a dispersion stabilizer, then further adding a reducing agent to the solution to make metal colloids, and then removing unnecessary salts.

As the dispersion stabilizers for use in the present invention, carboxylic acid such as citric acid and oxalic acid and the salts thereof, and polymers such as PVP, PVA, gelatin and acrylate resin can be used.

As the reducing agents for use in the present invention, base metal salts such as $FeSO_4$ and $SnSO_4$, boron hydride compounds, formaldehyde, dextrin, glucose, Rochelle salt, tartaric acid, sodium thiosulfate, and hypophosphite can be exemplified.

The metal colloids for use in the present invention have an average particle size of from 1 to 500 nm, preferably from 1 to 100 nm, and more preferably from 1 to 50 nm. The degree of dispersion of the metal colloids may be polydispersion but is preferably monodispersion having a variation coefficient of 30% or less.

As the method for removing salts, an ultrafiltration method and a method of adding methanol/water or ethanol/water to colloidal dispersion and allowing to precipitate naturally or centrifugally, and then removing the supernatant can be used in the present invention.

When light/heat converting agents are organic light/heat converting agents, they can be added to the image-drawing layer (heat-sensitive layer) in an amount up to 30 wt %, preferably from 5 to 25 wt %, and particularly preferably from 7 to 20 wt %, based on the entire solid contents of the heat-sensitive layer.

When light/heat converting agents are metallic fine particle light/heat converting agents, the addition amount of them is 5 wt % or more, preferably 10 wt % or more, and particularly preferably 20 wt % or more, based on the entire solid contents of the heat-sensitive layer. When the addition amount is less than 5 wt %, sensitivity is low.

Various other compounds besides the above-described compounds may further be added to the image-drawing layer (heat-sensitive layer) of the present invention, if necessary. For example, polyfunctional monomers may be added to the heat-sensitive layer matrix. The monomers described above to be added to microcapsules can be used as the polyfunctional monomers. As the particularly preferred monomer, trimethylolpropane triacrylate can be exemplified.

Further, it is preferred to use a small amount of a thermal polymerization inhibitor for inhibiting unnecessary thermal polymerization of the ethylenically unsaturated compounds during production or storage of the coating solution of the heat-sensitive layer. Examples of suitable thermal polymerization inhibitors include hydroquinone, p-methoxyphenol, di-t-butyl-p-cresol, pyrogallol, t-butyl-catechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt. The addition amount of the thermal polymerization inhibitors is preferably from about 0.01% to about 5% based on the weight of the entire compositions.

Further, if necessary, higher fatty acid and derivatives thereof such as behenic acid and behenic acid amide may be added and distributed locally on the surface of the heat-sensitive layer during drying process after coating with a view to preventing the hindrance of the polymerization due to the oxygen. The addition amount of the higher fatty acid and derivatives thereof is preferably from about 0.1 wt % to about 10 wt % of the entire solid contents of the heat-sensitive layer.

The image-drawing layer (heat-sensitive layer) of the present invention may contain, if necessary, plasticizers for the purpose of improving the flexibility of the film, e.g., polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, etc., can be used.

An ink-receptive layer of the lithographic printing plate precursor according to the present invention can be generally manufactured by dissolving the above-described each component in a solvent and coating the coating solution on an appropriate support coated with a layer containing a latex. Examples of the solvents used here include tetrahydrofuran, ethylene dichloride, cyclohexanone, methyl ethyl ketone, acetone, methanol, ethanol, propanol, ethylene glycol monomethyl ether, ethylene glycol monoethyl ether, 2-methoxy-ethyl acetate, diethylene glycol dimethyl ether, 1-methoxy-2-propanol, 1-methoxy-2-propyl acetate, dimethoxyethane, N,N-dimethylformamide, N,N-dimethylacetamide, toluene, ethyl acetate, ethyl lactate, methyl lactate, dimethyl sulfoxide, water, sulfolane, g-butyrolactone, etc., but solvents are not limited thereto.

These solvents are used alone or as mixture. When a coating solution is prepared, the concentration of the above constitutional components of an ink-receptive layer (total solid contents inclusive of the additives) in a solvent is preferably from 1 to 50 wt %.

Various coating methods can be used, e.g., bar coating, rotary coating, spray coating, curtain coating, dip coating, air knife coating, blade coating, and roll coating can be used.

Surfactants, e.g., fluorine surfactants disclosed in JP-A-62-170950, can be added to an ink-receptive layer of the lithographic printing plate precursor according to the present invention for improving the coating property. The addition amount is preferably from 0.01 to 1 wt %, more preferably from 0.05 to 0.5 wt %, of the total solid contents of an ink-receptive layer.

The coating amount of an ink-receptive layer obtained after coating and drying (solid contents) varies according to purposes, but the coating amount of a general lithographic printing plate precursor is preferably from 0.5 to 5.0 $g/m^2$, more preferably from 0.5 to 1.5 $g/m^2$. If the coating amount is smaller than this range, an apparent sensitivity becomes large, but film characteristics of the ink-receptive layer that plays a function of image recording decrease.

Acid Generating Agent

When the lithographic printing plate precursor according to the present invention is used for image-forming by laser exposure, it is preferred to add a compound which generates an acid by light or heat (hereinafter referred to as an acid generating agent) to a layer containing a latex and a recording layer (a layer containing a polarity converting high molecular weight compound or an alkali aqueous solution-soluble resin and a crosslinkable compound) of the lithographic printing plate precursor. However, the above-described polarity converting high molecular weight compound itself sometimes generates acid by light and exhibits the function of acid generating agent. In such a case, since an image can be formed without using any other acid generating agent, an acid generating agent is not essential.

As the acid generating agent, the following well-known compounds can be used in the present invention.

For instance, onium salts, such as a diazonium salt, an ammonium salt, a phosphonium salt, an iodonium salt, a selenonium salt, and an arsonium salt, an organic halide, an organic metal/organic halide, light-acid generating agents having an o-nitrobenzyl type protective group, compounds which generate a sulfonic acid by photolysis represented by iminosulfonate, disulfone compounds, o-naphthoquinonediazido-4-sulfonic acid halide, and o-naphthoquinonediazide compounds can be exemplified.

As other acid generating agents, cyclohexylcitrate, sulfonic acid alkyl esters, such as p-acetoaminobenzenesulfonic acid cyclohexyl ester, and p-bromobenzenesulfonic acid cyclohexyl ester, and the alkylsulfonate represented by the following formula disclosed in JP-A-10-282672 applied for by the present inventors, can be used.

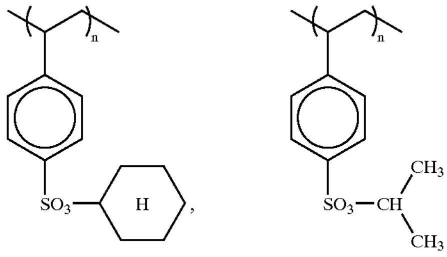

Of the above compounds which generate an acid due to decomposition by light, heat or radiant ray irradiation, particularly useful compounds are described below. (1) An oxazole derivative represented by the following formula (PAG1) substituted with a trihalomethyl group and an S-triazine derivative represented by formula (PAG2):

(PAG1)

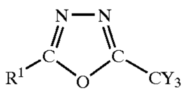

(PAG2)

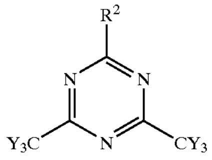

wherein $R^1$ represents a substituted or unsubstituted aryl or alkenyl group; $R^2$represents a substituted or unsubstituted aryl, alkenyl or alkynyl group, or $—CY_3$; and Y represents a chlorine atom or a bromine atom.

Specifically, the following compounds can be exemplified but the present invention is not limited thereto.

(PAG1-1)

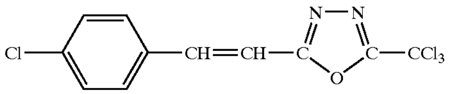

(PAG1-2)

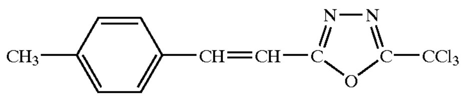

(PAG2-1)

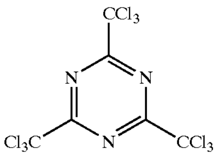

(PAG2-2)

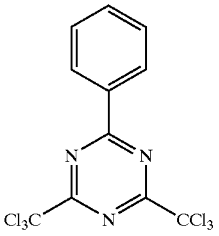

(PAG2-3)

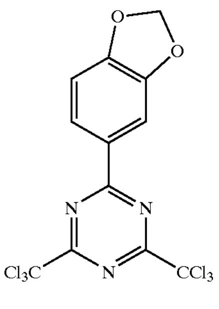

-continued (PAG2-4)

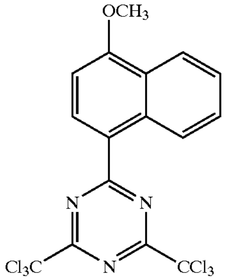

(PAG2-5)

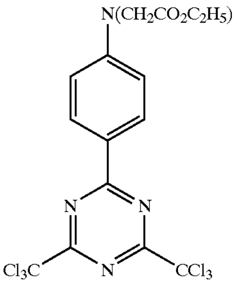

(2) An iodonium salt represented by the following formula (PAG3), and a sulfonium salt or a diazonium salt represented by formula (PAG4):

(PAG3)

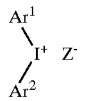

(PAG4)

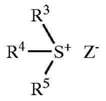

wherein $Ar^1$ and $Ar^2$ each represents a substituted or unsubstituted aryl group. As preferred substituents, an alkyl group, a haloalkyl group, a cycloalkyl group, an aryl group, an alkoxyl group, a nitro group, a carboxyl group, an alkoxycarbonyl group, a hydroxyl group, a mercapto group and a halogen atom can be exemplified.

$R^3$, $R^4$ and $R^5$ each represents a substituted or unsubstituted alkyl or aryl group, preferably an aryl group having from 6 to 14 carbon atoms, an alkyl group having from 1 to 8 carbon atoms, and substitution derivatives thereof. Preferred substituents of the aryl group include an alkoxyl group having from 1 to 8 carbon atoms, an alkynyl group having from 1 to 8 carbon atoms, a nitro group, a carboxyl group, a hydroxyl group and a halogen atom. Preferred substituents of the alkyl group include an alkoxyl group having from 1 to 8 carbon atoms, a carboxyl group, and an alkoxycarbonyl group.

$Z^-$represents a counter anion, for example, perfluoroalkanesulfonic acid anion, such as $BF_4^-$, $AsF_6^-$, $PF_6^-$, $SbF_6^-$, $SiF_6^-$, $ClO_4^-$, $CF_3SO_3^-$; combined polynuclear aromatic sulfonic acid anion, such as pentafluorobenzenesulfonic acid anion, and naphthalene-1-sulfonic acid anion; anthraquinonesulfonic acid anion; and sulfonic acid group-containing dyes can be exemplified, but the present invention is not limited thereto.

Further, two of $R^3$, $R^4$and $R^5$ and $Ar^1$ and $Ar^2$ may be bonded via respective single bonds or substituents.

Specific examples thereof are shown below but the present invention is not limited thereto.

(PAG3-1)

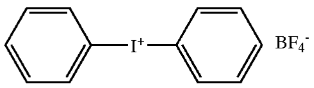

(PAG3-2)

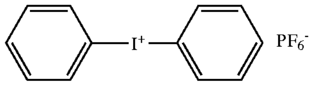

(PAG4-1)

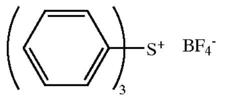

(PAG4-2)

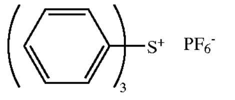

(PAG4-3)

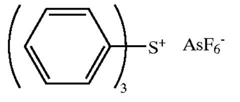

Onium salts represented by formulae (PAG3) and (PAG4) are well known and can be synthesized according to the methods described, for example, in W. Knapczyk et al., *J. Am. Chem. Soc.,* 91, 145 (1969), A. L. Maycok et al., *J. Org. Chem.,* 35, 2532 (1970), B. Goethas et al., *Bull. Soc. Chem. Belg.,* 73, 546 (1964), H. M. Leicester, *J. Ame. Chem. Soc.,* 51, 358 (1929), J. V. Crivello et al., *J. Polym. Chem. Ed.,* 18, 2677 (1980), U.S. Pat. Nos. 2,807,648, 4,247,473, and JP-A-53-101331. (3) A disulfone derivative represented by formula (PAG5) and an iminosulfonate derivative represented by formula (PAG6):

(PAG5)

$$Ar^3—SO_2—SO_2—Ar^4$$

(PAG6)

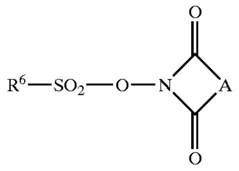

wherein $Ar^3$ and $Ar^4$ each represents a substituted or unsubstituted aryl group; $R^6$ represents a substituted or unsubstituted alkyl or aryl group; A represents a substituted or unsubstituted alkylene, alkenylene or arylene group.

Specific examples are shown below but the present invention is not limited thereto.

(PAG5-1)

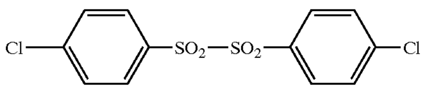

(PAG5-2)

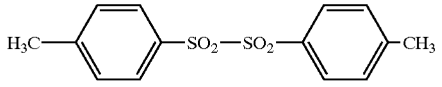

-continued (PAG6-1)

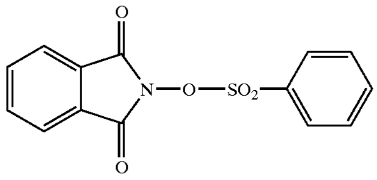

(PAG6-2)

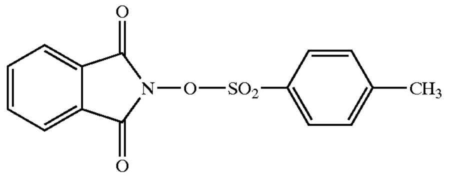

The content of these acid generating agents is generally from 0.01 to 50 wt %, preferably from 0.1 to 40 wt %, and more preferably from 0.5 to 30 wt %, based on the total solid contents of the image-forming layer of the lithographic printing plate precursor according to the present invention.

When an acid generating agent is added to a latex-containing layer, the acid generating agent is added to the coating solution of a latex-containing layer which contains a high molecular weight electrolyte precursor, the coating solution is coated on a support described later, the coated layer is subjected to whole image exposure and heating to cause the function of the acid generating agent, thereby a latex-containing layer is formed.

Accordingly, the acid generating agent loses its activity after a latex-containing layer has been formed even before image recording of the lithographic printing plate precursor. Therefore, this acid generating agent is used as the acid generating agent having different role from that contained in a recording layer.

Sensitizing Dye

When an acid generating agent to be added to an ink-receptive layer containing a positive type polarity converting high molecular weight compound does not have sensitivity to the wavelength of ultraviolet region to visible ray region, various dyes are used to activate the acid generating agent to the light of ultraviolet region to visible ray region.

Examples of such sensitizing dyes preferably used in the present invention include a pyran-based dye, a cyanine dye, a squarylium dye, a merocyanine dye, a pyrylium dye, Michler's ketone, thioxanthone, a ketocoumarin dye, and 9-phenylacridine. Besides these sensitizing dyes, polycyclic aromatic compounds, e.g., a bisbenzylidene ketone dye and 9,10-diphenylanthracene, can be used.

As other component, e.g., dyes having large absorption in visible ray region can be used as the coloring agents of an image in order to make easy to distinct the image area and the non-image area after image formation.

Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.), Victoria Pure Blue, Crystal Violet (C.I. 42555), Methyl Violet (C.I. 42535), Ethyl Violet, Rhodamine B (C.I. 145170B), Malachite Green (C.I. 42000), and Methylene Blue (C.I. 52015) can be exemplified. Further, dyes disclosed in JP-A-62-293247 are can also be used.

The addition amount of these dyes is from 0.01 to 10 wt % based on the total solid contents of the ink-receptive layer of the lithographic printing plate precursor according to the present invention.

Surfactant

Nonionic surfactants as disclosed in JP-A-62-251740 and JP-A-3-208514, and ampholytic surfactants as disclosed in JP-A-59-121044 and JP-A-4-13149 can be added to a latex-containing layer of the lithographic printing plate precursor of the present invention for the purpose of widening the stability to printing conditions.

Specific examples of nonionic surfactants include sorbitan tristearate, sorbitan monopalmitate, sorbitan trioleate, stearic acid monoglyceride, polyoxyethylenenonylphenyl ether, etc.

Specific examples of ampholytic surfactants include alkyldi(aminoethyl)glycine, alkylpolyaminoethylglycine hydrochloride, 2-alkyl-N-carboxyethyl-N-hydroxyethylimidazolinium betaine, and N-tetradecyl-N,N-betaine type surfactants (e.g., Amorgen K, trade name, Daiichi Kogyo Seiyaku Co., Ltd.), etc.

The content of nonionic and ampholytic surfactants in the total solid contents of the latex-containing layer is preferably from 0.05 to 15 wt %, more preferably from 0.1 to 5 wt %.

Support

A support (a substrate) for use in a lithographic printing plate precursor, on which a layer containing a latex (layer A) and an ink-receptive layer (layer B) are coated, is a plate having dimensional stability, and any of well-known supports so far been used as a support of lithographic printing plate can be preferably used. Examples of such supports include paper; paper laminated with plastics (e.g., polyethylene, polypropylene, polystyrene); metal plates, e.g., aluminum (including aluminum alloys), zinc, iron, and copper; plastic films, e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, and polyvinyl acetal; and paper or plastic films laminated or deposited with metals as above; and an aluminum plate is particularly preferably used. Aluminum plates include a pure aluminum plate and an aluminum alloy plate. Various aluminum alloys can be used, e.g., alloys of aluminum with metals such as silicon, copper, manganese, magnesium, chromium, zinc, lead, bismuth, or nickel. These alloy compositions include a negligible amount of impurities in addition to a certain amount of iron and titanium.

A support is subjected to surface treatment, if necessary. For example, in the case of a lithographic printing plate precursor, the surface of the support is subjected to hydrophilization treatment prior to coating of a layer containing a latex (layer A) and an ink-receptive layer (layer B).

In the case of a metal support, in particular, a support having an aluminum surface, it is preferred to perform surface treatment such as surface graining treatment, immersion treatment in an aqueous solution of sodium silicate, potassium fluorozirconate, phosphate, etc., or anodizing treatment. Further, as disclosed in U.S. Pat. No. 2,714,066, an aluminum plate subjected to immersion treatment in an aqueous sodium silicate solution after surface graining treatment, or an aluminum plate subjected to immersion treatment in an aqueous solution of alkali metal silicate after anodizing treatment as disclosed in U.S. Pat. No. 3,181,461 are also preferably used. Anodizing treatment is carried out by turning on electricity with the aluminum plate being the anode in an electrolytic solution comprising alone or combination of two or more of an aqueous solution or nonaqueous solution of an inorganic acid such as phosphoric acid, chromic acid, sulfuric acid, boric acid, etc., or an organic acid such as oxalic acid, sulfamic acid, etc., or salts of these acids.

Electrodeposition of silicate as disclosed in U.S. Pat. No. 3,658,662 is also useful.

These hydrophilization treatments are conducted for preventing harmful reactions of a support with the layer containing a latex provided on the support, or for improving the adhesion of the support with the latex-containing layer, besides making the support surface hydrophilic.

Prior to surface roughening of an aluminum plate by graining, if desired, the surface of an aluminum plate may be subjected to pre-treatment to remove a rolling oil from the plate surface or to expose clean aluminum plate surface. In general, solvents such as trichlene and surfactants are used in degreasing treatment for removing a rolling oil, and alkali etching agents, e.g., sodium hydroxide and potassium hydroxide are widely used for exposing clean surface.

As surface graining methods, any of mechanical, chemical and electrochemical methods can be used. Mechanical methods include a ball abrading method, a blasting method, and a brushing method in which water dispersion slurry of an abrasive such as pumice or the like is rubbed on the surface of a plate with a nylon brush. As a chemical method, a method of immersion in a saturated aqueous solution of an aluminum salt of a mineral acid as disclosed in JP-A-54-31187 is preferred, and as an electrochemical method, a method of performing alternating current electrolysis in an acid electrolytic solution of hydrochloric acid, nitric acid or combination of these acids can be exemplified as preferred method. Of these surface roughening methods, a method of combining mechanical roughening with electrochemical roughening as disclosed in JP-A-55-137993 is preferred because strong adhesion of a latex-containing layer and a sensitized image to the support can be obtained.

Surface graining as described above is preferably performed so as to reach the center line surface roughness (Ra) of the surface of an aluminum plate of from 0.3 to 1.0 $\mu$m. The aluminum plate thus surface treated is subjected to washing and chemical etching, if necessary.

An etching solution is generally selected from among aqueous solutions of base or acid for dissolving aluminum. In this case, an etching solution is selected such that a film different from the aluminum derived from the ingredient of the etching solution is not formed on the etched surface. Examples of preferred etching agent include, as basic substances, sodium hydroxide, potassium hydroxide, trisodium phosphate, disodium phosphate, tripotassium phosphate, and dipotassium phosphate; and as acid substances, sulfuric acid, persulfuric acid, phosphoric acid, hydrochloric acid and salts thereof. Salts of metals having a lower tendency to ionization than that of aluminum, e.g., zinc, chromium, cobalt, nickel, and copper are not preferred because an unnecessary film is formed on the etched surface.

The concentration and temperature of these etching agents are most preferably set up such that the dissolution rate of the aluminum or alloy to be used falls within the range of from 0.3 to 40 $g/m^2$ per immersion time of one hour, but those lower than that or higher than that may be used.

Etching is performed by immersing an aluminum plate in an etching solution or coating the etching solution on the aluminum plate, and the etching is preferably carried out so that the amount of etching becomes from 0.5 to 10 $g/m^2$.

Since the etching speed is fast with the above etching agents, it is preferred to use a basic aqueous solution. In this case, as smutting is generated, desmutting treatment is generally performed. As acids for use in desmutting treatment, nitric acid, sulfuric acid, phosphoric acid, chromic acid, hydrofluoric acid, borofluoric acid, etc., are used.

The etching-treated aluminum plate is washed and anodized, if necessary. Anodization can be effected by methods so far been used in this field. Specifically, by applying a direct or alternating electric current to an aluminum plate in an aqueous solution or nonaqueous solution comprising single or combination of two or more of sulfuric acid, phosphoric acid, chromic acid, oxalic acid, sulfamic acid, or benzenesulfonic acid, an anodic oxide film can be formed on the surface of the aluminum support.

Treatment conditions of anodization cannot be determined unconditionally as conditions fluctuate variously depending upon the electrolytic solution to be used, but generally appropriately the concentration of an electrolytic solution is from 1 to 80 wt %, temperature is from 5 to 70° C., electric current density is from 0.5 to 60 ampere/$dm^2$, voltage is from 1 to 100 V, and electrolytic time is from 30 seconds to 5 minutes.

Of these anodizing treatments, a method of effecting anodization in sulfuric acid at high electric current density as disclosed in British Patent 1,412,768, and a method of effecting anodization with phosphoric acid as the electrolytic bath as disclosed in U.S. Pat. No. 3,511,661 are particularly preferred.

The thus surface roughened and anodized aluminum plate may be hydrophilized, if necessary. As preferred examples of hydrophilization treatments, there are methods of treatment with alkali metal silicate, e.g., an aqueous solution of sodium silicate as disclosed in U.S. Pat. Nos. 2,714,066 and 3,181,461, treatment with potassium fluorozirconate as disclosed in JP-B-36-22063 (the term "JP-B" as used herein means an "examined Japanese patent publication"), and with polyvinylsulfonic acid as disclosed in U.S. Pat. No. 4,153, 461.

Other Layer

The back surface of a support is provided with a back coating layer, if necessary. Coating layers comprising a metallic oxide obtained by hydrolyzing and polycondensing the organic high molecular weight compounds disclosed in JP-A-5-45885 and the organic or inorganic metal compounds disclosed in JP-A-6-35174 are preferably used as such a back coating layer.

Of these coating layers, alkoxyl compounds of silicon such as $Si(OCH_3)_4$, $Si(OC_2H_5)_4$, $Si(OC_3H_7)_4$, $Si(OC_4H_9)_4$ are inexpensive and easily available, and coating layers of the metallic oxides obtained from these compounds are excellent in hydrophilic property and particularly preferred.

Plate-Making Method

The method of making a lithographic printing plate from the lithographic printing plate precursor according to the present invention will be described. Heat-sensitive recording is performed directly imagewise on the lithographic printing plate precursor by means of a thermal recording head, or recording is effected by imagewise exposure with light.

As the light sources of activation light used for image exposure, e.g., a mercury lamp, a metal halide lamp, a xenon lamp, a chemical lamp, and a carbon arc lamp are used. Radial rays include electron beams, X-rays, ion beams, and far infrared rays. Further, g-rays, i-rays, Deep-UV rays, high density energy beams (laser beams) are also used. As laser beams, a helium-neon laser, an argon laser, a krypton laser, a helium-cadmium laser, a KrF eximer laser, a solid state laser and a semiconductor laser can be used.

A solid state laser and a semiconductor laser emitting infrared rays of the wavelength of from 760 to 1,200 nm are particularly preferably used in the present invention.

Even when development is performed or not performed after the above image recording by light, it is preferred to perform heat treatment from the viewpoint of the improvement of sensitivity at recording. Heating is preferably performed at 80 to 160° C. for 10 seconds to 5 minutes. By performing this heat treatment, the energy required for recording can be reduced at exposure with the above each light source.

After image recording by the above method, the lithographic printing plate precursor of the present invention undergoes development with a developing solution, and further, if necessary, subjected to gumming and burning treatment. The thus-obtained printing plate can be installed on a printing machine and printing can be effected. Further, when a lithographic printing plate precursor having a recording layer containing a polarity converting high molecular weight compound is used, the printing plate can be installed on a printing machine immediately after image recording to perform printing without undergoing a development process. In this case, the heated area or exposed area is swelled by a fountain solution and the swollen part is removed at initial stage of printing, thereby a lithographic printing plate is formed. That is, in the plate-making method using the lithographic printing plate precursor according to the present invention, plate-making can be effected without undergoing development and other treratments by selecting an appropriate ink-receptive layer.

When a layer containing an alkali aqueous solution-soluble resin or a layer containing an alkali aqueous solution-soluble resin and a crosslinkable compound is used as the ink-receptive layer of the lithographic printing plate precursor of the present invention, a wet development process is necessary.

Alkali aqueous solutions so far been known and pure water can be used as a developing solution and a replenisher in this wet process. For example, inorganic alkali salts of sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, and lithium hydroxide can be exemplified. Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine are also used.

These alkali agents are used alone or in combination of two or more.

Of these alkali agents, a particularly preferred developing solution is an aqueous solution of silicate such as sodium silicate and potassium silicate for the reason that the adjustment of developing property becomes possible by the ratio of silicon oxide $SiO_2$, the component of silicate, to alkali metal oxide $M_2O$ and the concentrations. For example, alkali metal silicates as disclosed in JP-A-54-62004 and JP-B-57-7427 are effectively used.

It is known that when development is performed by using an automatic processor, a vast volume of PS plates can be processed without replacing a developing solution in a developing tank for a long period of time by adding a replenisher having higher alkalinity than that of the developing solution to the developing solution. This replenishing system can be preferably applied to the present invention. The developing solution and the replenisher can contain various surfactants and organic solvents according to necessity for the purpose of expediting or controlling development, dispersing developer scum, and increasing the affinity of the image area of a printing plate to ink. As preferred surfactants, anionic, cationic, nonionic, and ampholytic surfactants can be exemplified.

Further, a developing solution and a replenisher can contain reducing agents such as hydroquinone, resorcin, sodium salts and potassium salts of inorganic acid such as sulfurous acid, hydrogensulfurous acid, and further organic carboxylic acid, defoaming agents, and water softeners, if necessary.

The printing plate having been subjected to development process with the above-described developing solution and the replenisher is post-treated with a washing water, a rinsing water containing surfactants, and a desensitizing solution containing gum arabic and starch derivatives. When an image is recorded on the lithographic printing plate precursor of the present invention having a latex-containing layer and an ink-receptive layer and the printing plate precursor is used as a printing plate, these treatments can be used in various combinations as post-treatment.

In recent years, an automatic processor is used prevailingly in the plate-making/printing industry for the purpose of rationalization and standardization of plate-making work. Such an automatic processor generally consists of a development part and a post-treatment part and equipped with a unit for conveying a printing plate, processing solution tanks, and spraying unit. Development is effected by spraying each processing solution pumped up to the printing plate by means of a spray nozzle while conveying the exposed printing plate horizontally. A method of development processing a printing plate while conveying the printing plate immersed in a processing solution tank filled with a processing solution by means of guide roll-in-liquid is also known. In such automatic processing, processing can be carried out with replenishing each replenisher to each processing solution corresponding to the processing amount, the operating time, etc.

Moreover, a nonreturnable system in which processing is performed with substantially a virgin solution is also applicable.

The lithographic printing plate precursor of the present invention having a latex-containing layer and an ink-receptive layer is subjected to image exposure, development, washing and/or rinsing and/or gumming to thereby obtain a printing plate. If an unnecessary image area (e.g., the film edge trace of the original film) is present on the thus-obtained lithographic printing plate, the unnecessary image area is erased. For this erasure, a method of coating an erasing solution on the unnecessary image area, allowing to stand for predetermined time, and then washing with water as disclosed in JP-A-2-13293 is preferably used, and a method of irradiating the unnecessary image area with an activation light introduced by an optical fiber and then performing development as disclosed in JP-A-59-174842 is also utilized.

EXAMPLES

The present invention is described in detail below with reference to the specific examples, but it should not be construed as the present invention is limited thereto.

Synthesis of Latex Solution (1)

Eight (8) grams of the following monomer (1), 1 g of divinylbenzene, and 0.45 g of sodium dodecylsulfate were put in a three necked flask having a capacity of 1,000 ml, the content of the flask was dissolved with 28 g of distilled water and stirred under nitrogen flow with maintaining the temperature at 65° C. for 30 minutes. A solution obtained by dissolving 18.6 mg of 2,2'-azobis(2-amidinopropane) dihydrochloride in 2 g of distilled water was added to the above solution and stirring was continued at the same temperature for 6 hours. After termination of the reaction, the reaction mixture was filtrated through a glass filter, thereby latex solution (1) was obtained. The concentration of the solid contents of the thus-obtained latex solution (1) was 20 wt % and the average particle size of the latex was 87 nm.

Monomer (1)

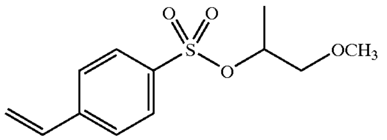

Synthesis of Latex Solution (2)

Three hundred (300) milliliter of distilled water, 10 g of a dispersant Trax H-45 (manufactured by Nippon Oils and Fats Co., Ltd.), and 104.4 g of a mixture comprising styrene/chloromethylstyrene/divinylbenzene (molar ratio: 44/44/12) were put in a three necked flask having a capacity of 500 ml, the content of the flask was heated to 60° C., followed by stirring under nitrogen flow for 30 minutes. A solution obtained by dissolving 0.8 g of potassium persulfate in 15 ml of distilled water was added to the above solution, and 1 minute after, a solution obtained by dissolving 0.25 g of sodium hydrogensulfite in 5 ml of distilled water was added to the above reaction solution and stirring was continued at the same temperature for 6 hours. After 6 hours, the reaction mixture was filtrated through a glass filter, 350 g of distilled water and 140 g of isopropanol were added to the obtained filtrate, 36.14 g of triethylamine was dropwise added thereto over 30 minutes, and the reaction mixture was stirred at 60° C. for 6 hours. The reaction mixture obtained was filtrated through a glass filter, and the filtrate was subjected to dialysis for 24 hours (distilled water was exchanged two times) to thereby remove the remaining monomer and unreacted triethylamine. Subsequently, the reaction solution was poured into a beaker having a capacity of 2 liters, heated at 85° C. for 30 minutes, then cooled to room temperature, and then 200 ml of saturated brine was dropwise added to the solution over 30 minutes to coagulate the latex. The coagulated latex was filtrated through a glass filter, the filtrated latex was thoroughly washed with distilled water, and dried under reduced pressure, thereby a colorless latex was obtained as powder. The average particle size of the obtained latex was 78 nm. Ten (10) grams of the latex and 40 g of AR were put in a plastic container, 2 g of glass beads were added to the container, and the content of the container was shaken well with a paint shaker for 1 hour, thus latex solution (2) was obtained.

Synthesis of Latex Solution (3)

9.2 Grams of sodium dodecysulfate and 1200 ml of distilled water were put in a three necked flask having a capacity of 1,000 ml, and the content of the flask was stirred under nitrogen flow at 75° C. for 10 minutes. A solution obtained by mixing 0.462 g of patassium persulfate, 11.3 ml of distilled water and 3.5 ml of a saturated aqueous solution of sodium hydrogencarbonate were added to the above solution, and a solution obtained by mixing a mixed solution of 113.76 g of t-butylmethacrylate and 39.65 g of ethylene glycol dimethacrylate, 0.462 g of potassium persulfate, 14.2 ml of distilled water and 3.5 ml of a saturated aqueous solution of sodium hydrogencarbonate was added dropwise over 3 hours. After completion of dropwise additiion, stirring was further continued for 1 hour. Reaction mixture thus obtained was cooled to room temperature, and was filtrated through a glass filter, thereby latex solution (2) was obtained. The concentration of of the solid contents of the thus-obtained latex solution (3) was 11 wt % and the average particle size of the latex was 21 nm.

Preparation of Aluminum Plate S-1 Having Layer A

A 1050 aluminum plate having a thickness of 0.30 mm was degreased with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 g/m$^2$. The plate was anodized by direct current with a 7% sulfuric acid aqueous solution as the electrolytic solution at electric density of 15 A/dm$^2$. The anodic oxide film obtained was 3 g/m$^2$. The plate was then washed with water and dried. The aluminum plate was then immersed in a 2.5 wt % sodium silicate aqueous solution (70° C.) for 14 seconds, washed with water and dried.

Solution (1) shown below was coated on the thus-treated aluminum plate by a rod bar and dried at 100° C. for 3 minutes, thus aluminum plate S-1 having layer A was prepared. The coating weight of the solid contents at this time was 0.2 g/m$^2$.

| Solution (1) | |
|---|---|
| Latex solution (1) | 10 g |
| Distilled water | 41.282 g |

Preparation of Aluminum Plate S-2 Having Layer A

An aluminum plate was subjected to the same treatments as in the preparation of aluminum plate S-1 having layer A, and solution (2) as described below was coated on the thus-treated aluminum plate by a rod bar, and the coated layer was dried at 80° C. for 3 minutes, thus aluminum plate S-2 having layer A was prepared. The coating weight of the solid contents at this time was 0.2 g/m$^2$.

| Solution (2) | |
|---|---|
| Latex solution (2) | 10 g |
| Acetonitrile | 41.282 g |

Preparation of Aluminum Plate S-3 Having Layer A

An aluminum plate was subjected to the same treatments as in the preparation of aluminum plate S-1 having layer A, and solution (3) as described below was coated on the thus-treated aluminum plate by a rod bar, and the coated layer was dried at 100° C. for 3 minutes, thus aluminum plate S-3 having layer A was prepared. The coating weight of the solid contents at this time was 0.5 g/m$^2$.

| Solution (3) | |
|---|---|
| Latex solution (3) | 9.0 g |
| Sodium polyacrylate | 0.2 g |
| Distilled water | 24.13 g |

Preparation of Aluminum Plate S-4 Having Layer A

An aluminum plate was subjected to the same treatments as in the preparation of aluminum plate S-1 having layer A, and solution (4) as described below was coated on the thus-treated aluminum plate by rotary coating at a rotating speed of 150 rpm, and the coated layer was dried at 80° C. for 3 minutes, thus aluminum plate S-4 having layer A was prepared. The coating weight of the solid contents at this time was 0.3 g/m$^2$.

| Solution (4) | |
|---|---|
| Latex solution (2) | 10 g |
| Infrared absorber (1) | 0.1 g |
| Acetonitrile | 28.9 g |

Infrared Absorber (1)

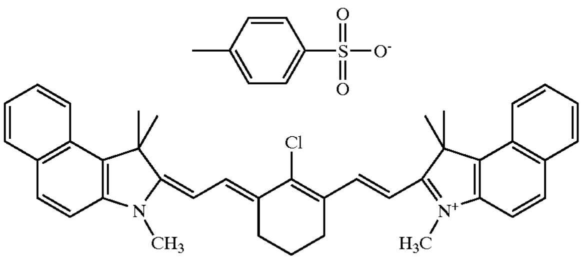

Infrared Absorber (2)

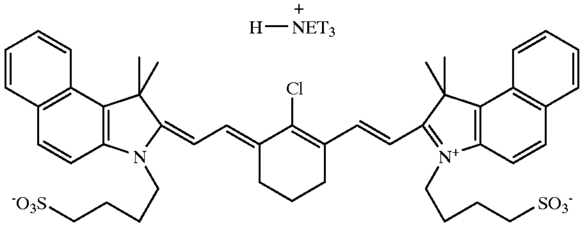

Infrared Absorber (3)

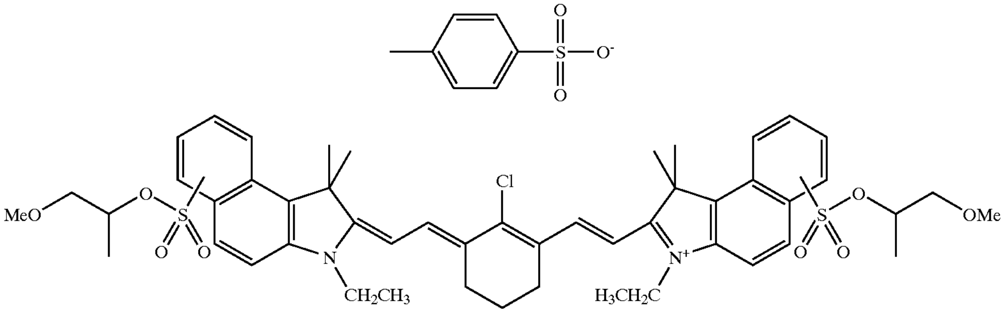

Preparation of Aluminum Plate S-5 Having Layer A

An aluminum plate was subjected to the same treatments as in the preparation of aluminum plate S-1 having layer A, and solution (5) as described below was coated on the thus-treated aluminum plate by rotary coating at a rotating speed of 150 rpm, and the coated layer was dried at 100° C. for 3 minutes, thus aluminum plate S-5 having layer A was prepared. The coating weight of the solid contents at this time was 0.15 g/m$^2$.

| Solution (5) | |
|---|---|
| Latex solution (1) | 9.0 g |
| Sodium polyacrylate | 0.2 g |
| Infrared absorber (2) | 1.0 g |
| Distilled water | 100 g |

Preparation of Aluminum Plate S-6 Having Layer A

An aluminum plate was subjected to the same treatments as in the preparation of aluminum plate S-1 having layer A, and solution (6) as described below was coated on the thus-treated aluminum plate by rotary coating at a rotating speed of 150 rpm, and the coated layer was dried at 130° C. for 3 minutes, thus aluminum plate S-6 having layer A was prepared. The coating weight of the solid contents at this time was 0.20 g/m$^2$.

| Solution (6) | |
|---|---|
| Latex solution (2) | 1.0 g |
| High molecular weight compound (1) | 0.05 g |
| Infrared absorber (3) | 0.2 g |
| Acetonitrile | 48 g |

High Molecular Weight Compound (1)

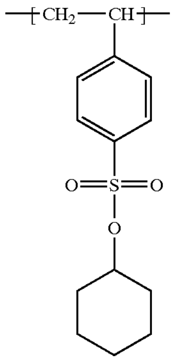

Preparation of Aluminum Plate S-7 Having Layer A

An aluminum plate was subjected to the same treatments as in the preparation of aluminum plate S-1 having layer A, and solution (7) as described below was coated on the thus-treated aluminum plate by a rod bar, and the coated layer was dried at 80° C. for 3 minutes, thus aluminum plate S-7 having layer A was prepared. The coating weight of the solid contents at this time was 0.2 g/m$^2$.

| Solution (7) | |
|---|---|
| Latex solution (7) | 9.0 g |
| Distilled water | 40.5 g |

Preparation of Lithographic Printing Plate Precursor (1)

Solution (A) shown below was coated on the above-prepared aluminum plate S-1 having layer A by a rod bar, and the coated layer was dried at 80° C. for 3 minutes. The dry coating weight was 1.0 g/m$^2$. Thus, lithographic printing plate precursor (1) was obtained.

| Solution (A) | |
|---|---|
| Positive type polarity converting high molecular weight compound (1) | 2.36 g |
| Infrared absorber (1) | 0.47 g |
| Acetonitrile | 30 g |

Positive Type Polarity Converting High Molecular Weight Compound (1)

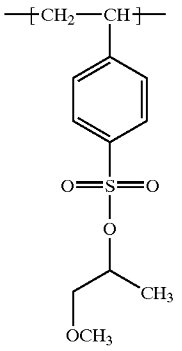

Positive Type Polarity Converting High Molecular Weight Compound (2)

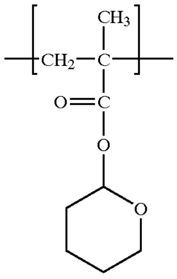

Positive Type Polarity Converting High Molecular Weight Compound (3)

-continued

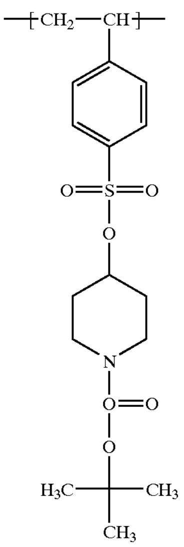

Alkali Aqueous Solution-Soluble High Molecular Weight Compound (1)

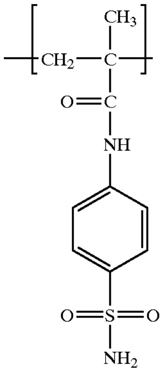

Negative Type Polarity Converting High Molecular Weight Compound (1)

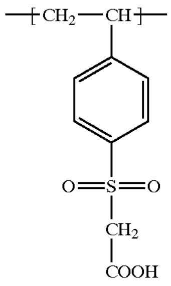

Negative Type Polarity Converting High Molecular Weight Compound (2)

-continued

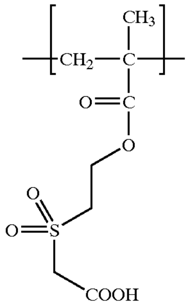

Preparation of Lithographic Printing Plate Precursor (2)

Solution (B) shown below was coated on the above-prepared aluminum plate S-2 having layer A by a rod bar, and the coated layer was dried at 100° C. for 3 minutes. The dry coating weight was 0.8 $g/m^2$. Thus, lithographic printing plate precursor (2) was obtained.

| Solution (B) | |
|---|---|
| Positive type polarity converting high molecular weight compound (2) | 3.65 g |
| Infrared absorber (2) | 0.236 g |
| Acid generating agent Diphenyliodonium anthraquinone sulfonate | 0.10 g |
| Methyl ethyl ketone | 30 g |
| 1-Methoxy-2-propanol | 18 g |

Preparation of Lithographic Printing Plate Precursor (3)

Solution (C) shown below was coated on the above-prepared aluminum plate S-3 having layer A by a rod bar, and the coated layer was dried at 100° C. for 3 minutes. The dry coating weight was 1.0 $g/m^2$. Thus, lithographic printing plate precursor (3) was obtained.

| Solution (C) | |
|---|---|
| Positive type polarity converting high molecular weight compound (3) | 2.36 g |
| Infrared absorber (3) | 0.47 g |
| Methyl ethyl ketone | 30 g |

Preparation of Lithographic Printing Plate Precursor (4)

Solution (D) shown below was coated on the above-prepared aluminum plate S-4 having layer A by rotary coating at a rotating speed of 150 rpm, and the coated layer was dried at 100° C. for 3 minutes. The dry coating weight was 1.0 $g/m^2$. Thus, lithographic printing plate precursor (4) was obtained.

| Solution (D) | |
|---|---|
| Positive type polarity converting high molecular weight compound (2) | 3.65 g |
| Acid generating agent Diphenyliodonium anthraquinone sulfonate | 0.10 g |

-continued

| Solution (D) | |
|---|---|
| Methyl ethyl ketone | 30 g |
| 1-Methoxy-2-propanol | 18 g |

Preparation of Lithographic Printing Plate Precursor (5)

Solution (E) shown below was coated on the above-prepared aluminum plate S-5 having layer A by rotary coating at a rotating speed of 150 rpm, and the coated layer was dried at 80° C. for3minutes. The dry coating weight was 1.2 g/m$^2$. Thus, lithographic printing plate precursor (5) was obtained.

| Solution (E) | |
|---|---|
| Positive type polarity converting high molecular weight compound (1) | 3.65 g |
| Dye (Victoria Pure Blue BOH having 1-naphthalenesulfonic acid as the counter ion) | 0.05 g |
| Acetonitrile | 48 g |

Preparation of Lithographic Printing Plate Precursor (6)

Solution (F) shown below was coated on the above-prepared aluminum plate S-6 having layer A by a rod bar, and the coated layer was dried at 100° C. for 3 minutes. The dry coating weight was 1.5 g/m$^2$. Thus, lithographic printing plate precursor (6) was obtained.

| Solution (F) | |
|---|---|
| Positive type polarity converting high molecular weight compound (3) | 3.65 g |
| Dye (Victoria Pure Blue BOH having 1-naphthalenesulfonic acid as the counter ion) | 0.05 g |
| Methyl ethyl ketone | 30 g |
| 1-Methoxy-2-propanol | 18 g |

Preparation of Lithographic Printing Plate Precursor (7)

Solution (G) shown below was coated on the above-prepared aluminum plate S-1 having layer A by a rod bar, and the coated layer was dried at 100° C. for 3 minutes. The dry coating weight was 1.0 g/m$^2$. Thus, lithographic printing plate precursor (7) was obtained.

| Solution (G) | |
|---|---|
| m,p-Cresol/novolak (high molecular weight compound soluble in an alkali aqueous solution, m/p ratio: 6/4, weight average molecular weight: 3,500, contained 0.5 wt % of unreacted cresol) | 1.0 g |
| Dye (Victoria Pure Blue BOH having 1-naphthalenesulfonic acid as the counter ion) | 0.02 g |
| Fluorine-based surfactant, Megafac F-177 (manufactured by Dainippon Chemicals and Ink Co., Ltd.) | 0.05 g |
| γ-Butyrolactone | 3 g |
| Methyl ethyl ketone | 8 g |
| 1-Methoxy-2-propanol | 7 g |

Preparation of Lithographic Printing Plate Precursor (8)

Solution (H) shown below was coated on the above-prepared aluminum plate S-2 having layer A by a rod bar, and the coated layer was dried at 100° C. for 3 minutes. The dry coating weight was 1.8 g/m$^2$. Thus, lithographic printing plate precursor (8) was obtained.

| Solution (H) | |
|---|---|
| Alkali aqueous solution-soluble high molecular weight compound (1) | 11.0 g |
| Infrared absorber (1) | 0.1 g |
| Dye (Victoria Pure Blue BOH having 1-naphthalenesulfonic acid as the counter ion) | 0.02 g |
| Fluorine-based surfactant, Megafac F-177 (manufactured by Dainippon Chemicals and Ink Co., Ltd.) | 0.05 g |
| γ-Butyrolactone | 8 g |
| Methyl ethyl ketone | 8 g |
| 1-Methoxy-2-propanol | 4 g |

Preparation of Lithographic Printing Plate Precursor (9)

Solution (I) shown below was coated on the above-prepared aluminum plate S-3 having layer A by a rod bar, and the coated layer was dried at 100° C. for 3 minutes. The dry coating weight was 1.5 g/m$^2$. Thus, lithographic printing plate precursor (9) was obtained.

| Solution (I) | |
|---|---|
| m,p-Cresol/novolak (high molecular weight compound soluble in an alkali aqueous solution, m/p ratio: 6/4, weight average molecular weight: 3,500, contained 0.5 wt % of unreacted cresol) | 1.0 g |
| Infrared absorber (2) | 0.2 g |
| Dye (Victoria Pure Blue BOH having 1-naphthalenesulfonic acid as the counter ion) | 0.02 g |
| Fluorine-based surfactant, Megafac F-177 (manufactured by Dainippon Chemicals and Ink Co., Ltd.) | 0.05 g |
| γ-Butyrolactone | 3 g |
| Methyl ethyl ketone | 8 g |
| 1-Methoxy-2-propanol | 7 g |

Preparation of Lithographic Printing Plate Precursor (10)

Solution (J) shown below was coated on the above-prepared aluminum plate S-6 having layer A by a rod bar, and the coated layer was dried at 100° C. for 3 minutes. The dry coating weight was 1.0 g/m$^2$. Thus, lithographic printing plate precursor (10) was obtained.

| Solution (J) | |
|---|---|
| Alkali aqueous solution-soluble high molecular weight compound (1) | 11.0 g |
| Infrared absorber (1) | 0.1 g |
| Dye (Victoria Pure Blue BOH having 1-naphthalenesulfonic acid as the counter ion) | 0.02 g |
| Fluorine-based surfactant, Megafac F-177 (manufactured by Dainippon Chemicals and Ink Co., Ltd.) | 0.05 g |
| γ-Butyrolactone | 8 g |
| Methyl ethyl ketone | 8 g |
| 1-Methoxy-2-propanol | 4 g |

Preparation of Lithographic Printing Plate Precursor (11)

Solution (K) shown below was coated on the above-prepared aluminum plate S-1 having layer A by a rod bar, and the coated layer was dried at 100° C. for 2 minutes. The dry coating weight was 1.1 g/$m^2$. Thus, lithographic printing plate precursor (11) was obtained.

| Solution (K) | |
|---|---|
| Negative type polarity converting high molecular weight compound (1) | 1.0 g |
| Infrared absorber (1) | 0.15 g |
| Fluorine-based surfactant, Megafac F-177 (manufactured by Dainippon Chemicals and Ink Co., Ltd.) | 0.05 g |
| Methyl ethyl ketone | 20 g |
| Methanol | 7 g |

Preparation of Lithographic Printing Plate Precursor (12)

Solution (L) shown below was coated on the above-prepared aluminum plate S-2 having layer A by rotary coating at a rotating speed of 150 rpm, and the coated layer was dried at 100° C. for 2 minutes. The dry coating weight was 1.1 g/$m^2$. Thus, lithographic printing plate precursor (12) was obtained.

| Solution (L) | |
|---|---|
| Negative type polarity converting high molecular weight compound (2) | 1.0 g |
| Infrared absorber (1) | 0.15 g |
| Fluorine-based surfactant, Megafac F-177 (manufactured by Dainippon Chemicals and Ink Co., Ltd.) | 0.05 g |
| Methyl ethyl ketone | 20 g |
| Methanol | 7 g |

Preparation of Lithographic Printing Plate Precursor (13)

Solution (M) shown below was coated on the above-prepared aluminum plate S-3 having layer A by a rod bar, and the coated layer was dried at 100° C. for 2 minutes. The dry coating weight was 1.0 g/$m^2$. Thus, lithographic printing plate precursor (13) was obtained.

| Solution (M) | |
|---|---|
| Negative type polarity converting high molecular weight compound (3) | 1.0 g |
| Infrared absorber (1) | 0.15 g |
| Fluorine-based surfactant, Megafac F-177 (manufactured by Dainippon Chemicals and Ink Co., Ltd.) | 0.05 g |
| Methyl ethyl ketone | 20 g |
| Methanol | 7 g |

-continued

Negative Type Polarity Converting High Molecular Weight Compound (3)

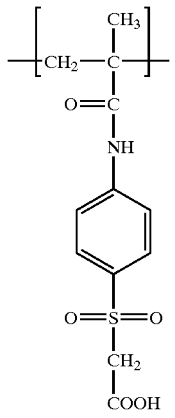

Negative Type Polarity Converting High Molecular Weight Compound (4)

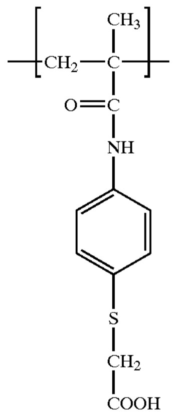

Negative Type Polarity Converting High Molecular Weight Compound (5)

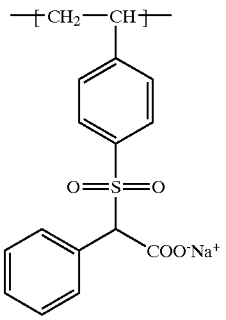

Acid Generating Agent

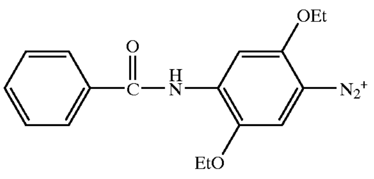

-continued

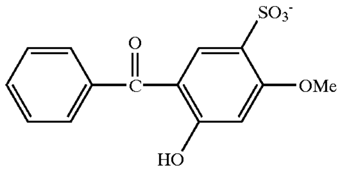

Crosslinking Agent (1)

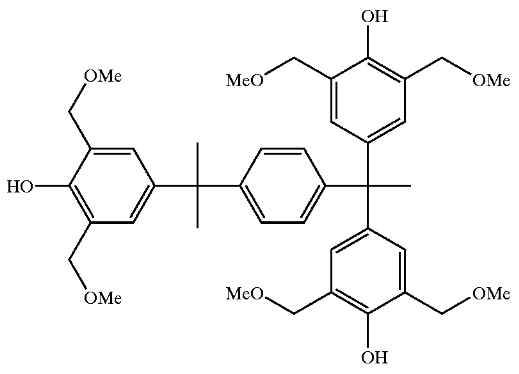

Water-Soluble Polymer (1)

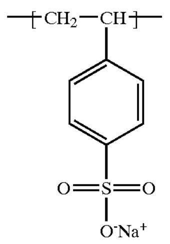

Preparation of Lithographic Printing Plate Precursor (14)

Solution (N) shown below was coated on the above-prepared aluminum plate S-4 having layer A by rotary coating at a rotating speed of 150 rpm, and the coated layer was dried at 100° C. for 2 minutes. The dry coating weight was 1.2 g/$m^2$. Thus, lithographic printing plate precursor (14) was obtained.

| Solution (N) | |
|---|---|
| Negative type polarity converting high molecular weight compound (4) | 1.0 g |
| Fluorine-based surfactant, Megafac F-177 (manufactured by Dainippon Chemicals and Ink Co., Ltd.) | 0.05 g |
| Methyl ethyl ketone | 20 g |
| Methanol | 7 g |

Preparation of Lithographic Printing Plate Precursor (15)

Solution (O) shown below was coated on the above-prepared aluminum plate S-5 having layer A by rotary coating at a rotating speed of 150 rpm, and the coated layer was dried at 100° C. for 2 minutes. The dry coating weight was 1.0 g/$m^2$. Thus, lithographic printing plate precursor (15) was obtained.

| Solution (O) | |
|---|---|
| Negative type polarity converting high molecular weight compound (5) | 1.0 g |
| Dye (Victoria Pure Blue BOH having 1-naphthalenesulfonic acid as the counter ion) | 0.05 g |
| Fluorine-based surfactant, Megafac F-177 (manufactured by Dainippon Chemicals and Ink Co., Ltd.) | 0.05 g |
| Methyl ethyl ketone | 20 g |
| Methanol | 7 g |

Preparation of Lithographic Printing Plate Precursor (16)

Solution (P) shown below was coated on the above-prepared aluminum plate S-4 having layer A by a rod bar, and the coated layer was dried at 100° C. for 1 minute. The dry coating weight was 1.2 g/$m^2$. Thus, lithographic printing plate precursor (16) was obtained.

| Solution (P) | |
|---|---|
| Novolak resin of phenol/formaldehyde (a resin soluble in an alkali aqueous solution, weight average molecular weight: 10,000) | 1.5 g |
| Crosslinking agent (1) | 0.50 g |
| Acid generating agent (1) | 0.15 g |
| Fluorine-based surfactant, Megafac F-177 (manufactured by Dainippon Chemicals and Ink Co., Ltd.) | 0.03 g |
| Methyl ethyl ketone | 15 g |
| 1-Methoxy-2-propanol | 10 g |
| Methanol | 5 g |

Preparation of Lithographic Printing Plate Precursor (17)

Solution (Q) shown below was coated on the above-prepared aluminum plate S-5 having layer A by a rod bar, and the coated layer was dried at 100° C. for 1 minute. The dry coating weight was 1.2 g/$m^2$. Thus, lithographic printing plate precursor (17) was obtained.

| Solution (Q) | |
|---|---|
| Novolak resin of phenol/formaldehyde (a resin soluble in an alkali aqueous solution, weight average molecular weight: 10,000) | 1.5 g |
| Crosslinking agent (1) | 0.50 g |
| Acid generating agent (1) | 0.15 g |
| Fluorine-based surfactant, Megafac F-177 (manufactured by Dainippon Chemicals and Ink Co., Ltd.) | 0.03 g |
| Methyl ethyl ketone | 15 g |
| 1-Methoxy-2-propanol | 10 g |
| Methanol | 5 g |

Preparation of Lithographic Printing Plate Precursor (18)

Solution (R) shown below was coated on the above-prepared aluminum plate S-1 having layer A by rotary coating at a rotating speed of 150 rpm, and the coated layer was dried at100° C. for 1 minute. The dry coating weight was 1.2 $g/m^2$. Thus, lithographic printing plate precursor (18) was obtained.

| Solution (R) | |
|---|---|
| Novolak resin of phenol/formaldehyde (a resin soluble in an alkali aqueous solution, weight average molecular weight: 10,000) | 1.5 g |
| Crosslinking agent (1) | 0.50 g |
| Infrared absorber (1) | 0.10 g |
| Acid generating agent (1) | 0.15 g |
| Fluorine-based surfactant, Megafac F-177 (manufactured by Dainippon Chemicals and Ink Co., Ltd.) | 0.03 g |
| Methyl ethyl ketone | 15 g |
| 1-Methoxy-2-propanol | 10 g |
| Methanol | 5 g |

Preparation of Lithographic Printing Plate Precursor (19)

A 1050 aluminum plate having a thickness of 0.30 mm was degreased with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 $g/m^2$. The plate was anodized by direct current with a 7% sulfuric acid aqueous solution as the electrolytic solution at electric density of 15 $A/dm^2$. The anodic oxide film obtained was 3 $g/m^2$. The plate was then washed with water and dried. The aluminum plate was then immersed in a 2.5 wt % sodium silicate aqueous solution (70° C.) for 14 seconds, washed with water and dried.

Solution (S) shown below was coated on the thus-treated aluminum plate by rotary coating at a rotating speed of 150 rpm, and the coated layer was dried at 80° C. for 3minutes. The coating weight of the solid contents at this time was 1.2 $g/m^2$. Thus, lithographic printing plate precursor (19) was obtained.

| Solution (S) | |
|---|---|
| Positive type polarity converting high molecular weight compound (1) | 3.56 g |
| Infrared absorber (2) | 0.236 g |
| Methyl ethyl ketone | 24 g |
| Acetonitrile | 24 g |

Preparation of Lithographic Printing Plate Precursor (20)

A 1050 aluminum plate having a thickness of 0.30 mm was degreased with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 $g/m^2$. The plate was anodized by direct current with a 7% sulfuric acid aqueous solution as the electrolytic solution at electric density of 15 $A/dm^2$. The anodic oxide film obtained was 3 $g/m^2$. The plate was then washed with water and dried.

Solution (T) shown below was coated on the thus-treated aluminum plate, and the coated layer was dried at 100° C. for 1 minute. The coating weight of the solid contents at this time was 1.8 $g/m^2$. Thus, lithographic printing plate precursor (20) was obtained.

| Solution (T) | |
|---|---|
| Alkali aqueous solution-soluble high molecular weight compound (1) | 11.0 g |
| Infrared absorber (1) | 0.1 g |
| Dye (Victoria Pure Blue BOH having 1-naphthalenesulfonic acid as the counter ion) | 0.02 g |
| Fluorine-based surfactant, Megafac F-177 (manufactured by Dainippon Chemicals and Ink Co., Ltd.) | 0.05 g |
| γ-Butyrolactone | 8 g |
| Methyl ethyl ketone | 8 g |
| 1-Methoxy-2-propanol | 4 g |

Preparation of Lithographic Printing Plate Precursor (21)

A 1050 aluminum plate having a thickness of 0.30 mm was degreased with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 $g/m^2$. The plate was anodized by direct current with a 7% sulfuric acid aqueous solution as the electrolytic solution at electric density of 15 $A/dm^2$. The anodic oxide film obtained was 3 $g/m^2$. The plate was then washed with water and dried.

Solution (U) shown below was coated on the thus-treated aluminum plate, and the coated layer was dried at 100° C. for 2 minutes. The coating weight of the solid contents at this time was 1.1 $g/m^2$. Thus, lithographic printing plate precursor (21) was obtained.

| Solution (U) | |
|---|---|
| Negative type polarity converting high molecular weight compound (1) | 1.0 g |
| Infrared absorber (2) | 0.15 g |
| Fluorine-based surfactant, Megafac F-177 (manufactured by Dainippon Chemicals and Ink Co., Ltd.) | 0.05 g |
| Methyl ethyl ketone | 20 g |
| Methanol | 7 g |

Preparation of Lithographic Printing Plate Precursor (22)

A 1050 aluminum plate having a thickness of 0.30 mm was degreased with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 $g/m^2$. The plate was anodized by direct current with a 7% sulfuric acid aqueous solution as the electrolytic solution at electric density of 15 $A/dm^2$. The anodic oxide film obtained was 3 $g/m^2$. The plate was then washed with water and dried.

Solution (V) shown below was coated on the thus-treated aluminum plate, and the coated layer was dried at 100° C. for 1 minute. The coating weight of the solid contents at this time was 1.1 $g/m^2$. Thus, lithographic printing plate precursor (22) was obtained.

| Solution (V) | |
|---|---|
| Novolak resin of phenol/formaldehyde (a resin soluble in an alkali aqueous solution, weight average molecular weight: 10,000) | 1.5 g |
| Crosslinking agent (1) | 0.50 g |
| Infrared absorber (1) | 0.10 g |
| Acid generating agent (1) | 0.15 g |
| Fluorine-based surfactant, Megafac F-177 (manufactured by Dainippon Chemicals and Ink Co., Ltd.) | 0.03 g |
| Methyl ethyl ketone | 15 g |
| 1-Methoxy-2-propanol | 10 g |
| Methanol | 5 g |

Preparation of Lithographic Printing Plate Precursor (23)

A 1050 aluminum plate having a thickness of 0.30 mm was degreased with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 $g/m^2$. The plate was anodized by direct current with a 7% sulfuric acid aqueous solution as the electrolytic solution at electric density of 15 $A/dm^2$. The anodic oxide film obtained was 3 $g/m^2$. The plate was then washed with water and dried. The aluminum plate was then immersed in a 2.5 wt % sodium silicate aqueous solution (70° C.) for 14 seconds, washed with water and dried.

Solution (15) shown below was coated on the thus-treated aluminum plate, and the coated layer was dried at 100° C. for 3 minutes. The coating weight of the solid contents at this time was 0.2 $g/m^2$.

| Solution (15) | |
|---|---|
| Water-soluble polymer (1) | 0.404 g |
| Infrared absorber (2) | 0.404 g |
| Fluorine-based surfactant, Megafac F-177 (manufactured by Dainippon Chemicals and Ink Co., Ltd.) | 0.03 g |
| 2-Propanol | 8 g |
| Distilled water | 40 g |

Solution (W) shown below was coated on the thus-treated aluminum plate, and the coated layer was dried at 80° C. for 3 minutes. The coating weight of the solid contents at this time was 1.2 $g/m^2$. Thus, lithographic printing plate precursor (23) was obtained.

| Solution (W) | |
|---|---|
| Positive type polarity converting high molecular weight compound (1) | 3.65 g |
| Dye (Victoria Pure Blue BOH having 1-naphthalenesulfonic acid as the counter ion) | 0.05 g |
| Acetonitrile | 48 g |

Preparation of Lithographic Printing Plate Precursor (24)

Solution (A) shown below was coated on the above-prepared aluminum plate S-7 having layer A by a rod bar, and the coated layer was dried at 100° C. for 1 minute. The dry coating weight was 1.0 $g/m^2$. Thus, lithographic printing plate precursor (24) was obtained.

| Solution (A) | |
|---|---|
| Positive type polarity converting high molecular weight compound (1) | 2.36 g |
| Infrared absorber (1) | 0.47 g |
| Acetonitrile | 30 g |

Preparation of Lithographic Printing Plate Precursor (25)

Solution (G) shown below was coated on the above-prepared aluminum plate S-7 having layer A by a rod bar, and the coated layer was dried at 100° C. for 3minute. The dry coating weight was 1.0 $g/m^2$. Thus, lithographic printing plate precursor (25) was obtained.

| Solution (G) | |
|---|---|
| m,p-Cresol /novolak (high molecular weight compound soluble in an alkali aqueous solution, m/p ratio: 6/4, weight average molecular weight: 3,500, contained 0.5 wt % of unreacted cresol) | 1.0 g |
| Dye (Victoria Pure Blue BOH having 1-naphthalenesulfonic acid as the counter ion) | 0.02 g |
| Fluorine-based surfactant, Megafac F-177 (manufactured by Dainippon Chemicals and Ink Co., Ltd.) | 0.05 g |
| γ-Butyrolactone | 3 g |
| Methyl ethyl ketone | 8 g |
| 1-Methoxy-2-propanol | 7 g |

Preparation of Lithographic Printing Plate Precursor (26)

Solution (K) shown below was coated on the above-prepared aluminum plate S-7 having layer A by a rod bar, and the coated layer was dried at 100° C. for2minute. The dry coating weight was 1.1 $g/m^2$. Thus, lithographic printing plate precursor (27) was obtained.

| Solution (K) | |
|---|---|
| Negative type polarity converting high molecular weight compound (1) | 1.0 g |
| Infrared absorber (1) | 0.15 g |
| Fluorine-based surfactant, Megafac F-177 (manufactured by Dainippon Chemicals and Ink Co., Ltd.) | 0.05 g |
| Methyl ethyl ketone | 20 g |
| Methanol | 7 g |

Preparation of Lithographic Printing Plate Precursor (27)

Solution (P) shown below was coated on the above-prepared aluminum plate S-4 having layer A by a rod bar, and the coated layer was dried at 100° C. for 1 minute. The dry coating weight was 1.2 g/$m^2$. Thus, lithographic printing plate precursor (27) was obtained.

| Solution (P) | |
|---|---|
| Novolak resin of phenol/formaldehyde (a resin soluble in an alkali aqueous solution, weight average molecular weight: 10,000) | 1.5 g |
| Crosslinking agent (1) | 0.50 g |
| Acid generating agent (1) | 0.15 g |
| Fluorine-based surfactant, Megafac F-177 (manufactured by Dainippon Chemicals and Ink Co., Ltd.) | 0.03 g |
| Methyl ethyl ketone | 15 g |
| 1-Methoxy-2-propanol | 10 g |
| Methanol | 5 g |

Synthesis of Polymer Fine Particles

Synthesis of Polymer Fine Particle (1) Having Heat Reactive Functiona Group 7.5 g of allyl methacrylate, 7.5 g of butyl methacrylate were added to 200 ml of polyoxyethylene nonylphenol aqueous solution (concentration: $9.84\times10^{-3}$ $moll^{-1}$), and while stirring the resulting solution, inside atmosphere of the system was substituted with nitrogen gas. The solution was controlled to a temperature of 25° C., and 10 ml of cerium (IV) ammonium salt aqueous solution (concentration: $0.984\times10^{-3}$ $moll^{-1}$). In this case, ammonium nitrate aqueous solution (concentration: $8.8\times10^{31\ 3}$ $moll^{-1}$) was added to adjust pH to 1.3–1.4. The resulting solution was stirred for 8 hours. The concentration of the solid contents of the thus-obtained solution was 9.5% and the average particle size was 0.4 mm.

Synthesis of Polymer Fine Particle (1) Not Having Heat Reactive Functiona Group

Polymerization was conducted in the same manner as in Synthesis Example (1) above, except for using 15 g of styrene in place of allyl methacrylate and butyl methacrylate in the systhesis of the polymer fine particles (1) above. The concentration of the solid contents of the thus-obtained solution was 9.0% and the average particle size was 0.3 μm.

Preparation of Microcapsule (1)

40 g of D-110N (a product of Takeda Pharmaceutical Co.) as an oil phase component, 10 g of trimethylolpropane diacrylate, 10 g of a copolymer of allyl methacrylate and butyl methacrylate (7/3 in molar ratio), 5.0 g of IR and 0.1 g of Pionine A41 (a product of Takemoto Oils and Fats Co.) were dissolved in 60 g of ethyl acetate. 120 g of 4% aquesous solution of PVA205 (a product of Kraray Co.) was prepared as an aqueous phase component. The oil phase component and aqueous phase component were emulsified using a homogenizer at 10,000 rpm. 40 g of water was added to the emulsion, and the emulsion was stirred at room temperature for 30 minutes and at 40° C. for 3 hours. The solid content concentration of the thus-obtained microcapsule liquid was 20% and the average particle size was 0.5 μm.

Preparation of Lithographic Printing Plate Precursor (28)

A solution having the following components was prepared by dispersing with a paint shaker for 10 minutes. The solution was applied to the above-prepared aluminum plate S-1 having layer A and dried at 100° C. for 1 minute. Coated weight after drying was 0.5 g/m2. Thus, lithographic printing plate precursor (28) was obtained.

| | |
|---|---|
| Synthesized polmer fine particle (1) | 5 g (solid content) |
| Polyhdroxyethyl acrylate (weight average molecular weight: 25,000) | 0.5 g |
| Infrared absorber (2) | 0.3 g |
| Triphenylsulfonium benzoate | 0.1 g |
| Water | 100 g |

Preparation of Lithographic Printing Plate Precursor (29)

A solution having the following components was prepared by dispersing with a paint shaker for 10 minutes. The solution was applied to the above-prepared aluminum plate S-2 having layer A and dried at 100° C. for 1 minute. Coated weight after drying was 0.5 g/m2. Thus, lithographic printing plate precursor (29) was obtained.

| | |
|---|---|
| Synthesized polmer fine particle (2) | 5 g (solid content) |
| Polyhdroxyethyl acrylate (weight average molecular weight: 25,000) | 0.5 g |
| Infrared absorber (2) | 0.3 g |
| Triphenylsulfonium benzoate | 0.1 g |
| Water | 100 g |

Preparation of Lithographic Printing Plate Precursor (30)

A solution having the following components was prepared by dispersing with a paint shaker for 10 minutes. The solution was applied to the above-prepared aluminum plate S-7 having layer A and dried at 100° C. for 1 minute. Coated weight after drying was 0.5 g/m2. Thus, lithographic printing plate precursor (30) was obtained.

| | |
|---|---|
| Synthesized microcapsule (1) | 5 g (solid content) |
| Trimethylolpropane triacrylate | 3.0 g |
| Infrared absorber (2) | 0.3 g |
| Triphenylsulfonium benzoate | 0.1 g |
| Water | 60 g |
| 1-Methoxy-2-propanol | 40 g |

Preparation of Lithographic Printing Plate Precursor (31)

A 1050 aluminum plate having a thickness of 0.30 mm was degreased with trichloroethylene and then subjected to brush-graining treatment using a nylon brush and a suspension of 400 mesh pumice stone and water, and the surface of the plate was thoroughly washed with water. Etching was effected by immersing the plate in a 25% sodium hydroxide aqueous solution at 45° C. for 9 seconds, the plate was washed with water, then immersed in a 2% nitric acid aqueous solution for 20 seconds, followed by washing with water. The etching amount of the grained surface at this time was about 3 g/$m^2$. The plate was anodized by direct current with a 7% sulfuric acid aqueous solution as the electrolytic solution at electric density of 15 A/$dm^2$. The anodic oxide film obtained was 3 g/$m^2$. The plate was then washed with water and dried.

A solution having the following components was prepared by dispersing with a paint shker for 10 minutes. The solution was applied to the above-prepared aluminum plate and dried at 100° C. for 1 minute. Coated weight after drying was 0.5 g/$m^2$. Thus, lithgraphic printing plate precursor (31) was obtained.

| | |
|---|---|
| Synthesized microcapsule (1) | 5 g (solid content) |
| Trimethylolpropane triacrylate | 3.0 g |
| Infrared absorber (2) | 0.3 g |
| Triphenylsulfonium benzoate | 0.1 g |
| Water | 60 g |
| 1-Methoxy-2-propanol | 40 g |

EXAMPLES 1 TO 7 AND COMPARATIVE EXAMPLES 1 AND 2

Each of the above obtained lithographic printing plate precursors (1) to (6), (19), (23) and (24) was exposed with a semiconductor laser emitting infrared ray of the wavelength of 840 nm at main scanning speed of 2.0 m/s. After exposure, the plate was immersed in distilled water for 1 minute and the line width of non-image area was observed with an optical microscope. The exposed energy of the laser corresponding to the line width was obtained and this was regarded as sensitivity.

Further, after each of lithographic printing plate precursors (1) to (6), (19), (23) and (24) was exposed with a semiconductor laser emitting infrared ray of the wavelength of 840 nm at main scanning speed of 2.0 m/s and 4.0 m/s respectively, printing was performed in a usual manner with no treatment at all. Heidel KOR-D printing machine was used in printing. Whether staining occurred on the non-image area of the 3,000th sheet of the print or not, and how many sheets of good prints could be obtained were evaluated. The results obtained are shown in Table 1 below.

TABLE 1

| | Lithographic printing plate precursor | Line width sensitivity ($mJ/cm^2$) | Staining in non-image area | | Number of sheets of good printed matters | |
|---|---|---|---|---|---|---|
| | | | 2.0 m/s | 4.0 m/s | 2.0 m/s | 4.0 m/s |
| Example | | | | | | |
| 1 | (1) | 160 | None | None | 60000 | 55000 |
| 2 | (2) | 160 | None | None | 75000 | 75000 |
| 3 | (3) | 170 | None | None | 70000 | 65000 |
| 4 | (4) | 160 | None | None | 60000 | 55000 |
| 5 | (5) | 150 | None | None | 70000 | 65000 |
| 6 | (6) | 140 | None | None | 70000 | 65000 |
| 7 | (7) | 140 | None | None | 100000 | 100000 |
| Comparative Example | | | | | | |
| 1 | (19) | 230 | None | Present | 45000 | 1000 |
| 2 | (23) | 160 | None | None | 20000 | 20000 |

Each of lithographic printing plate precursors (1) to (6) and (24) having layer A showed high sensitivity, and staining did not occur on the non-image area of the 3,000th sheet in both cases of exposure at main scanning speed of 2.0 m/s and 4.0 m/s.

Contrary to these, lithographic printing plate precursor (19), which comprised an aluminum support having provided thereon an ink-receptive layer only, showed a little lower sensitivity. Staining did not occur on the non-image area of the 3,000th sheet at scanning speed of 2.0 m/s and 45,000 sheets of good printed matters could be obtained, but the 1,000th sheet was stained when exposed at scanning speed of 4.0 m/s. This is due to the fact that in lithographic printing plate precursor (19) the solubility conversion of the ink-receptive layer progresses from the surface of the ink-receptive layer, hence the ink-receptive layer cannot undergo solubility conversion completely at such a fast scanning speed as 4.0 m/s, thus residual film of the ink-receptive layer occurs.

On the other hand, lithographic printing plate precursor (23) of Comparative Example 2 is a lithographic printing plate precursor comprising an aluminum support having provided thereon a layer containing an infrared absorber and a water-soluble polymer and an ink-receptive layer. With respect to line width sensitivity and staining of the non-image area of the 3,000th sheet, this lithographic printing plate precursor was almost the same level with the lithographic printing plate precursors in Examples 1 to 7 even when exposed at both scanning speed of 2.0 m/s and 4.0 m/s. This is because the layer containing an infrared absorber and a water-soluble polymer exhibits the effect of layer A, i.e., the ink-receptive layer is solubilized from the underside and the heat diffusion to the support is inhibited, therefore, residual film does not occur even when ink-receptive layer is not completely solubilized. However, since the layer containing an infrared absorber and a water-soluble polymer was gradually dissolved due to the fountain solution during printing, so that the image area was removed and good printed matters obtained were only 20,000 sheets.

EXAMPLES 8 TO 12 AND COMPARATIVE EXAMPLE 3

Each of the above obtained lithographic printing plate precursors (7) to (10), (29) and (25) was exposed with a semiconductor laser emitting infrared ray of the wavelength of 840 nm. After exposure, each plate was development processed using an automatic processor PS Processor 90OVR (manufactured by Fuji Photo Film Co., Ltd.) charged with a developing solution DP-4 and a rinsing solution FR-3 (1/7) (products of Fuji Photo Film Co., Ltd.). DP-4 was diluted to two ways of 1/6 and 1/12. Line width of the non-image area obtained by each developing solution was measured and the exposed energy of the laser corresponding to the line width was obtained and this was regarded as sensitivity. The difference of the line width between the value obtained by the developing solution of 1/6 dilution and that of 1/12 dilution was recorded. The smaller the difference, the better is the development latitude. The difference of 20 $mJ/cm^2$ or less is practicable. The results obtained are shown in Table 2 below.

TABLE 2

| Example No. | Lithographic Printing Plate Precursor | Sensitivity ($mJ/cm^2$) | Development Latitude ($mJ/cm^2$) |
|---|---|---|---|
| Example 8 | (7) | 110 | 10 |
| Example 9 | (8) | 105 | 5 |
| Example 10 | (9) | 100 | 5 |
| Example 11 | (10) | 105 | 5 |
| Example 12 | (25) | 110 | 5 |
| Comparative Example 3 | (20) | 140 | 30 |

Each of lithographic printing plate precursors (7) to (10) and (25) each having layer A showed high sensitivity and the development latitude was on a practicable level.

Contrary to this, lithographic printing plate precursors (20) of Comparative Example 3, which comprised an aluminum support having provided thereon an ink-receptive layer only, showed a little lower sensitivity and the development latitude did not reach a practicable level.

EXAMPLES 13 TO 18 AND COMPARATIVE EXAMPLE 4

Each of the above obtained lithographic printing plate precursors (11) to (15), (21) and (26) was exposed with a semiconductor laser emitting infrared ray of the wavelength of 840 nm at main scanning speed of 2.0 m/s. After exposure, the plate was immersed in an aqueous solution having a pH value of 8.8 (water: 84.7%, isopropanol: 10%, triethylamine: 5%, concentrated hydrochloric acid: 0.3%) for 1 minute and the line width of the image area was observed with an optical microscope. The exposed energy of the laser corresponding to the line width was obtained and this was regarded as sensitivity.

Further, after each of lithographic printing plate precursors (11) to (15), (21) and (26) was exposed with a semiconductor laser emitting infrared ray of the wavelength of 840 nm at main scanning speed of 2.0 m/s and 4.0 m/s respectively, printing was performed in a usual manner with no treatment at all. Heidel KOR-D printing machine was used in printing. The conditions of the fountain solution at this time are as follows: A fountain solution, pH 8.8 (water: 84.7%, isopropanol: 10%, triethylamine: 5%, concentrated hydrochloric acid: 0.3%)

Whether the ink sufficiently adhered to the image area of the 1,000th sheet of the print or not, and how many sheets of good prints could be obtained were evaluated. The results obtained are shown in Table 3 below.

TABLE 3

| | Lithographic printing plate precursor | Line width sensitivity (mJ/cm$^2$) | Ink adhesion in image area 2.0 m/s | 4.0 m/s | Number of sheets of good printed matters 2.0 m/s | 4.0 m/s |
|---|---|---|---|---|---|---|
| Example | | | | | | |
| 13 | (11) | 290 | Good | Good | 35000 | 35000 |
| 14 | (12) | 270 | Good | Good | 45000 | 45000 |
| 15 | (13) | 260 | Good | Good | 40000 | 40000 |
| 16 | (14) | 280 | Good | Good | 35000 | 35000 |
| 17 | (15) | 300 | Good | Good | 32000 | 32000 |
| 18 | (26) | 270 | Good | Good | 50000 | 50000 |
| Comparative Example | | | | | | |
| 4 | (21) | 350 | Good | Poor | 30000 | 0 |

Every plate of lithographic printing plate precursors (11) to (15) and 26) showed high sensitivity and ink adhesion in the image area was good.

Contrary to this, lithographic printing plate precursor (21) of Comparative Example 3 showed a little lower sensitivity and insufficient ink adhesion when subjected to exposure at scanning speed of4.0 m/s. Good print obtained was nothing.

EXAMPLES 19 TO 22 AND COMPARATIVE EXAMPLE 5

Each of the above obtained lithographic printing plate precursors (16) to (18), (22) and (27) was exposed with a semiconductor laser emitting infrared ray of the wavelength of 840 nm. After exposure, each plate was heat treated in an oven at 140° C. for 1 minute and then development processed using an automatic processor PS Processor 90OVR (manufactured by Fuji Photo Film Co., Ltd.) charged with a developing solution DP-4 and a rinsing solution FR-3 (1/7) (products of Fuji Photo Film Co., Ltd.). DP-4 was diluted to two ways of 1/6 and 1/12. Line width of the non-image area obtained by each developing solution was measured and the exposed energy of the laser corresponding to the line width was obtained and this was regarded as sensitivity. The difference of the line width between the value obtained by the developing solution of 1/6 dilution and that of 1/12 dilution was recorded. The smaller the difference, the better is the development latitude. The difference of 20 mJ/cm$^2$ or less is practicable. The results obtained are shown in Table 4 below.

TABLE 4

| Example No. | Lithographic Printing Plate Precursor | Sensitivity (mJ/cm$^2$) | Development Latitude (mJ/cm$^2$) |
|---|---|---|---|
| Example 19 | (16) | 200 | 10 |
| Example 20 | (17) | 210 | 10 |
| Example 21 | (18) | 190 | 5 |
| Example 22 | (27) | 205 | 10 |
| Comparative Example 5 | (22) | 260 | 30 |

Each of lithographic printing plate precursors (16) to (18) and (27) each having layer A showed high sensitivity and the development latitude was on a practicable level.

Contrary to this, lithographic printing plate precursors (22) of Comparative Example 5, which comprised an aluminum support having provided thereon an ink-receptive layer only, showed a little lower sensitivity and the development latitude did not reach a practicable level.

EXAMPLES 23 TO 25 AND COMPARATIVE EXAMPLE 6

Each of the above obtained lithographic printing plate precursors (28) to (31) was exposed with trend setter 3244VFS mounting water-cooling type infrared ray semiconductor laser, manufactured by Creo Co., under the conditions of output of 9W, revolution number of outer drum of 210 rpm, plate surface energy of 100 mJ/cm$^2$ and degree of resolution of 2400 dpi. Each of the plate precursors was mounted on a cyinder of printing machine SOR-M, manufactured by Hidelberger Druckmaschinen Aktiengesellschaft, without any treatment. Fountain solution was supplied, ink was supplied, papers were supplied and then printing was conducted.

In this case, the number of initial printed sheets (the number of printed sheets) for obtaining good prints and how many sheets of good prints could be obtained were evaluated. The results obtained are shown in Table 5 below.

TABLE 5

| Example No. | Lithographic Printing Plate Precursor | Sensitivity (mJ/cm$^2$) | Number of good prints |
|---|---|---|---|
| Example 23 | (28) | 50 | 20000 |
| Example 24 | (29) | 50 | 20000 |
| Example 25 | (30) | 60 | 30000 |

TABLE 5-continued

| Example No. | Lithographic Printing Plate Precursor | Sensitivity (mJ/cm$^2$) | Number of good prints |
|---|---|---|---|
| Comparative Example 6 | (31) | 50 | 5000 |

Every plate of lithographic printing plate precursors (28) to (30) showed the small number of initial printed sheets, and a large number of good prints were obtained.

Contrary to this, lithographic printing plate precursor (31) of Comparative Example 6 was substantially the same as the plates of lithographic printing plate precursors (28) to (30) in the initial printed sheets, but only 5000 good prints were obtained.

According to the lithographic printing plate precursor of the present invention, heat diffusion to the support at heat mode image recording is inhibited by providing a layer containing a latex (layer A) on the support. Further, the lithographic printing plate precursor of the present invention can be developed with water or an aqueous solution, requires no special treatment such as wet development process or rubbing after imaging, improved in sensitivity, the strength of the image area, i.e., excellent in press life, and provides clear printed matters having no residual colors and stains.

Further, the present invention can provide a lithographic printing plate precursor capable of plate-making directly from digital data by recording with a solid state laser or a semiconductor laser which radiates infrared rays. Furthermore, better image area strengthe, i.e., press life, can be obtained by using crosslinked organic resin particles as a latex to be contained in layer A.

While the invention has been described in detail and with reference to specific examples thereof, it will be apparent to one skilled in the art that various changes and modifications can be made therein without departing from the spirit and scope thereof.

What is claimed is:

1. A lithographic printing plate precursor comprising a support having a hydrophilic surface, having provided thereon in order of a layer containing organic resin particles (layer A) and a hydrophilic layer containing a hydrophilic high molecular weight compound having a functional group which is converted into hydrophobic by heat (layer B), wherein at least one of layer A and layer B contains a compound that is capable of converting light into heat, wherein non-heated portions on layer A and layer B can be removed with water or an aqueous solution.

2. The lithographic printing plate precursor as claimed in claim 1, wherein the organic resin particles are crosslinked.

3. The lithographic printing plate precursor as claimed in claim 1, wherein the functional group which is converted into hydrophobic is a group selected from the following formulae (11) and (12)

(11)

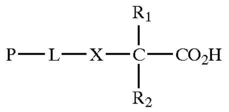

-continued (12)

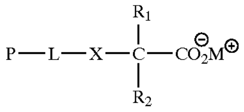

wherein X is selected from the group consisting of the elements belonging to Group IV to Group VI of the Periodic Table, the oxides thereof, the sulfides thereof, the selenides thereof and the tellurides thereof; P represents a polymer main chain; —L— represents a divalent linking group; $R_1$ and $R_2$, which are the same or different, each represents a monovalent group; and M represents an alkali metal, an alkaline earth metal or an onium.

4. The lithographic printing plate precursor as claimed in claim 1, wherein non-heated portions on layer A and layer B can be removed with water, ink or rubbing on a printing machine.

5. A lithographic printing method comprising imagewise exposing the lithographic printing plate precursor as claimed in claim 1, mounting the plate precursor on a printing machine, removing non-image areas with water, aqueous solution or rubbing, and conducting printing.

6. A lithographic printing plate precursor comprising a support having a hydrophilic surface, having provided thereon in order of a layer containing crosslinked organic resin particles (layer A) and a hydrophobic layer containing a hydrophobic high molecular weight compound having a functional group which is converted into hydrophilic by heat (layer B), wherein at least one of layer A and layer B contains a compound that is capable of converting light into heat, wherein non-heated portions on layer A and layer B can be removed with water or an aqueous solution.

7. The lithographic printing plate precursor as claimed in claim 6, wherein non-heated portions on layer A and layer B can be removed with water, ink or rubbing on a printing machine.

8. A lithographic printing method comprising imagewise exposing the lithgraphic printing plate precursor as claimed in claim 6, mounting the plate precursor on a printing machine, removing non-image areas with water, aqueous solution or rubbing, and conducting printing.

9. The lithographic printing plate precursor as claimed in claim 6, wherein the functional group which is converted into hydrophilic is a group selected from the following formulae (1) to (5).

(1)

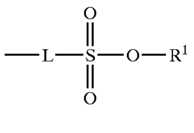

(2)

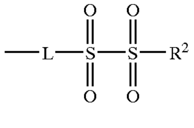

(3)

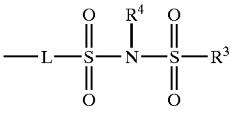

-continued

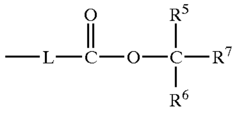

(4)

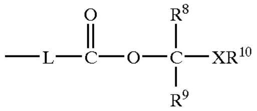

(5)

wherein L represents a polyvalent linking group comprising nonmetallic atoms; $R_1$ represents an alkyl group, an aryl group, an alkenyl group, an alkynyl group, or a cyclic imido group; $R_2$ and $R_3$ each represents an alkyl group, an aryl group, an alkenyl group, or an alkynyl group; $R_4$ represents an alkyl group, an aryl group, an alkenyl group, an alkynyl group, or —$SO_2$—$R_{11}$; $R_5$, $R_6$ and $R_7$ each represents an alkyl group, an aryl group, an alkenyl group, or an alkynyl group; either $R_8$ or $R_9$ represents a hydrogen atom, and the other represents a hydrogen atom, an alkyl group, an aryl group, an alkenyl group, or an alkynyl group; $R_{10}$ represents an alkyl group, an alkenyl group, or an alkynyl group; $R_{11}$ represents an alkyl group, an aryl group, an alkenyl group, or an alkynyl group; arbitrarily two or three of $R_5$, $R_6$ and $R_7$ may be linked to form a ring, and $R_8$ and $R_{10}$, or $R_9$ and $R_{10}$ may be linked to form a ring; and X represents O or S.

* * * * *